(12) United States Patent
Jiang et al.

(10) Patent No.: US 11,011,576 B2
(45) Date of Patent: May 18, 2021

(54) RESISTIVE RANDOM ACCESS MEMORY DEVICE

(71) Applicant: Taiwan Semiconductor Manufacturing Co., Ltd., Hsinchu (TW)

(72) Inventors: Jheng-Hong Jiang, Hsinchu (TW); Cheung Cheng, Hsinchu (TW); Chia-Wei Liu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/419,324

(22) Filed: May 22, 2019

(65) Prior Publication Data

US 2020/0006428 A1 Jan. 2, 2020

Related U.S. Application Data

(60) Provisional application No. 62/691,292, filed on Jun. 28, 2018.

(51) Int. Cl.
*H01L 27/24* (2006.01)
*H01L 45/00* (2006.01)

(52) U.S. Cl.
CPC ...... *H01L 27/2409* (2013.01); *H01L 27/2481* (2013.01); *H01L 45/1233* (2013.01); *H01L 45/1253* (2013.01); *H01L 45/14* (2013.01); *H01L 45/146* (2013.01); *H01L 45/1608* (2013.01)

(58) Field of Classification Search
CPC ............. H01L 27/2409; H01L 27/2481; H01L 45/1233; H01L 45/146
See application file for complete search history.

(56) References Cited

U.S. PATENT DOCUMENTS

| | | | |
|---|---|---|---|
| 2014/0361239 A1* | 12/2014 | Ramaswamy | H01L 27/2418 257/5 |
| 2016/0020256 A1 | 1/2016 | Sciarrillo et al. | |
| 2016/0087197 A1 | 3/2016 | Tran et al. | |
| 2017/0040339 A1* | 2/2017 | Lee | H01L 28/00 |
| 2017/0148851 A1 | 5/2017 | Hsu | |
| 2017/0263683 A1* | 9/2017 | Ramaswamy | H01L 27/2409 |

FOREIGN PATENT DOCUMENTS

TW 201138173 A1 11/2011

* cited by examiner

*Primary Examiner* — Igwe U Anya
(74) *Attorney, Agent, or Firm* — Duane Morris LLP

(57) ABSTRACT

A memory device includes: a first conductor extending in parallel with a first axis; a first selector material comprising a first portion that extends along a first sidewall of the first conductor; a second selector material comprising a first portion that extends along the first sidewall of the first conductor; a first variable resistive material comprising a portion that extends along the first sidewall of the first conductor; and a second conductor extending in parallel with a second axis substantially perpendicular to the first axis, wherein the first portion of the first selector material, the first portion of the second selector material, and the portion of the first variable resistive material are arranged along a first direction in parallel with a third axis substantially perpendicular to the first axis and second axis.

20 Claims, 42 Drawing Sheets

RESISTIVE RANDOM ACCESS MEMORY DEVICE

CROSS-REFERENCE TO RELATED APPLICATIONS

The present application claims priority benefit of U.S. Provisional Application No. 62/691,292, filed on Jun. 28, 2018, the contents of which are incorporated by reference in its entirety.

BACKGROUND

In recent years, unconventional nonvolatile memory (NVM) devices, such as ferroelectric random access memory (FRAM) devices, phase-change random access memory (PRAM) devices, and resistive random access memory (RRAM) devices, have emerged. In particular, RRAM devices, which exhibit a switching behavior between a high resistance state (HRS) and a low resistance state (LRS), have various advantages over conventional NVM devices. Such advantages include, for example, compatible fabrication steps with current complementary-metal-oxide-semiconductor (CMOS) technologies, low-cost fabrication, a compact structure, flexible scalability, fast switching, high integration density, etc.

In general, an RRAM bit cell of the RRAM device includes a lower electrode (e.g., an anode) and an upper electrode (e.g., a cathode) with a variable resistive material layer interposed therebetween to form an RRAM resistor, and a transistor (e.g., a metal-oxide-semiconductor field-effect-transistor (MOSFET), a bipolar junction transistor (BJT), etc.) coupled to the RRAM resistor in series, which is typically referred to as a "one-transistor-one-resistor (1T1R)" configuration. To further increase the integration density of the RRAM bit cells in the RRAM device, forming the RRAM bit cells as a cross-point array, in which the RRAM bit cells are each disposed at a cross of one of plural conductors extending along a first horizontal direction (e.g., word lines (WL's)) and one of plural conductors extending along a second horizontal direction (e.g., bit lines (BL's)), was proposed.

However, using the 1T1R configuration cannot effectively integrate the RRAM bits cells into a high-density cross-point array partially due to the additional area required to accommodate the transistors. In this regard, a variety of other devices were proposed to replace the transistors, for example, unipolar or bipolar selector devices (e.g., diodes). Forming the RRAM bit cell by coupling a selector device to a corresponding RRAM resistor is typically referred to as a "one-selector-one-resistor (1S1R)" configuration. Forming the cross-point array by integrating the RRAM bit cells that are each formed using the 1S1R configuration, still however, may encounter a limit to further increase the integration density partially because the BL's and WL's are still limited to extend horizontally (i.e., in-plane) and/or respective layers of the selector devices can only be formed along a direction substantially perpendicular to the directions that the BL's and WL's respectively extend.

Thus, existing RRAM devices and methods to make the same are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1A:
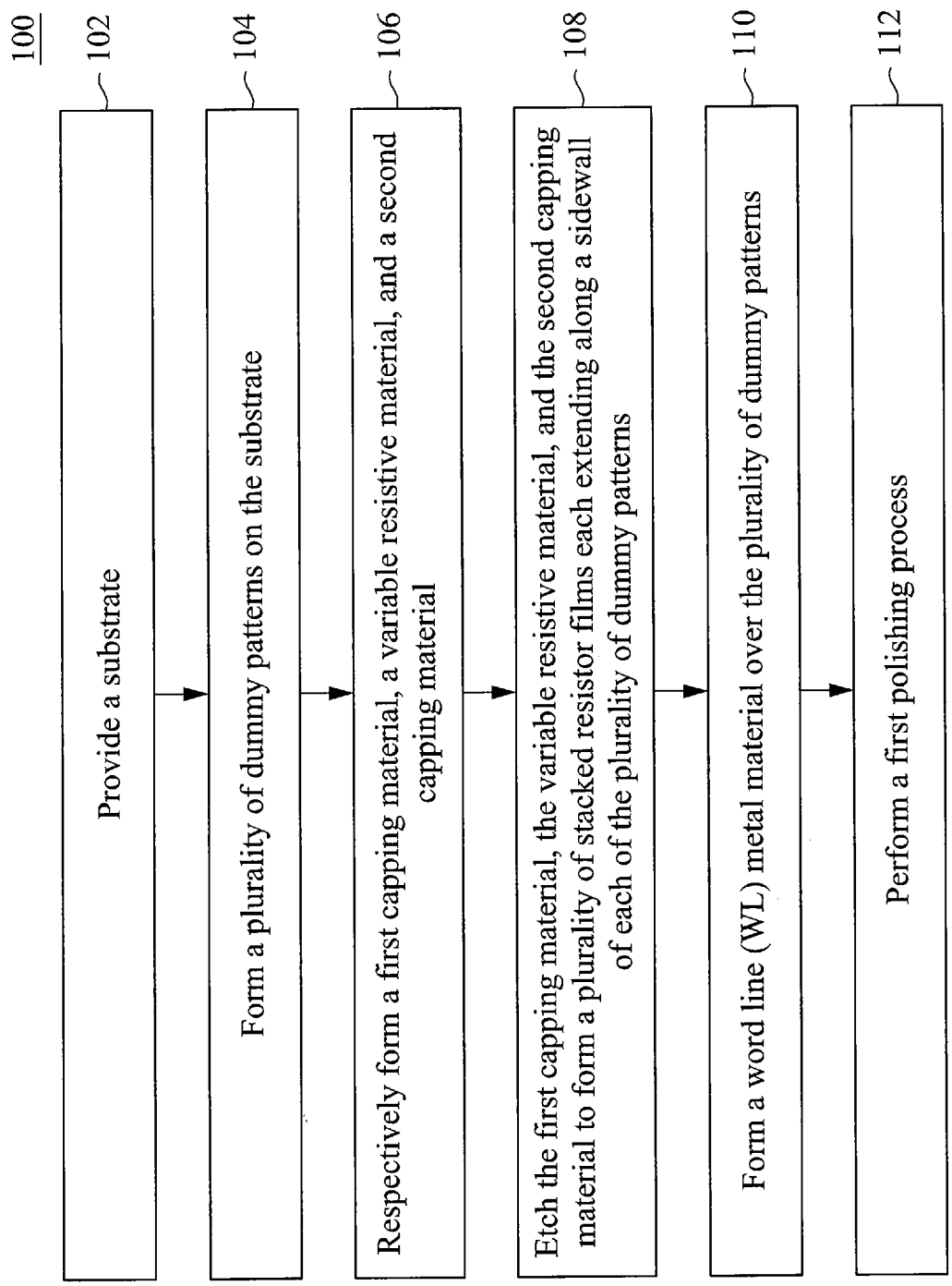
FIGS. 1A and 1B illustrate a flow chart of an exemplary method for forming a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a novel resistive random access memory (RRAM) device and methods to form the same. In some embodiments, the disclosed RRAM device includes an array of RRAM bit cells that are integrated by a plurality of bit lines (BL's) extending horizontally and a plurality of word lines (WL's) extending vertically. More specifically, the RRAM bit cells of the array, each of which includes an RRAM resistor and a selector device coupled in series, are formed as a plurality of strips that extend along a first horizontal direction. The BL's, extending along a second horizontal direction, traverse respective strips to be interposed between two adjacent RRAM bit cells at their respective first ends; and the WL's, extending along a vertical direction (e.g., out of a plane defined by the first and second horizontal directions), also traverse the respective strips to form plural pairs that sandwich two adjacent RRAM bit cells (with one BL interposed therebetween) at their respective second ends. As such, partially because the RRAM bit cells can be horizontally formed in a plane and the BL's and WL's can extend in different planes, the RRAM bit cells of the disclosed RRAM device can be more densely integrated (i.e., a highly increased integration density) when compared to existing RRAM device.

Figure 1B:
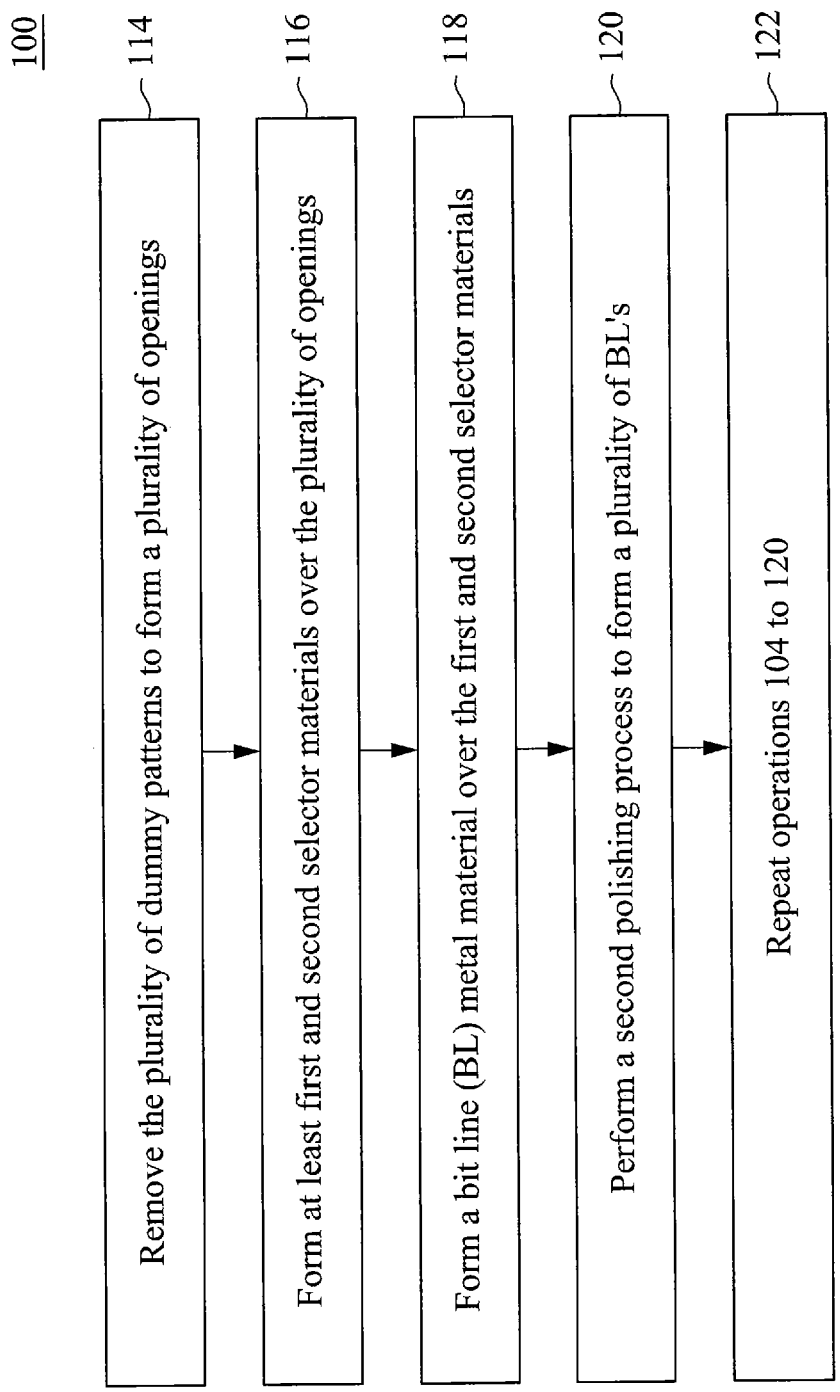

FIGS. 1A and 1B illustrate a flowchart of a method 100 to form a semiconductor device according to one or more embodiments of the present disclosure. It is noted that the method 100 is merely an example, and is not intended to limit the present disclosure. In some embodiments, the semiconductor device is, at least part of, an RRAM device. As employed by the present disclosure, the RRAM device refers to any device including a variable resistive material layer. It is noted that the method 100 of FIGS. 1A and 1B does not produce a completed RRAM device. A completed RRAM device may be fabricated using complementary metal-oxide-semiconductor (CMOS) technology processing. Accordingly, it is understood that additional operations may be provided before, during, and after the method 100 of FIGS. 1A and 1B, and that some other operations may only be briefly described herein. In some other embodiments, the method may be used to form any of a variety of nonvolatile memory (NVM) devices, such as ferroelectric random access memory (FRAM) devices, phase-change random access memory (PRAM) devices, magnetoresistive random access memory (MRAM) devices, etc., while remaining within the scope of the present disclosure.

Referring first to FIG. 1A, in some embodiments, the method 100 starts with operation 102 in which a substrate is provided. The method 100 continues to operation 104 in which a plurality of dummy patterns are formed over the substrate. In some embodiments, the plurality of dummy patterns are laterally spaced apart from one another, and each formed as a recessed region extending through a dielectric layer formed of the same material as the dummy patterns. The method 100 continues to operation 106 in which a first capping material, a variable resistive material, and a second capping material are respectively formed over the plurality of dummy patterns. The method 100 continues to operation 108 in which the first capping material, the variable resistive material, and the second capping material are etched to from a plurality of stacked resistor films each extending along a sidewall of each of the plurality of dummy patterns. Each stacked resistor film is formed by respective remaining portions (after etched) of the first capping material, variable resistive material, and second capping material. In some embodiments, subsequently to forming the stacked resistor films, a plurality of word line (WL) openings, which will be discussed below, are formed between the plurality of dummy patterns that are laterally spaced apart. The method 100 continues to operation 110 in which a word line (WL) metal material is formed over the plurality of dummy patterns. In some embodiments, the WL metal material may fill the plurality of WL openings. The method 100 continues to operation 112 in which a first polishing process is performed. In some embodiments, the first polishing process is performed at least on the WL metal material to expose the plurality of dummy patterns and form a plurality of WL's.

Referring then to FIG. 1B, the method 100 continues to operation 114 in which the plurality of dummy patterns are removed to form a plurality of openings. In some embodiments, since the dummy patterns are laterally spaced apart from each other, after being removed, the openings each presents a U-shaped profile. The method 100 continues to operation 116 in which at least first and second selector materials at least partially fill the plurality of openings. In some embodiments, the at least first and second selector materials, formed on top of one another, are collectively configured to provide a "selection" or "steering" function, which will be discussed in further detail below. The method 100 continues to operation 118 in which a bit line (BL) metal material is formed over the first and second selector materials. In some embodiments, since the first and second selector materials are each formed to be substantially thin and conformal, the respective U-shaped profiles of the openings may still be present along a portion of an upper boundary of the top selector material (e.g., the second selector material). The BL metal material is formed to at least fill such U-shaped profiles present in the second selector material. The method 100 continues to operation 120 in which a second polishing process is performed to form a plurality of BL's. In some embodiments, the second polishing process is performed at least on the BL metal material and the first and second selector materials until respective upper boundaries of the WL's are re-exposed while keeping the U-shaped profiles of the second selector material filled with the BL metal material. In some embodiments, after the formation of the BL's, a plurality of RRAM bit cells can be formed as a strip extending along a first lateral direction with the plurality of BL's passing through the strip along a second lateral direction, and with the plurality of WL's passing through the strip along a vertical direction. Further, the strip may be referred to as being formed on a first tier. Such a strip will be shown and discussed below. The method 100 continues to operation 122 in which operations 104 to 120 are repeated. In some embodiments, subsequently to forming the strip on the first tier, one iteration of performing operations 104 to 120 may form at least one strip on a tier above the first tier.

In some embodiments, operations of the method 100 may be associated with cross-sectional views of a semiconductor device 200 at various fabrication stages as shown in FIGS. 2A, 2B, 2C, 2D, 2E, 2F, 2G, 2H, 2I, 2J, and 2K, respectively. In some embodiments, the semiconductor device 200 may be an RRAM device. The RRAM device 200 may be included in a microprocessor, memory cell, and/or other integrated circuit (IC), Also, FIGS. 2A through 2K are simplified for a better understanding of the concepts of the present disclosure. For example, although the figures illustrate the RRAM device 200, it is understood the IC, in which the RRAM device 200 is formed, may include a number of other devices comprising resistors, capacitors, inductors, fuses, etc., which are not shown in FIGS. 2A through 2K, for purposes of clarity of illustration.

Figure 2A:
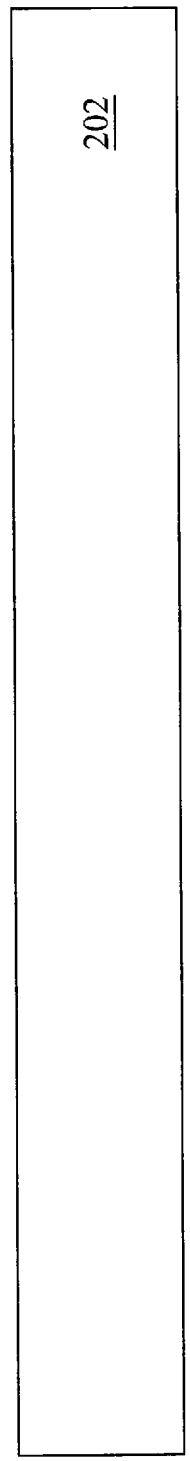
FIGS. 2A, 2B, 2C, 2D, 2E, 2F, 2G, 2H, 2I, 2J, 2K, 2L and 2M illustrate respective cross-sectional views of an exemplary semiconductor device during various fabrication stages, made by the method of FIGS. 1A-1B, in accordance with some embodiments.

Corresponding to operation 102 of FIG. 1A, FIG. 2A is a cross-sectional view of the RRAM device 200 including a substrate 202, which is provided at one of the various stages of fabrication, according to some embodiments. In some embodiments, the substrate 202 includes a semiconductor material substrate, for example, silicon. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some other embodiments, the substrate has a dielectric material layer 202 formed over various device features (e.g., a source, drain, or gate electrode of a transistor). Such a dielectric material layer 202 may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In such an embodiment where the substrate 202 includes a dielectric material, the layer 202 may encompass one or more conductive features. Typically, the layer 202 may be referred to as an "initial inter-metal dielectric (IMD) layer" or an "initial tier."

Figure 2B:
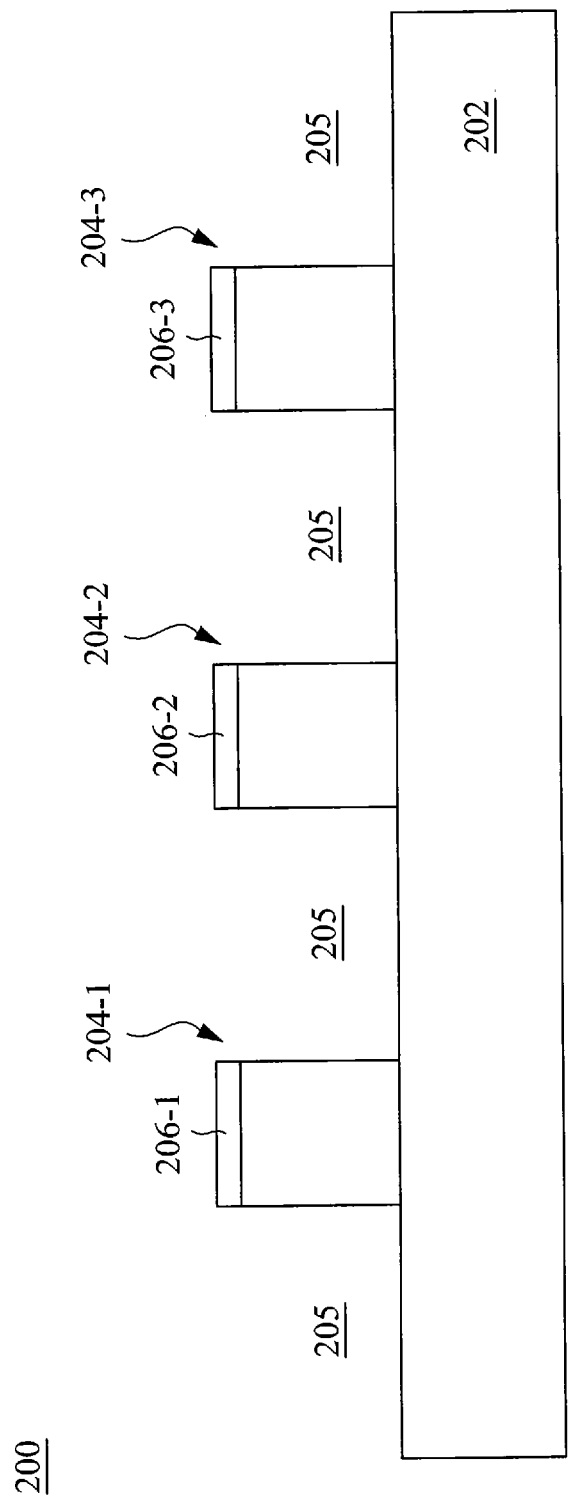

Corresponding to operation 104 of FIG. 1A, FIG. 2B is a cross-sectional view of the RRAM device 200 including a plurality of dummy patterns 204-1, 204-2, and 204-3, which are formed at one of the various stages of fabrication, according to some embodiments. As shown, the dummy patterns 204-1 to 204-3 are laterally spaced apart from each other by a distance thereby causing a plurality of openings 205 to be formed therebetween. According to some embodiments, such openings 205 may be used to form RRAM resistors and WL's of the disclosed RRAM device 200, which will be discussed in detail below.

Although in the illustrated embodiment of FIG. 2B (and the following figures), only three dummy patterns are shown, it is understood that any desired number of dummy patterns can be formed over the substrate 202 while remaining within the scope of the present disclosure. In some embodiments, the dummy patterns 204-1, 204-2, and 204-3 are overlaid by hard mask layers 206-1, 206-2, and 206-3, respectively. In some embodiments, the dummy patterns 204-1 to 204-3 may be each a thin film comprising silicon oxide formed, for example, using a thermal oxidation process. In some embodiments, the dummy patterns 204-1 to 204-3 are used to provide a self-aligning function while forming the above-mentioned RRAM resistors, which will be discussed below. In some embodiments, the hard mask layers 206-1 to 206-3 are formed of silicon nitride, for example, using low-pressure chemical vapor deposition (LPCVD) or plasma enhanced chemical vapor deposition (PECVD). The hard mask layers 206-1 to 206-3 are each used as a hard mask during subsequent photolithography processes.

Figure 2C:
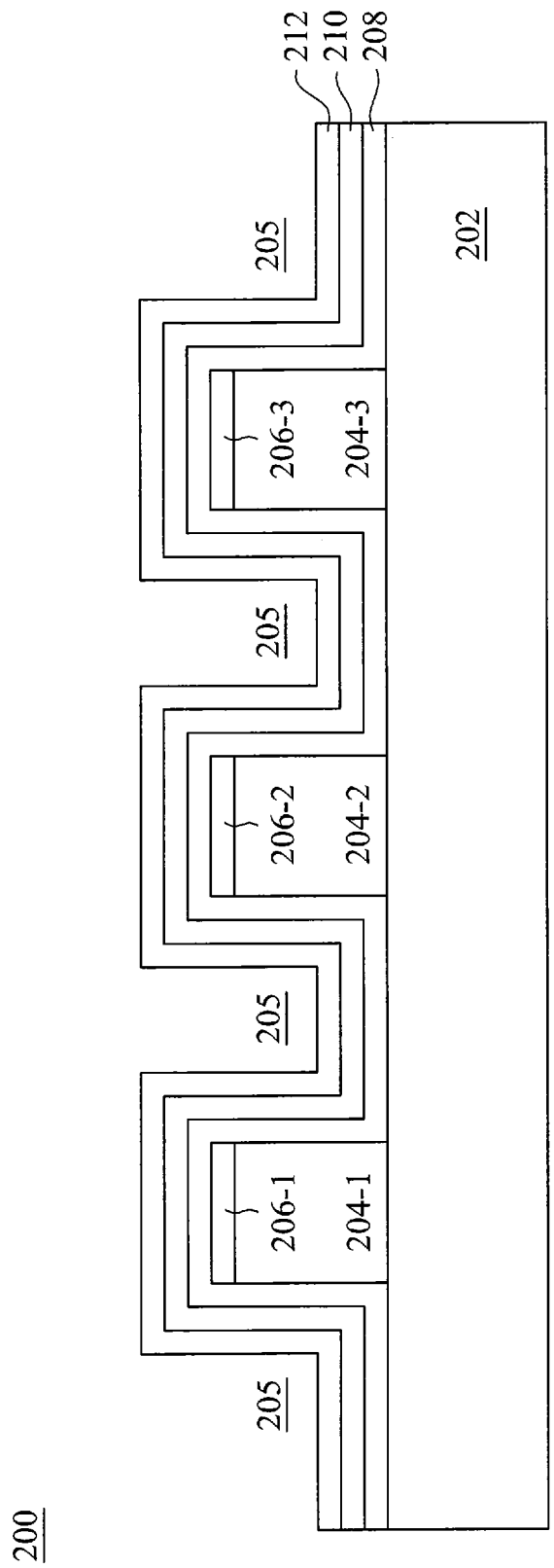

Corresponding to operation 106 of FIG. 1A, FIG. 2C is a cross-sectional view of the RRAM device 200 including a first capping material 208, a variable resistive material 210, and a second capping material 212, which are formed at one of the various stages of fabrication, according to some embodiments. As shown, the first capping material 208 overlays the plurality of dummy patterns 204-1 to 204-3 (and the corresponding openings 205), the variable resistive material 210 further overlays the first capping material 208, and the second capping material 212 further overlays the variable resistive material 210. Since each of the first capping material 208, variable resistive material 210, and second capping material 212 is formed as a substantially thin and conformal layer (e.g., about 20~100 angstroms in thickness), after the formation of the first capping material 208, variable resistive material 210, and second capping material 212 over the openings 205, the respective U-shaped profile of each of the openings 205 may be still present by the second capping material 212.

In some embodiments, the first capping material 208 that forms the 'inner electrode' around WL may include an electrical conducting material selected from a group consisting of: gold (Au), platinum (Pt), ruthenium (Ru), iridium (Ir), titanium (Ti), aluminum (Al), copper (Cu), tantalum (Ta), tungsten (W), iridium-tantalum alloy (Ir-Ta), indium-tin oxide (ITO), or any alloy, oxide, nitride, fluoride, carbide, boride or silicide of these, such as TaN, TiN, TiAlN, TiW, or a combination thereof. Although the first capping material 208 is shown as a single layer in the illustrated embodiment of FIG. 2C (and the following figures), it is noted that the first capping material 208 may include plural layers formed as a stack, wherein each of the plural layers is formed of one of the above-described materials, e.g., TaN, TiN, etc. In some embodiments, the first capping material 208 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the substrate 202 and dummy patterns 204-1 to 204-3.

In some embodiments, the variable resistive material 210 has a resistance conversion characteristic (e.g. variable resistance). In other words, the variable resistive material 210 includes material characterized to show reversible resistance variance in accordance with a polarity and/or an amplitude of an applied electrical pulse. The variable resistive material 210 includes a dielectric layer. The variable resistive material 210 may be changed into a conductor or an insulator based on polarity and/or magnitude of electrical signal.

In one embodiment, the variable resistive material 210 may include a transition metal oxide. The transition metal oxide may be denoted as $M_xO_y$, where M is a transition metal, O is oxygen, x is the transition metal composition, and y is the oxygen composition. In an embodiment, the variable resistive material 210 includes $ZrO_2$. Examples of other materials suitable for the variable resistive material 210 include: NiO, $TiO_2$, HfO, ZrO, ZnO, $WO_3$, CoO, $Nb_2O_5$, $Fe_2O_3$, CuO, $CrO_2$, $SrZrO_3$ (Nb-doped), and/or other materials known in the art. In another embodiment, the variable resistive material 210 may include a colossal magnetoresistance (CMR)-based material such as, for example, $Pr_{0.7}Ca_{0.3}$, $MnO_3$, etc.

In yet another embodiment, the variable resistive material 210 may include a polymer material such as, for example, polyvinylidene fluoride and poly[(vinylidenefluoride-co-trifluoroethylene] (P (VDF/TrFE)). In yet another embodiment, the variable resistive material 210 may include a conductive-bridging random access memory (CBRAM) material such as, for example, Ag in GeSe. According to some embodiments, the variable resistive material 210 may include multiple layers having characteristics of a resistance conversion material. A set voltage and/or a reset voltage of the variable resistive material 210 may be determined by the variable resistive material 210's compositions (including the values of "x" and "y"), thickness, and/or other factors known in the art.

In some embodiments, the variable resistive material 210 may be formed by an atomic layer deposition (ALD) technique with a precursor containing a metal and oxygen over the first capping material 208. In some embodiments, other chemical vapor deposition (CVD) techniques may be used. In some embodiments, the variable resistive material 210 may be formed by a physical vapor deposition (PVD) technique, such as a sputtering process with a metallic target and with a gas supply of oxygen and optionally nitrogen to the PVD chamber. In some embodiments, the variable resistive material 210 may be formed by an electron-beam deposition technique.

In some embodiments, the second capping material 212 may include a substantially similar material of the first capping material 208. Thus, the second capping material 212 may include a material selected from a group consisting of: gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or silicide of these, such as TaN, TiN, TiAlN, TiW, or a combination thereof. Although the second capping material 212 is shown as a single layer in the illustrated embodiment of FIG. 2C (and the following figures), it is noted that the second capping material 212 may include plural layers formed as a stack, wherein each of the plural layers is formed of one of the above-described materials, e.g., TaN, TiN, etc. In some embodiments, the second capping material 212 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the variable resistive material 210.

Figure 2D:
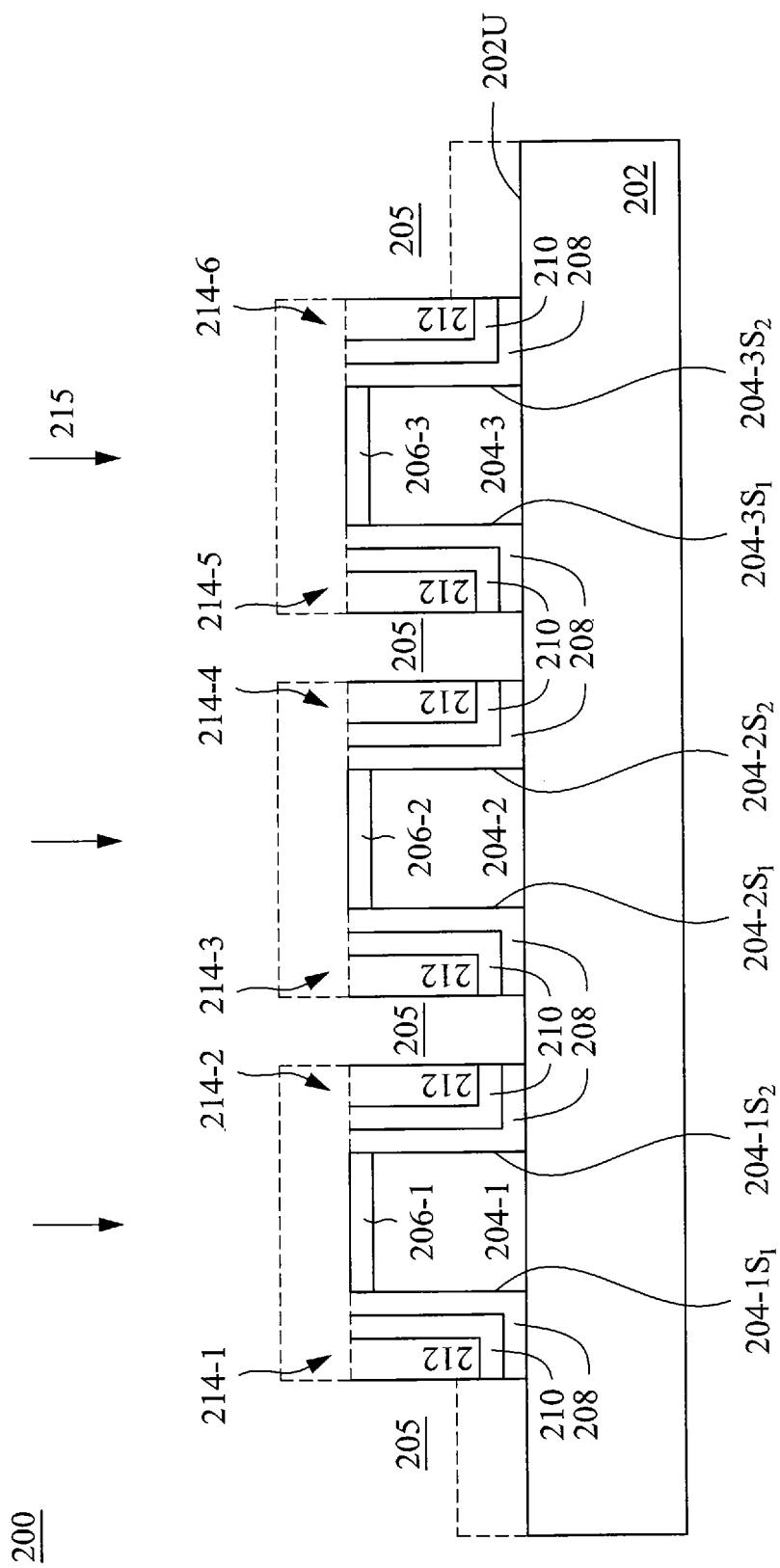

Corresponding to operation 108 of FIG. 1A, FIG. 2D is a cross-sectional view of the RRAM device 200 including a plurality of stacked resistor film segments 214-1, 214-2, 214-3, 214-5, and 214-6, which are formed at one of the various stages of fabrication, according to some embodiments. In some embodiments, the stacked resistor films 214-1 to 214-6 are formed by performing at least one anisotropic etching process 215 (e.g., a reactive ion etching (RIE) process) on the first capping material 208, variable resistive material 210, and second capping material 212. Accordingly, respective portions of the first capping material 208, variable resistive material 210, and second capping material 212 that were disposed above upper boundaries of the hard mask layers 206-1 to 206-3, and partial portions of the first capping material 208, variable resistive material 210, and second capping material 212 that were disposed above an upper boundary 202U of the layer 202 are removed. For purposes of clarity, such removed portions of the first capping material 208, variable resistive material 210, and second capping material 212 are outlined in dotted lines as shown in FIG. 2D. As such, each of the stacked resistor films 214-1 to 214-6 that extends along a sidewall of a respective dummy pattern (204-1, 204-2, or 204-3) is formed by respective remaining portions of the first capping material 208, variable resistive material 210, and second capping material 212, in accordance with some embodiments.

More specifically, the stacked resistor film 214-1 extends along the sidewall 204-1S$_1$ of the dummy pattern 204-1; the stacked resistor film 214-2 extends along the sidewall 204-1S$_2$ of the dummy pattern 204-1; the stacked resistor film 214-3 extends along the sidewall 204-2S$_1$ of the dummy pattern 204-2; the stacked resistor film 214-4 extends along the sidewall 204-2S$_2$ of the dummy pattern 204-2; the stacked resistor film 214-5 extends along the sidewall 204-3S$_1$ of the dummy pattern 204-3; and the stacked resistor film 214-6 extends along the sidewall 204-2S$_2$ of the dummy pattern 204-3. Further, after the formation of the stacked resistor films 214-1 to 214-6, part of the openings 205 (i.e., part of the upper boundary 202U) may be re-exposed, in accordance with some embodiments. Such re-exposed portions of the openings 205 may be used to form a plurality of WL's, which will be discussed below.

As mentioned above, in some embodiments, each of the stacked resistor films 214-1 to 214-6 is formed by the remaining first capping material 208, variable resistive material 210, and second capping material 212. Using the stacked resistor film 214-1 as a representative example, more specifically, the remaining first capping material 208 may present an "L-shaped" profile having a first leg extending along the sidewall 204-1S$_1$, and a second leg extending along an upper boundary 202U of the substrate and away from the dummy pattern 204-1; the remaining variable resistive material 210 may also present an L-shaped profile substantially similar to the remaining first capping material 208; and the remaining second capping material 212 may optionally present such an L-shaped profile. For example, in the illustrated embodiments of FIG. 2D (and the following figures), the remaining second capping material 212 in the stacked resistor film 214-1 does not have the L-shaped profile, but it is understood that, in some other embodiments, the remaining second capping material 212 can present a similar L-shaped profile while remaining within the scope of the present disclosure. Each of the remaining first capping material 208, variable resistive material 210, and second capping material 212 of other stacked resistor films 214-2 to 214-6 presents substantially similar profiles so the discussions are not repeated.

Figure 2E:
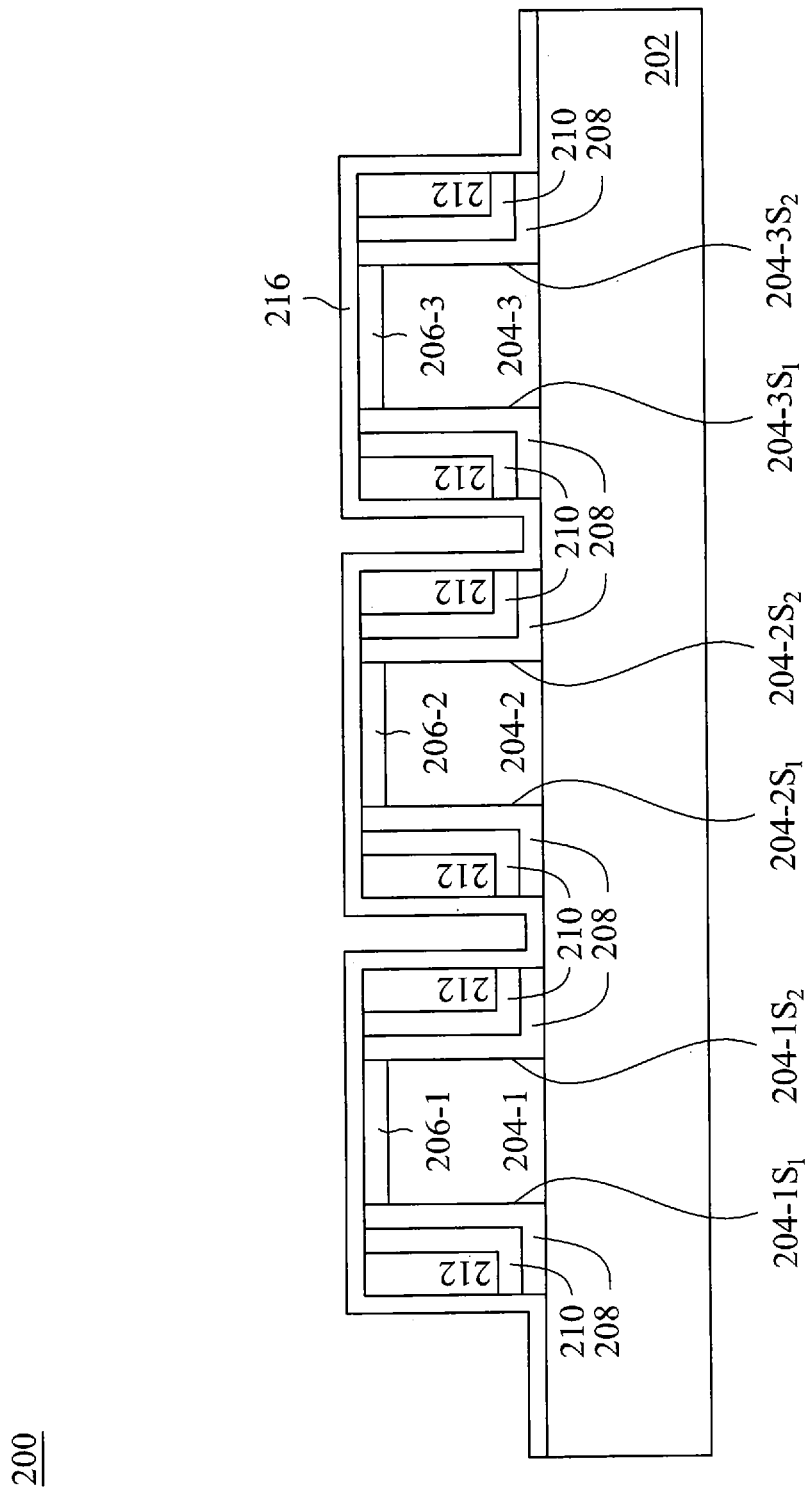

FIG. 2E is a cross-sectional view of the RRAM device 200 including an insulation layer 216, which is formed at one of the various stages of fabrication, according to some embodiments. As shown, the insulation layer 216 is formed over the substrate 202, the dummy patterns 204-1 to 204-3, and the stacked resistor films 214-2 to 214-6. In some embodiments, the insulation layer 216 at this stage may be a film including an oxide material. The insulation layer 216 may be formed by using CVD, PVD, E-gun, and/or other suitable techniques to deposit the oxide material.

Figure 2F:
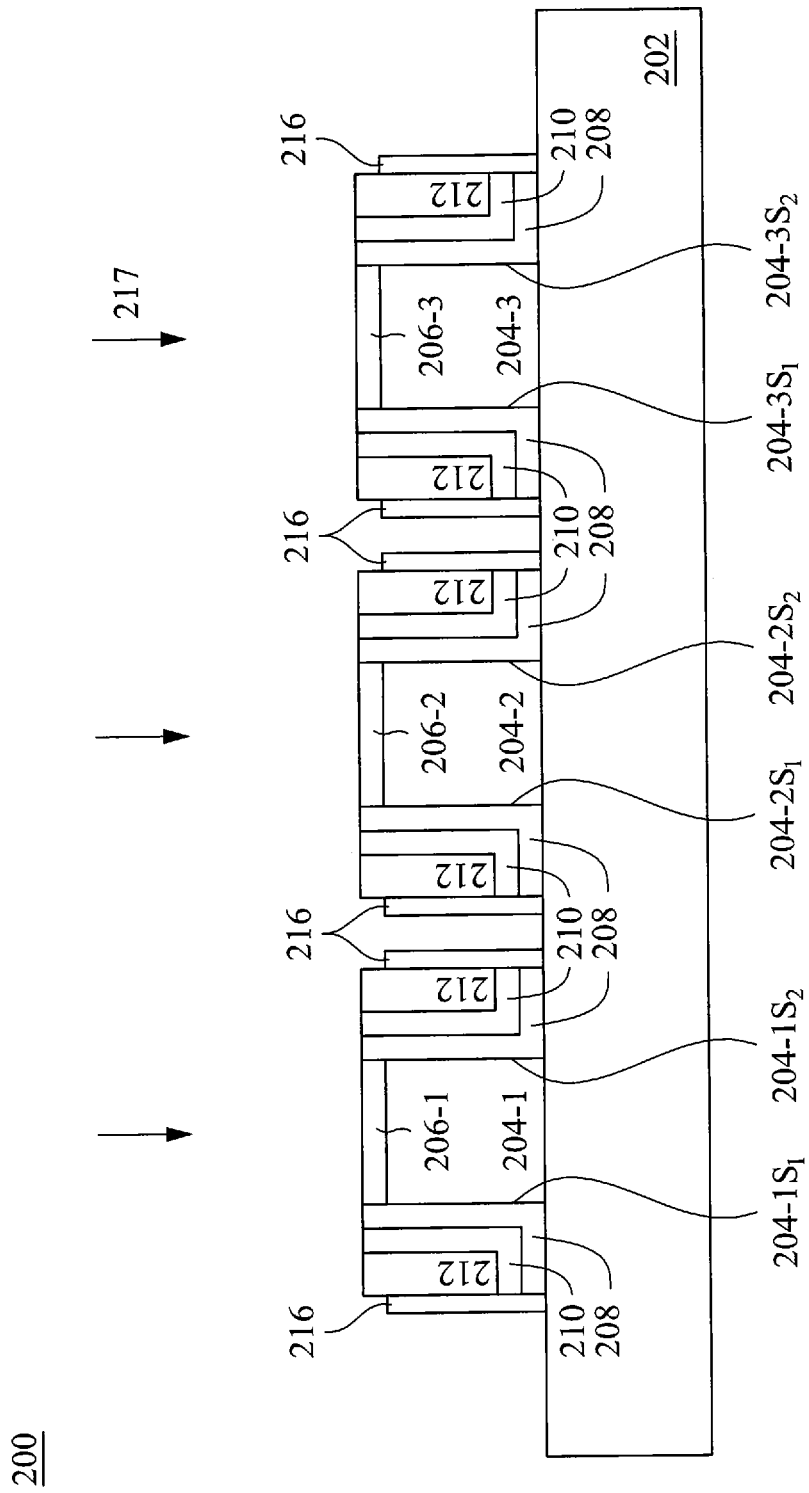

FIG. 2F is a cross-sectional view of the RRAM device 200 including a plurality of insulating segments 216, which are formed at one of the various stages of fabrication, according to some embodiments. In some embodiments, the plurality of insulating segments 216 are formed by performing at least one anisotropic etching process 217 (e.g., a reactive ion etching (ME) process) on the insulation layer 216, to expose: bottom portions of the openings or trenches 205, upper surfaces of the stacked resistor films 214-1 to 214-6, and top portions of the inner electrodes 212 including the second capping material. As such, each of the insulating segments 216 that extends along a sidewall of a respective stacked resistor film (214-1 to 214-6) is formed by respective remaining portions of the insulation layer 216, and can insulate the inner electrode 212 from the outer electrode 208.

Figure 2G:
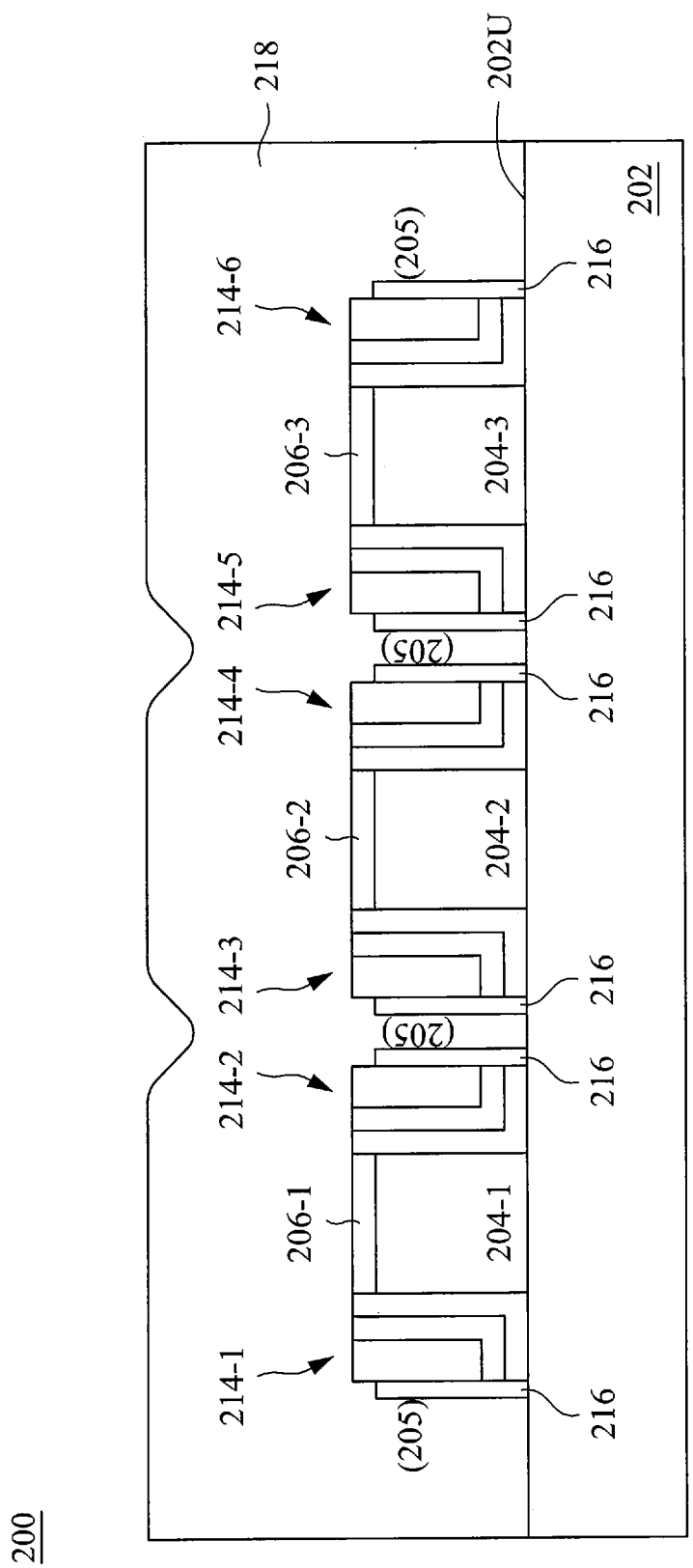

Corresponding to operation 110 of FIG. 1A, FIG. 2G is a cross-sectional view of the RRAM device 200 including a WL metal material 218, which is formed at one of the various stages of fabrication, according to some embodiments. As shown, the WL metal material 218 is formed over the substrate 202, the insulating segments 216, the dummy patterns 204-1 to 204-3, and the stacked resistor films 214-2 to 214-6, with a thickness relatively greater than heights of the dummy patterns 204-1 to 204-3, such that the re-exposed portions of the openings 205 can be fully filled. In some embodiments, the WL metal material 218 includes a conductive material such as, for example, copper (Cu), aluminum (Al), tungsten (W), etc. The WL metal material 218 may be formed by using CVD, PVD, E-gun, and/or other suitable techniques to deposit the above-described conductive material over the dummy patterns 204-1 to 204-3.

Figure 2H:
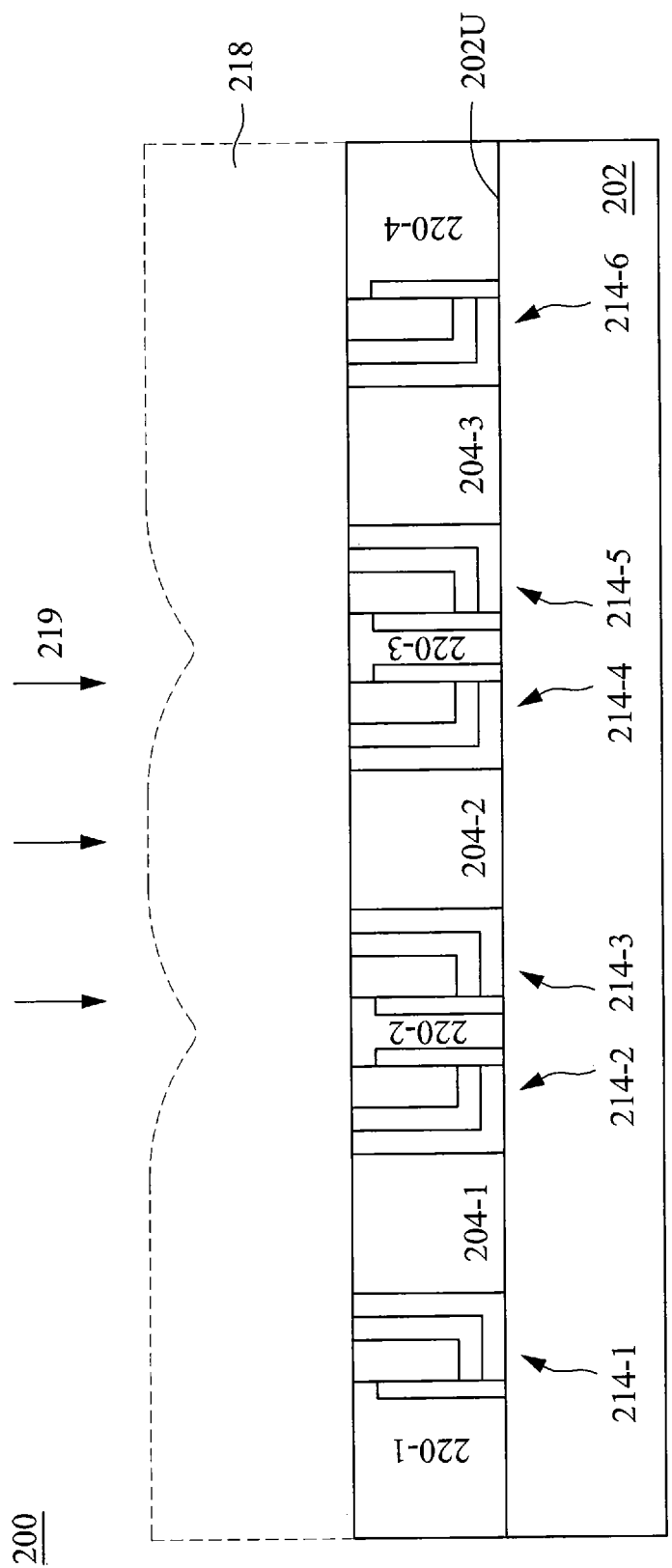

Corresponding to operation 112 of FIG. 1A, FIG. 2H is a cross-sectional view of the RRAM device 200 in which a polishing process 219 is performed at least on the WL metal material 218 (shown in dotted line) at one of the various stages of fabrication, according to some embodiments. In some embodiments, the polishing process 219 includes a chemical-mechanical polishing (CMP) process performed on the WL metal material 218 until the hard mask layers 206-1 to 206-3 are also polished out. As such, in some embodiments, respective upper portions of the stacked resistor films 214-1 to 214-6 that extended above upper boundaries of the dummy patterns 204-1 to 204-3 may also be polished out.

In some embodiments, the remaining portions of WL metal material 218 may form a plurality of WL's, 220-1, 220-2, 220-3, and 220-4, each of which is disposed between two adjacent stacked resistor films and extends along respective sidewalls of the two adjacent stacked resistor films. For example, the WL 220-1 is disposed between a non-shown stacked resistor film and the stacked resistor film 214-1 and extends along respective sidewalls of the non-shown stacked resistor film and the stacked resistor film 214-1; the WL 220-2 is disposed between the stacked resistor films 214-2 and 214-3 and extends along respective sidewalls of the stacked resistor films 214-2 and 214-3; the WL 220-3 is disposed between the stacked resistor films 214-4 and 214-5 and extends along respective sidewalls of the stacked resistor films 214-4 and 214-5; and the WL 220-4 is disposed between the stacked resistor film 214-6 and a non-shown stacked RRAM resistor film and extends along respective sidewalls of the stacked resistor film 214-6 and the non-shown stacked RRAM resistor film.

Figure 2I:
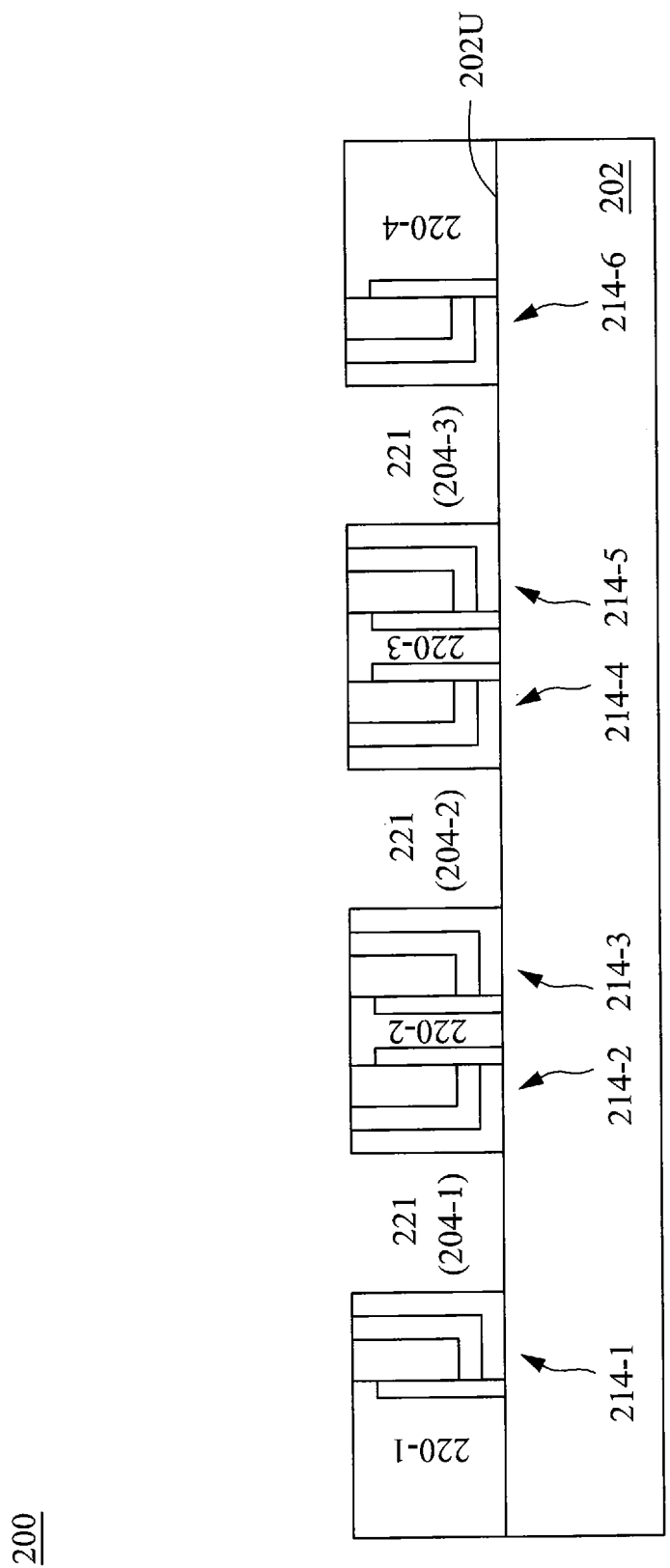

Corresponding to operation 114 of FIG. 1B, FIG. 2I is a cross-sectional view of the RRAM device 200 in which the dummy patterns 204-1 to 204-3 are removed at one of the various stages of fabrication, according to some embodiments. Since the polishing process 219 removes the hard mask layers 206-1 to 206-3 to expose respective upper boundaries of the dummy patterns 204-1 to 204-3 (FIG. 2H), in some embodiments, the dummy patterns 204-1 and 204-3 can be removed by performing at least one isotropic etching process (e.g., a wet etching process using acid-based etchants). After the removal of the dummy patterns 204-1 to 204-3, a plurality of openings 221 that are each located between two adjacent stacked resistor films are produced as shown in the illustrated embodiment of FIG. 2I. Alternatively stated, after the removal of the dummy patterns 204-1 to 204-3, the respective sidewalls of the stacked resistor films 214-1 to 214-6 that are opposite to the ones abutted by the WL's 220-1 to 220-3 are exposed.

Figure 2J:
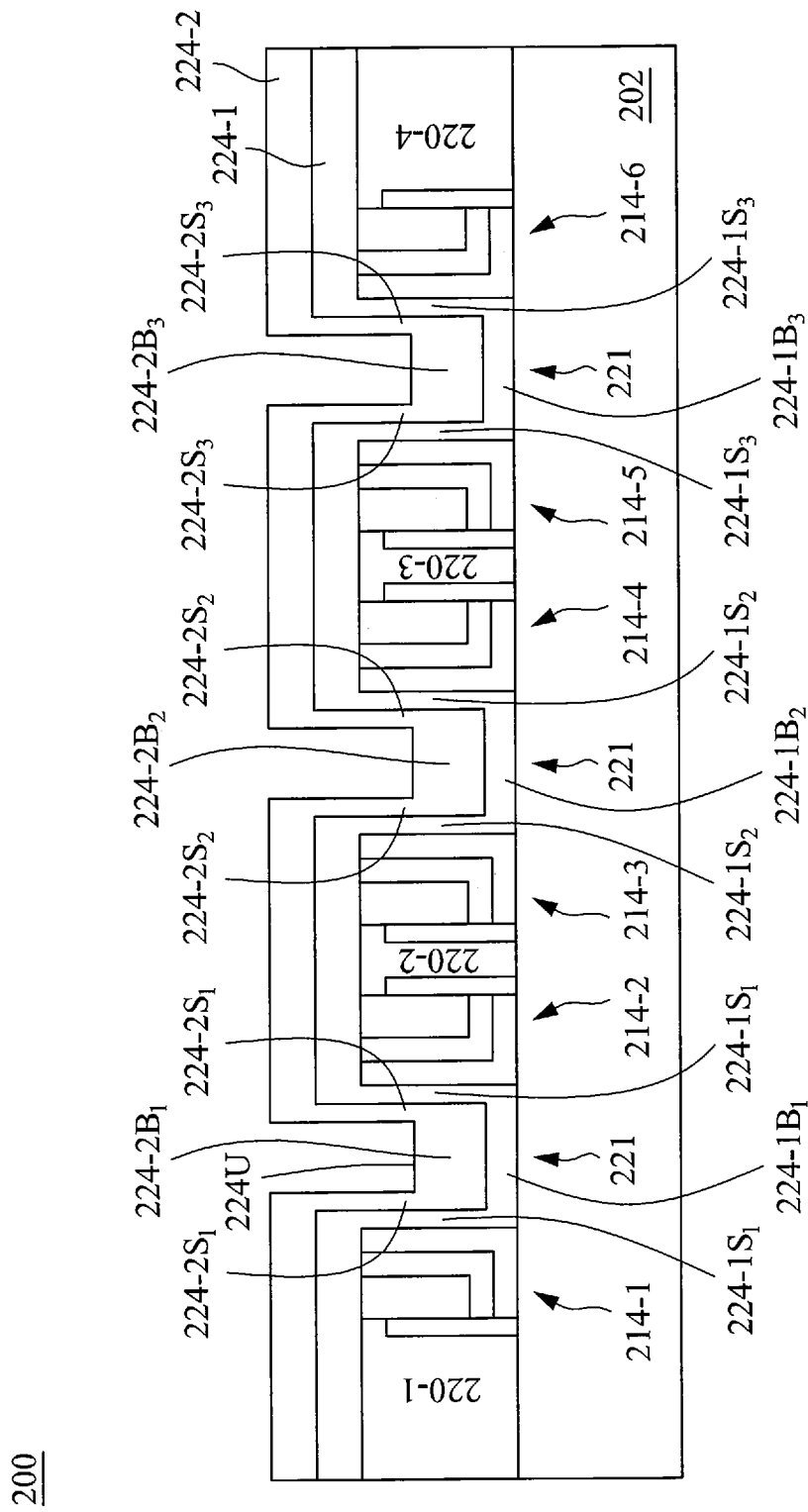

Corresponding to operation 116 of FIG. 1B, FIG. 2J is a cross-sectional view of the RRAM device 200 including a first selector material 224-1 and a second selector material 224-2, which are formed at one of the various stages of fabrication, according to some embodiments. As shown, the first and second selector materials 224-1 and 224-2 are disposed to partially fill the openings 221 (formed by the removal of the dummy patterns 204-1 to 204-3). Since the first and second selector materials 224-1 and 224-2 are each formed as a substantially thin and conformal layer (about 20~100 angstroms in the thickness), the recesses having U-shaped profiles (of the openings 221) may still remain along portions of an upper boundary 224U of the second selector material 224-2 that are located between two adjacent stacked resistor films, for example, adjacent stacked resistor films 214-1 and 214-2, adjacent stacked resistor films 214-3 and 214-4, and adjacent stacked resistor films 214-5 and 214-6.

In some embodiments, each of the selector materials 224-1 and 224-2 includes at least one of: an intrinsic semiconductor material (e.g., i-Si (silicon)), a lightly or heavily p-type doped semiconductor material (e.g., $p^-$-Si or $p^+$-Si), a lightly or heavily n-type doped semiconductor material (e.g., $n^-$-Si or $n^+$-Si), an insulator material (e.g., $HfO_2$, $Al_2O_3$, $TiO_2$, $Ti_2O_5$, etc.), a metal material (e.g., Ni, Ti, TiN, etc.). In an example, the first selector material 224-1 may be formed as an n-type doped Si layer; and the second selector material 224-2 may be formed as a p-type Si layer, causing a p-n diode (e.g., a unipolar selector device) to couple to each of the stacked resistor films 214-1 to 214-6 in series, which will be discussed in further detail below.

In some other embodiments, one or more additional selector materials, each of which includes an intrinsic semiconductor material, a lightly or heavily p-type doped semiconductor material, a lightly or heavily n-type doped semiconductor material, an insulator material, or a metal material, may be formed over the first and second selector materials 224-1 and 224-2. In an example, a third selector material (not shown) may be formed over the first and second selector materials 224-1 and 224-2, wherein the first selector material 224-1 includes a metal material (e.g., Ni), the second selector material 224-2 includes an insulator material (e.g., $TiO_2$), and the non-shown third selector material includes a similar metal material as the first selector material 224-1. As such, these three selector materials may form a metal-insulator-metal (MIM) tunnel diode (e.g., a bipolar selector device). In another example, the first selector material 224-1 includes a heavily doped n-type, or p-type, Si, the second selector material 224-2 includes a lightly doped p-type, or n-type, Si, and the non-shown third selector material includes a heavily doped n-type, or p-type, Si (similar as the first selector material 224-1). As such, these three selector materials may form a punch-through diode (e.g., a bipolar selector device).

More specifically, in some embodiments, between two adjacent stacked resistor films (e.g., 214-1 and 214-2), each of the first and second selector materials 224-1 and 224-2 follows the U-shaped profile of the opening 221. Accordingly, between two adjacent stacked resistor films, the first and second selector materials 224-1 and 224-2 each includes a bottom portion extending along the upper boundary 202U of the substrate 202, and two sidewall portions extending from respective ends of the bottom portion and along the sidewalls of the two adjacent stacked resistor films.

For example, the first selector material 224-1, between the stacked resistor films 214-1 and 214-2, includes a bottom portion 224-1B$_1$ that extends along the upper boundary 202U, and two sidewall portions 224-1S$_1$ that extend along the sidewalls of the stacker resistor films 214-1 and 214-2, respectively, and the second selector material 224-2, between the stacked resistor films 214-1 and 214-2, also includes a bottom portion 224-2B$_1$ that extends along the upper boundary 202U, and two sidewall portions 224-2S$_1$ that extend along the sidewalls of the stacker resistor films 214-1 and 214-2, respectively. The first selector material 224-1, between the stacked resistor films 214-3 and 214-4, includes a bottom portion 224-1B$_2$ that extends along the upper boundary 202U, and two sidewall portions 224-1S$_2$ that extend along the sidewalls of the stacker resistor films 214-1 and 214-2, respectively, and the second selector material 224-2, between the stacked resistor films 214-3 and 214-4, also includes a bottom portion 224-2B$_2$ that extends along the upper boundary 202U, and two sidewall portions 224-2S2 that extend along the sidewalls of the stacker resistor films 214-1 and 214-2, respectively. The first selector material 224-1, between the stacked resistor films 214-5 and 214-6, includes a bottom portion 224-1B$_3$ that extends along the upper boundary 202U, and two sidewall portions 224-1S$_3$ that extend along the sidewalls of the stacker resistor films 214-1 and 214-2, respectively, and the second selector material 224-2, between the stacked resistor films 214-1 and 214-2, also includes a bottom portion 224-2B$_3$ that extends along the upper boundary 202U, and two sidewall portions 224-2S$_3$ that extend along the sidewalls of the stacker resistor films 214-1 and 214-2, respectively.

Figure 2K:
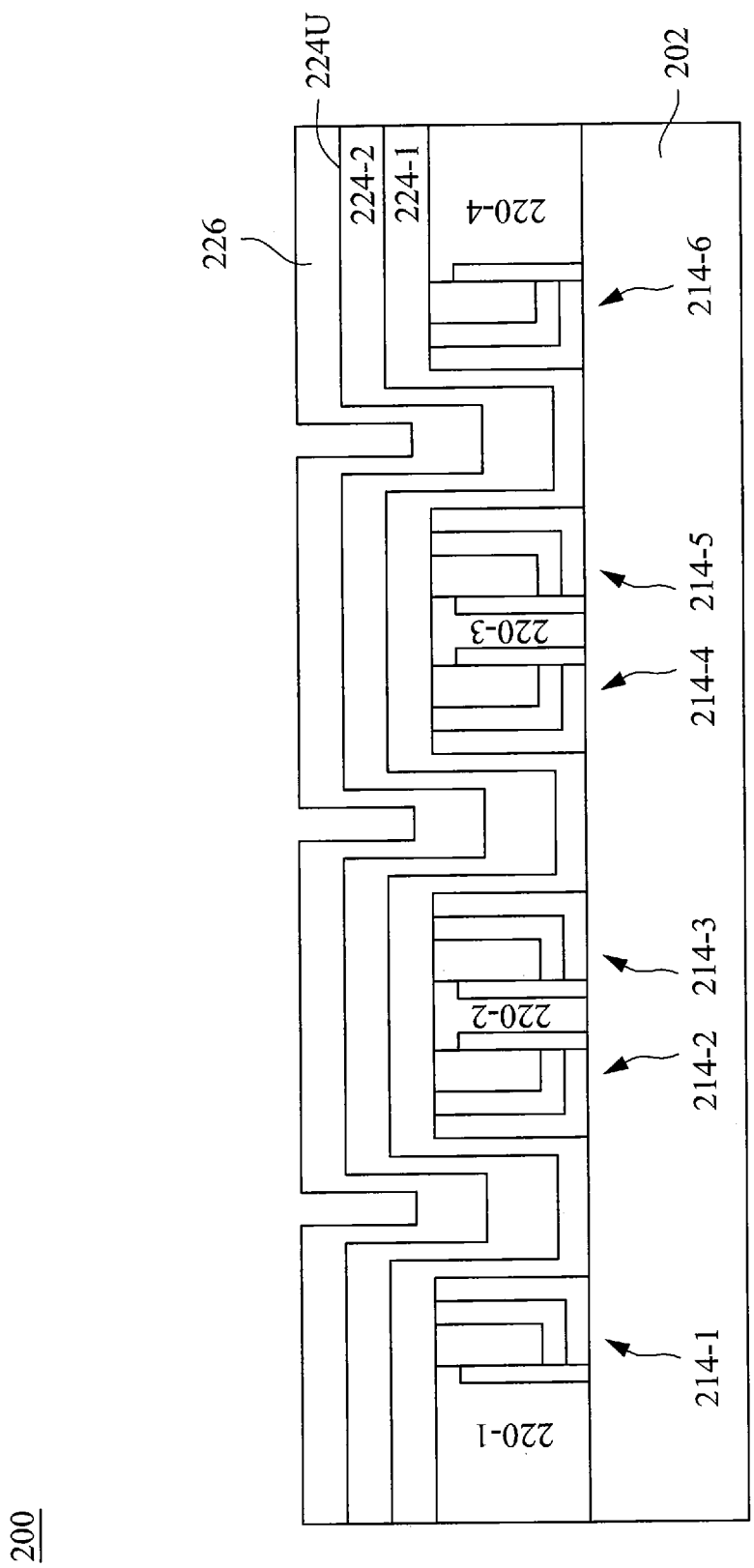

Corresponding to operation 118 of FIG. 1B, FIG. 2K is a cross-sectional view of the RRAM device 200 including a bit line (BL) metal material 226, which is formed at one of the various stages of fabrication, according to some embodiments. As shown, the BL metal material 226 is formed to overlay the second selector material 224-2. In some embodiments, the BL metal material 226 is formed to at least fill the U-shaped profiles along the upper boundary 224U. In some embodiments, the BL metal material 226 includes a conductive material such as, for example, copper (Cu), aluminum (Al), tungsten (W), etc. The BL metal material 226 may be formed by using CVD, PVD, E-gun, and/or other suitable techniques to deposit the above-described conductive material over the second selector material 224-2.

Figure 2L:
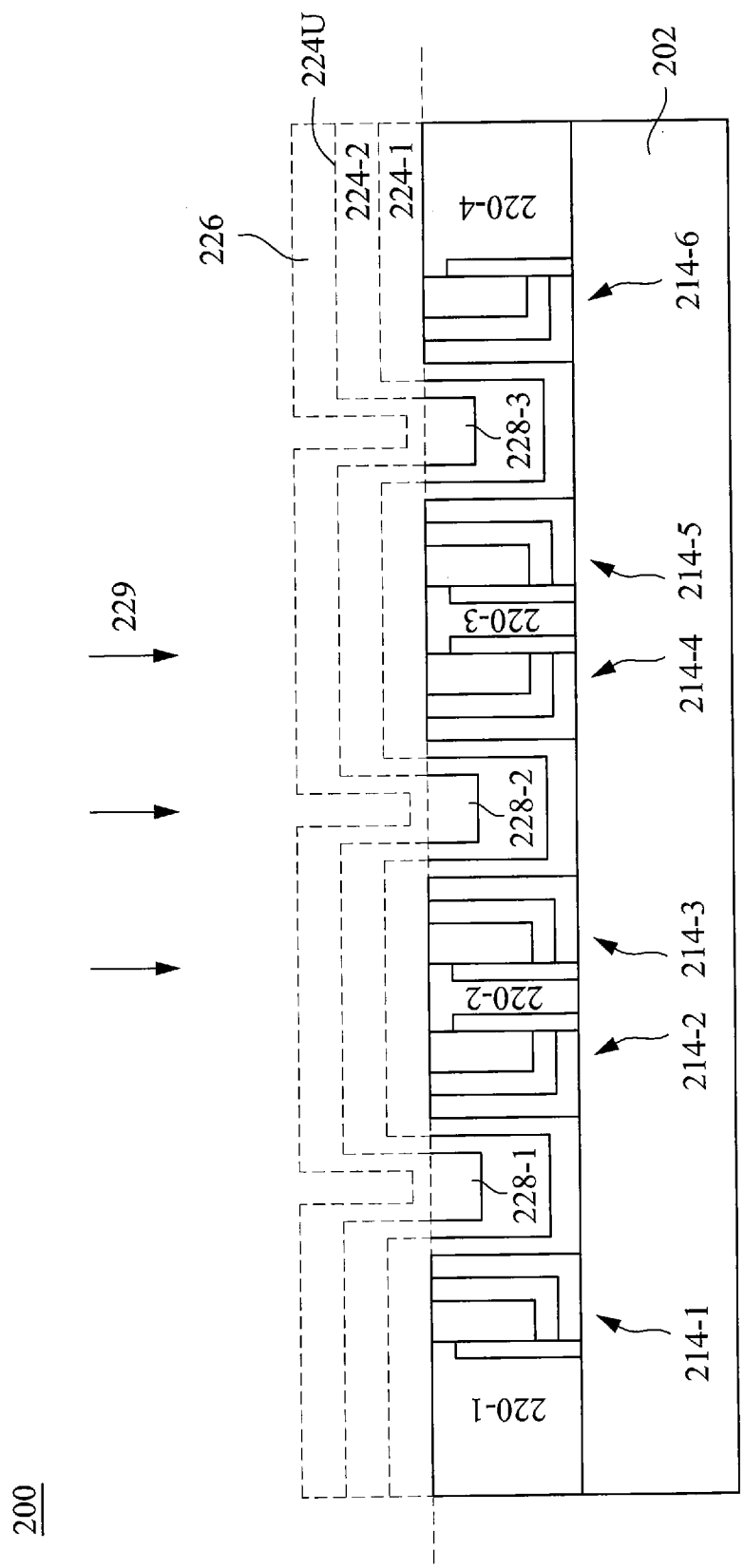

Corresponding to operation 120 of FIG. 1B, FIG. 2L is a cross-sectional view of the RRAM device 200 including a plurality of BL's 228-1, 228-2, and 228-3, which are formed at one of the various stages of fabrication, according to some embodiments. In some embodiments, the BL's 228-1 to 228-3 are formed by performing a polishing process 229 (e.g., a chemical-mechanical polishing (CMP) process) at least on the BL metal material 226 and upper portions of the first and second selector materials 224-1 and 224-2 that were disposed above upper boundaries of the WL's 220-1 to 220-4 until a coplanar boundary 231, shared by the stacked resistor films 214-1 to 214-6, the WL's 220-1 to 220-3, the remaining first and second selector materials 224-1 and 224-2, and the BL's 228-1 to 228-3, is formed. In other words, the polishing process 229 is performed on the BL metal material 226 and the upper portions of the first and second selector materials 224-1 and 224-2 that were disposed above the upper boundaries of the WL's 220-1 to 220-4 until the respective upper boundaries of the WL's 220-1 to 220-3 are re-exposed while keeping the U-shaped profiles on the second selector material 224-2 filled with the BL metal material 226.

As such, the BL 228-1 is partially surrounded by remaining portions of the first and second selector materials 224-1 and 224-2 between the stacked resistor films 214-1 and 214-2, i.e., respective remaining portions of the sidewall portions 224-2S$_1$ and the bottom portion 224-2B$_1$ and respective remaining portions of the sidewall portions 224-1S$_1$ and the bottom portion 224-1B$_1$; the BL 228-2 is partially surrounded by remaining portions of the second selector material 224-2 between the stacked resistor films 214-3 and 214-4, i.e., respective remaining portions of the sidewall portions 224-2S$_2$ and the bottom portion 224-2B$_2$ and respective remaining portions of the sidewall portions 224-1S$_2$ and the bottom portion 224-1B$_2$; and the BL 228-3 is partially surrounded by remaining portions of the second selector material 224-2 remained between the stacked resistor films 214-5 and 214-6, i.e., respective remaining portions of the sidewall portions 224-2S$_3$ and the bottom portion 224-2B$_3$ and respective remaining portions of the sidewall portions 224-1S$_3$ and the bottom portion 224-1B$_3$.

In some embodiments, after the formation of the BL's 228-1 to 228-3, a plurality of RRAM bit cells 241-1, 241-2, 241-3, 241-4, 241-5, and 241-6 can be formed along a first lateral direction (e.g., a direction in parallel with the X axis shown in FIG. 2L), wherein each RRAM bit cell is formed by an RRAM resistor and a serially coupled selector device. Further, each RRAM bit cell is coupled to a BL, extending along a second lateral direction (e.g., a direction in parallel with the Y axis in FIG. 2L), and a WL, extending along a vertical direction (e.g., a direction in parallel with the Z axis in FIG. 2L), at two respective ends.

More specifically, the RRAM bit cell 241-1 includes an RRAM resistor, formed by the stacked resistor film 214-1 (hereinafter "RRAM resistor 241-1R"), and a selector device, formed by the remaining sidewall portions 224-1S$_1$ and 224-2S$_1$ at the left-hand side of the BL 228-1 (hereinafter "selector device 241-1S"). And the RRAM bit cell 241-1 is coupled to the BL 228-1 and WL 220-1 at respective ends. Similarly, the RRAM bit cell 241-2 includes an RRAM resistor, formed by the stacked resistor film 214-2 (hereinafter "RRAM resistor 241-2R"), and a selector device, formed by the remaining sidewall portions 224-1S$_1$ and 224-2S$_1$ at the right-hand side of the BL 228-1 (hereinafter "selector device 241-2S"). And the RRAM bit cell 241-2 is coupled to the BL 228-1 and WL 220-2 at respective ends. The RRAM bit cell 241-3 includes an RRAM resistor, formed by the stacked resistor film 214-3 (hereinafter "RRAM resistor 241-3R"), and a selector device, formed by the remaining sidewall portions 224-1 S$_2$ and 224-2S$_2$ at the left-hand side of the BL 228-2 (hereinafter "selector device 241-3S"). And the RRAM bit cell 241-3 is coupled to the BL 228-2 and WL 220-2 at respective ends. The RRAM bit cell 241-4 includes an RRAM resistor, formed by the stacked resistor film 214-4 (hereinafter "RRAM resistor 214-4R"), and a selector device, formed by the remaining sidewall portions 224-1S2 and 224-2S$_2$ at the right-hand side of the BL 228-1 (hereinafter "selector device 241-1S"). And the RRAM bit cell 241-4 is coupled to the BL 228-2 and WL 220-3 at respective ends. The RRAM bit cell 241-5 includes an RRAM resistor, formed by the stacked resistor film 214-5 (hereinafter "RRAM resistor 241-5R"), and a selector device, formed by the remaining sidewall portions 224-1S$_3$ and 224-2S$_3$ at the left-hand side of the BL 228-3 (hereinafter "selector device 241-5S"). And the RRAM bit cell 241-5 is coupled to the BL 228-3 and WL 220-3 at respective ends. The RRAM bit cell 241-6 includes an RRAM resistor, formed by the stacked resistor film 214-6 (hereinafter "RRAM resistor 241-6R"), and a selector device, formed by the remaining sidewall portions 224-1 $S_3$ and 224-2$S_3$ at the right-hand side of the BL 228-3 (hereinafter "selector device 241-6S"). And the RRAM bit cell 241-6 is coupled to the BL 228-3 and WL 220-4 at respective ends.

In some embodiments, while operating the RRAM bit cell (e.g., 241-1 to 241-6), a current flows from the corresponding BL, through the selector device, and if the current is allowed to conduct through the selector device (i.e., forward bias in the designated direction), the current further flows through the RRAM resistor to the WL, or the other way around. Thus, it is noted that each RRAM bit cell of the disclosed RRAM device 200 has its active interface(s) (i.e., an interface where a conducted current flows through) substantially parallel to each other and to a plane expanded by the Y axis and Z axis, according to some embodiments of the present disclosure.

Using the RRAM bit cell 241-1 as a representative example, a current may first flow from the BL 228-1 to the selector device 241-1S (the remaining sidewall portions 224-2$S_1$ and 224-1$S_1$), wherein such a current flows through a first active interface between the sidewall of the BL 228-1 and the remaining sidewall portion 224-2S1. If the current is allowed to conduct through, similarly, the current flows through a second active interface between the remaining sidewall portions 224-2$S_1$ and 224-1$S_1$, a third active interface between the remaining sidewall portions 224-1S1 and the variable resistor material of the stacked resistor film 214-1, and a fourth active interface between the variable resistor material of the stacked resistor film 214-1 and the sidewall of the WL 220-1, to the WL 220-1, wherein each of the above-mentioned active interfaces is substantially parallel to the plane expanded by the Y axis and Z axis.

It is noted that the any two adjacent ones of the RRAM bit cells 241-1 to 241-6 at two opposite sides of one of the BL's 228-1 to 228-3 present a symmetric characteristic, in accordance with some embodiments. More specifically, respective resistors and selector devices of any two RRAM bit cells 241-1 to 241-6 are mirror symmetric over a respective BL. For example, the RRAM bit cell 241-1's selector device 241-1S and the RRAM bit cell 241-2's selector device 241-2S are mirror symmetric over the BL 228-1, and the RRAM bit cell 241-1's resistor 241-1R and the RRAM bit cell 241-2's resistor 241-2R are also mirror symmetric over the BL 228-1; the RRAM bit cell 241-3's selector device 241-3S and the RRAM bit cell 241-4's selector device 241-4S are mirror symmetric over the BL 228-2, and the RRAM bit cell 241-3's resistor 241-3R and the RRAM bit cell 241-4's resistor 241-4R are also mirror symmetric over the BL 228-2; and the RRAM bit cell 241-5's selector device 241-5S and the RRAM bit cell 241-6's selector device 241-6S are mirror symmetric over the BL 228-3, and the RRAM bit cell 241-5's resistor 241-5R and the RRAM bit cell 241-6's resistor 241-6R are also mirror symmetric over the BL 228-3.

In some embodiments, when viewed respectively, the RRAM bit cells 241-1, 241-2, 241-3, 241-4, 241-5, and 241-6 are laterally formed as a strip on the substrate 202 extending in parallel with the X axis; the BL's 228-1, 228-2, and 228-3 respectively traverse the strip and extend in parallel with the Y axis; and the WL's 220-1, 220-2, 220-3, and 220-4 traverse the strip and extend in parallel with the Z axis. It is noted that such a strip can include any desired number of RRAM bit cells formed therein, and any desired number of BL's and WL's passing therethrough as long as the RRAM bit cells and corresponding BL/WL are arranged in similar fashion as the illustrated embodiment of FIG. 2L. Further, in some embodiments, there may be plural such strips formed over the substrate 202 that are laterally spaced apart from each other and disposed in parallel with each other (i.e., in parallel with the X axis), which will be illustrated and discussed with respect to FIG. 3.

Figure 2M:
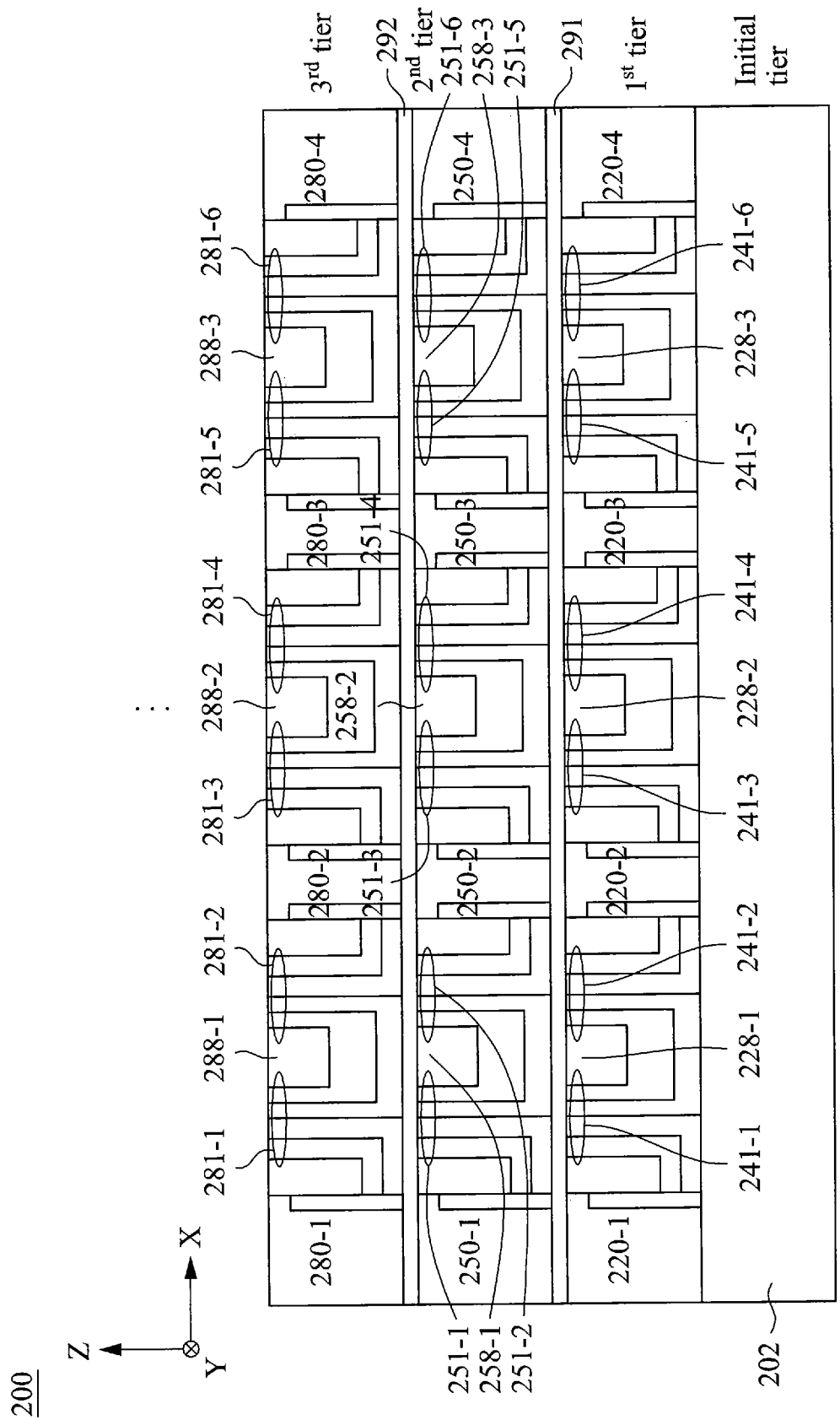

Corresponding to operation 122 of FIG. 1B, FIG. 2M is a cross-sectional view of the RRAM device 200 including a plurality of tiers ($1^{st}$, $2^{nd}$, $3^{rd}$ tiers, etc.), which are formed at one of the various stages of fabrication, according to some embodiments. As mentioned above, the substrate 202 is typically referred to as the initial tier, and accordingly, the tier that includes the RRAM bit cells 241-1 to 241-6, BL's 228-1 to 228-3, and WL's 220-1 to 220-4 is referred to as being formed on a $1^{st}$ tier. According to some embodiments of the present disclosure, each of the tiers formed above the $1^{st}$ tier can be made by repeating operations 104 to 120 of the method 100 of FIG. 1 such that embodiments of the $2^{nd}$ and $3^{rd}$ tiers are briefly discussed as follows.

In the illustrated embodiment of FIG. 2M, the $2^{nd}$ tier includes RRAM bit cells 251-1, 251-2, 251-3, 251-4, 251-5, and 251-6 with BL's 258-1, 258-2, and 258-3 and WL's 250-1, 250-2, 250-3, and 250-4 passing therethrough along respective directions. The BL's 258-1 to 258-3 extend along a direction in parallel with the Y axis (the same direction as the BL's 228-1 to 228-3 at the $1^{st}$ tier), and the WL's 250-1 to 250-4 extend along a direction in parallel with the Z axis (the same direction as the WL's 220-1 to 220-4 at the $1^{st}$ tier). In some embodiments, the WL's 250-1 to 250-4 at the $2^{nd}$ tier are respectively aligned with, and coupled to, the WL's 220-1 to 220-4 at the $1^{st}$ tier. Similarly, the $3^{rd}$ tier includes RRAM bit cells 281-1, 281-2, 281-3, 281-4, 281-5, and 281-6 with BL's 288-1, 288-2, and 288-3 and WL's 280-1, 280-2, 280-3, and 280-4 passing therethrough along respective directions. The BL's 288-1 to 288-3 extend along a direction in parallel with the Y axis (the same direction as the BL's 228-1 to 228-3 at the $1^{st}$ tier, and the BL's 258-1 to 258-3 at the $2^{nd}$ tier), and the WL's 280-1 to 280-4 extend along a direction in parallel with the Z axis (the same direction as the WL's 220-1 to 220-4 at the $1^{st}$ tier, and the WL's 250-1 to 250-4 at the $2^{nd}$ tier). In some embodiments, the WL's 280-1 to 280-4 at the $3^{rd}$ tier are respectively aligned with, and coupled to, the WL's 250-1 to 250-4 at the $2^{nd}$ tier and the WL's 220-1 to 220-4 at the $1^{st}$ tier.

In some embodiments, an insulation layer is formed between every two adjacent tiers. For example, an insulation layer 291 is formed on the $1^{st}$ tier and below the $2^{nd}$ tier; and an insulation layer 292 is formed on the $2^{nd}$ tier and below the $3^{rd}$ tier. Each of the insulation layer 291 and the insulation layer 292 may include oxide material.

As discussed above with respect to FIG. 2L, a plurality of strips, each of which includes a plurality of horizontally formed RRAM bit cells, can be formed over the substrate 202 with the BL's and WL's passing therethrough horizontally and vertically, respectively. In some embodiments, such a plurality of strips and the horizontally extended BL's may be collectively referred to as a tier. And as discussed above with respect to FIG. 2M, by repeating operations 104 to 120 of the method 100 of FIG. 1, a plurality of tiers can be formed on top of one another, wherein such a plurality of tiers are coupled to each other by respective WL's that extend vertically.

Figure 3:
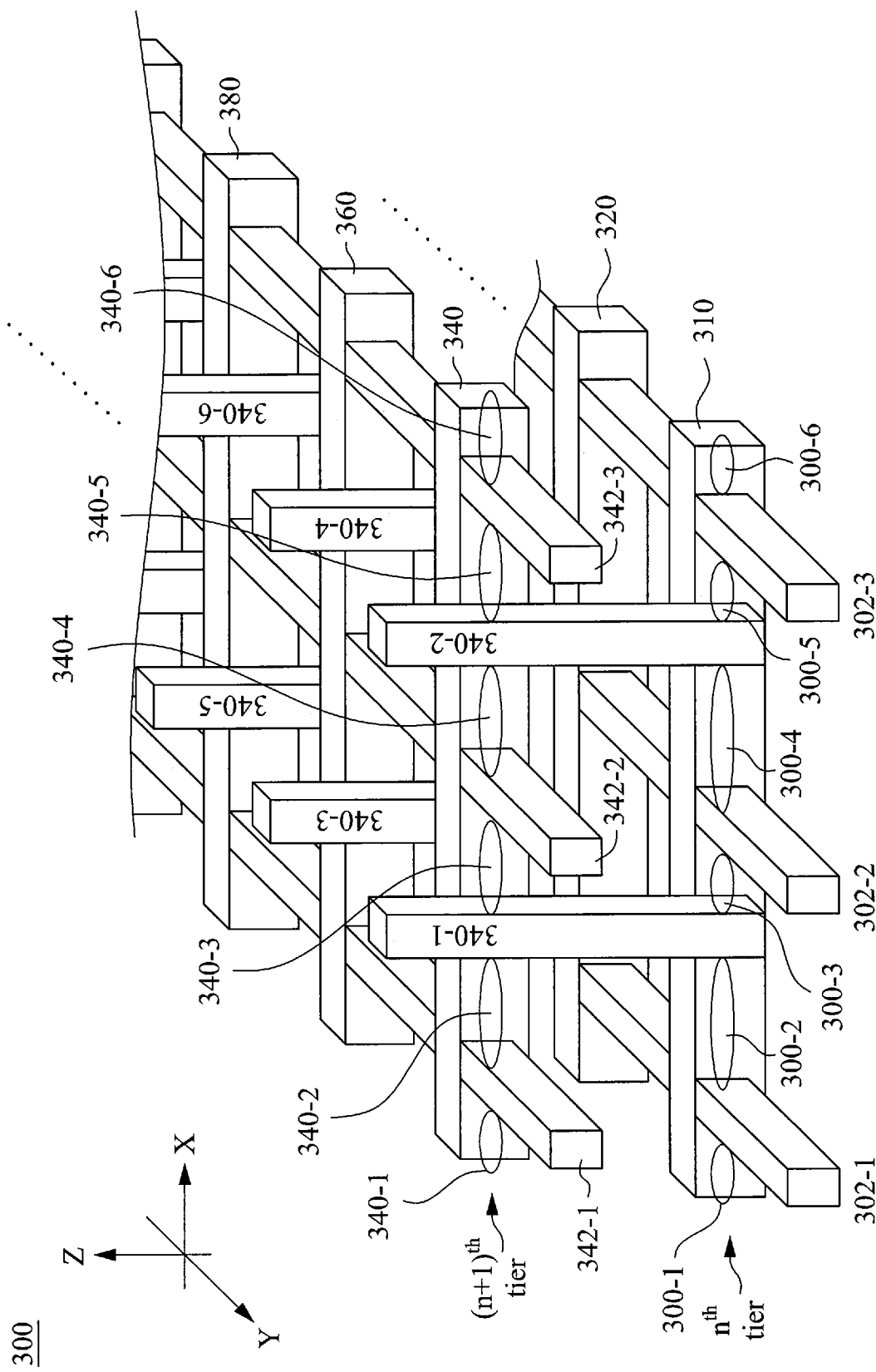
FIG. 3 illustrates a perspective view of an exemplary semiconductor device that includes a plurality of tier, in accordance with some embodiments.

FIG. 3 illustrates a perspective view of an exemplary RRAM device 300 that includes a plurality of strips 310, 320, 340, 360, and 380 respectively formed on a plurality of tiers ($n^{th}$ tier, $(n+1)^{th}$ tier, etc.), in accordance with various embodiments. Although there are only two tier are shown, and there are only two strips 310 and 320 shown at the $n^{th}$ tier and three strips 340, 360, and 380 shown at the $(n+1)^{th}$ tier, it is understood that the RRAM device 300 can include any desired number of tiers, and each tier can include any desired number of strips while remaining within the scope of the present disclosure.

As shown in the illustrated embodiment of FIG. 3, the strips 310, 320, 340, 360, and 380 are formed to extend in parallel with the X axis. The strips 310 and 320 at the $n^{th}$ tier are coupled by BL's 302-1, 302-2, 302-3 that extend in parallel with the Y axis; and the strips 340, 360, and 380 at the $(n+1)^{th}$ tier are coupled by BL's 342-1, 342-2, and 342-3 that extend in parallel with the Y axis. The strip 340 at the $(n+1)^{th}$ tier and the strip 310 at the $n^{th}$ tier are coupled by WL's 304-1 and 304-2 that extend in parallel with the Z axis; the strip 360 at the $(n+1)^{th}$ tier and the strip 320 at the $n^{th}$ tier are coupled by WL's 304-3 and 304-4 that extend in parallel with the Z axis; and the strip 380 at the $(n+1)^{th}$ tier and a not shown strip at the $n^{th}$ tier are coupled by WL's 304-5 and 304-6 that extend in parallel with the Z axis.

In particular, at the $n^{th}$ tier, the strip 310 includes RRAM bit cells 300-1, 300-2, 300-3, 300-4, 300-5, and 300-6, and the strip 320 includes a plurality of RRAM bit cells substantially similar to the RRAM bit cells 300-1 to 300-3; and at the $(n+1)^{th}$ tier, the strip 340 includes RRAM bit cells 340-1, 340-2, 340-3, 340-4, 340-5, and 340-6, and the other strips 360 and 380 each includes a plurality of RRAM bit cells substantially similar to the RRAM bit cells 340-1 to 340-6. Further, at the $n^{th}$ tier, the BL 302-1 is formed to traverse the strip 310 to be coupled between the RRAM bit cells 300-1 and 300-2; the BL 302-2 is formed to traverse the strip 310 to be coupled between the RRAM bit cells 300-3 and 300-4; and the BL 302-3 is formed to traverse the strip 310 to be coupled between the RRAM bit cells 300-5 and 300-6. Although not shown, it is understood that each of the BL's 302-1 to 302-3 also traverses the strip 320 to be coupled between respective adjacent RRAM bit cells therein.

Similarly, at the $(n+1)^{th}$ tier, the BL 342-1 is formed to traverse the strip 340 to be coupled between the RRAM bit cells 340-1 and 340-2; the BL 342-2 is formed to traverse the strip 340 to be coupled between the RRAM bit cells 340-3 and 340-4; and the BL 342-3 is formed to traverse the strip 340 to be coupled between the RRAM bit cells 340-5 and 340-6. Although not shown, it is understood that each of the BL's 342-1 to 342-3 also traverses the strips 360 and 380 to be coupled between respective adjacent RRAM bit cells therein.

Figure 4A:
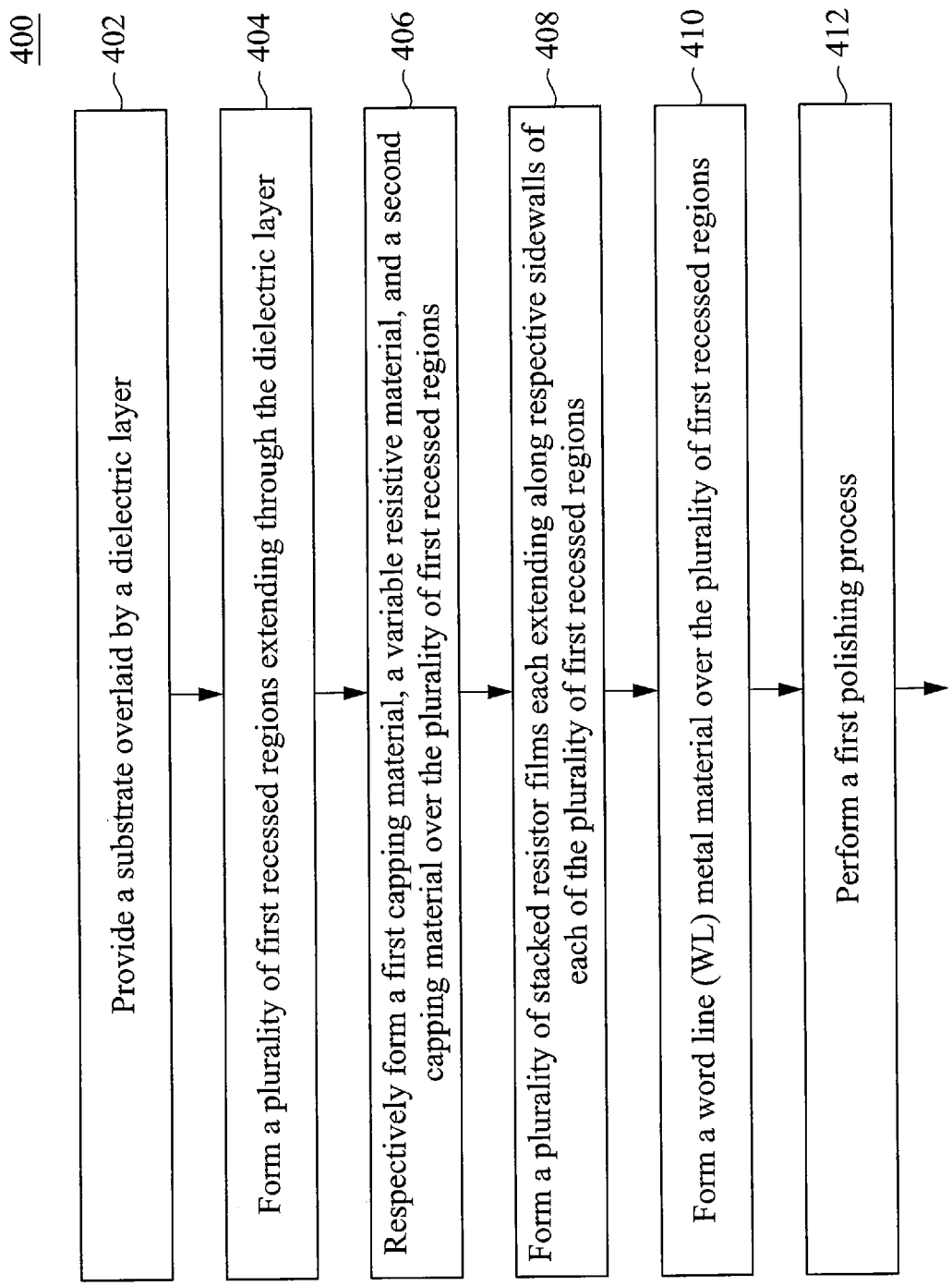
FIGS. 4A and 4B illustrate a flow chart of another exemplary method for forming a semiconductor device, in accordance with some embodiments.
Figure 4B:
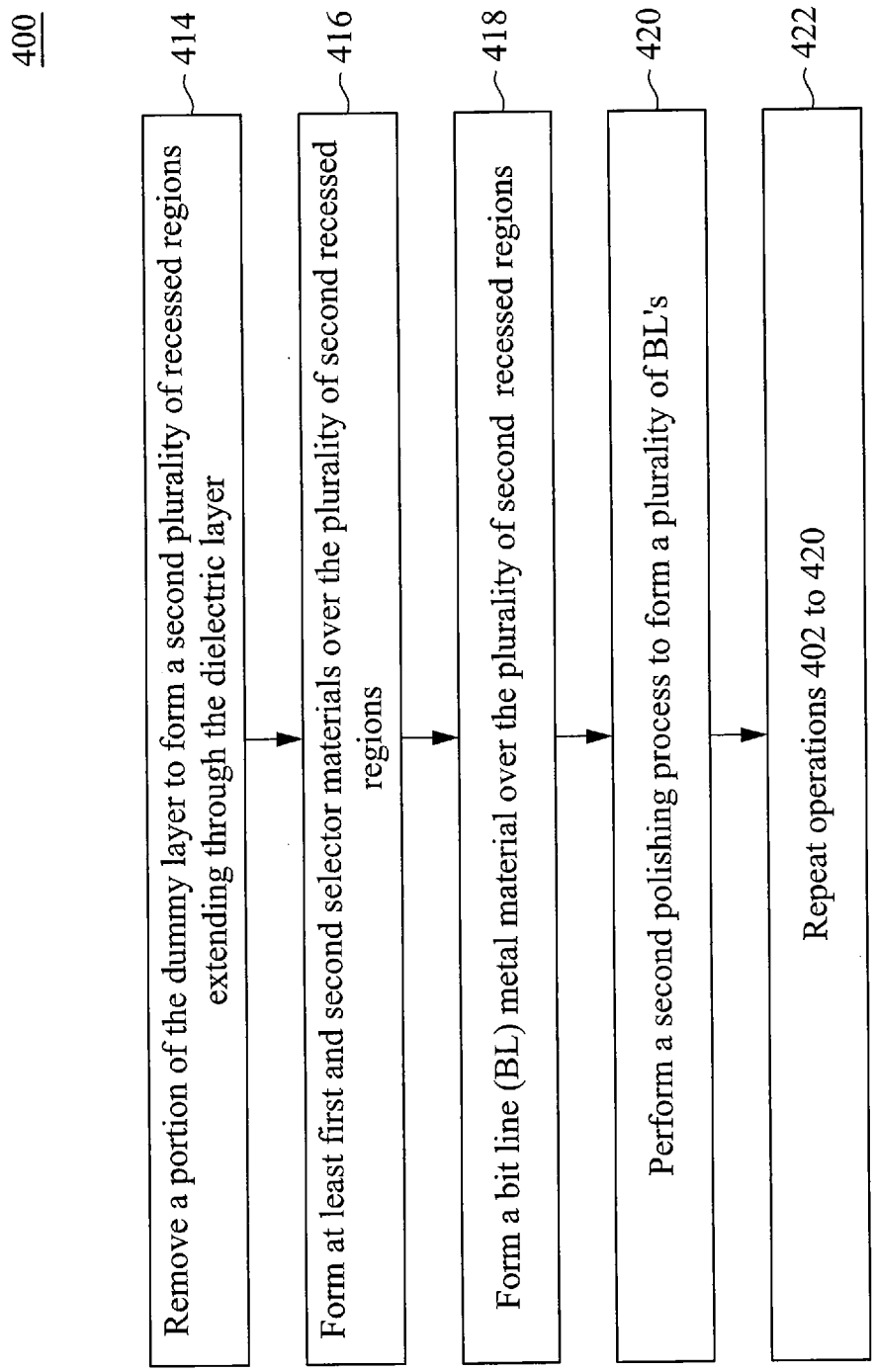

In some embodiments, the exemplary RRAM device 300 can be formed by a method 400 substantially similar to the method 100 of FIG. 1. FIGS. 4A and 4B illustrate a flowchart of the method 400, according to one or more embodiments of the present disclosure. It is noted that the method 400 is merely an example, and is not intended to limit the present disclosure. It is noted that the method 400 of FIGS. 4A and 4B does not produce a completed RRAM device. A completed RRAM device may be fabricated using complementary metal-oxide-semiconductor (CMOS) technology processing. Accordingly, it is understood that additional operations may be provided before, during, and after the method 400 of FIGS. 4A and 4B, and that some other operations may only be briefly described herein. In some other embodiments, the method 400 may be used to form any of a variety of nonvolatile memory (NVM) devices, such as ferroelectric random access memory (FRAM) devices, phase-change random access memory (PRAM) devices, magnetoresistive random access memory (MRAM) devices, etc., while remaining within the scope of the present disclosure.

Referring first to FIG. 4A, the method 400 starts with operation 402 in which a substrate overlaid by a dielectric layer is formed. The method 400 continues to operation 404 in which a plurality of first recessed regions that respectively extend through the dielectric layer are formed. In some embodiments, the plurality of first recessed regions may be formed as a two-dimensional array, when viewed from the top. The method 400 continues to operation 406 in which a first capping material, a variable resistive material, and a second capping material are respectively formed over the plurality of first recessed regions. The method 400 continues to operation 408 in which a plurality of stacked resistor films that each extends along respective sidewalls of each of the plurality of first recessed regions are formed. Each stacked resistor film is formed by respective remaining portions (after etched) of the first capping material, variable resistive material, and second capping material. In some embodiments, subsequently to forming the stacked resistor films, a plurality of word line (WL) openings, which will be discussed below, are respectively formed within the plurality of first recessed regions. The method 400 continues to operation 410 in which a WL metal material is formed over the plurality of first recessed regions. In some embodiments, the WL metal material may fill the plurality of WL openings. The method 400 continues to operation 412 in which a first polishing process is performed. In some embodiments, the first polishing process is performed at least on the WL metal material to re-expose an upper boundary of the dielectric layer and form a plurality of WL's. In some embodiments, when viewed from the top, the plurality of WL's are each surrounded by a respective stacked resistor film, which will be shown and discussed below.

Referring then to FIG. 4B, the method 400 continues to operation 414 in which a portion of the dielectric layer is removed to form a plurality of second recessed regions extending through the dielectric layer. In some embodiments, each of the plurality of second recessed regions includes one vertical portion and at least two lateral portions. When viewed from the top, the lateral portions each traverses the vertical portion and in communication with two adjacent stacked resistors films; and when viewed cross-sectionally, the lateral portions each exposes respective sidewalls of the two adjacent stacked resistor films and an upper boundary of the substrate to present a U-shaped profile, which will be shown and discussed below. The method 400 continues to operation 416 in which at least first and second selector materials are formed over the plurality of second recessed regions. The method 100 continues to operation 418 in which a bit line (BL) metal material is formed over the first and second selector materials. In some embodiments, since the first and second selector materials are each formed to be substantially thin and conformal, the respective U-shaped profiles of the second recessed regions may still be present along a portion of an upper boundary of the top selector material (e.g., the second selector material). And the BL metal material is formed to at least fill such U-shaped profiles present on the second selector material. The method 100 continues to operation 420 in which a second polishing process is performed to form a plurality of BL's. In some embodiments, the second polishing process is performed at least on the BL metal material and the first and second selector materials until respective upper boundaries of the WL's are re-exposed while keeping the U-shaped profiles of the second selector material filled with the BL metal material.

In some embodiments, after the formation of the BL's, a first plurality of RRAM bit cells can be formed as a first strip (e.g., strip 310 of FIG. 3) extending in parallel with a first axis (e.g., the X axis of FIG. 3) and a second plurality of RRAM bit cells can be formed as a second strip (e.g., strip 320 of FIG. 3) also extending in parallel with the first axis, with the plurality of BL's (e.g., 302-1, 302-2, and 302-3 of FIG. 3) passing through the first and second strips that extend in parallel with a second axis (e.g., the Y axis of FIG. 3), and with the plurality of WL's (e.g., 304-1, 304-2, 304-3, 304-4, 304-5, and 304-6 of FIG. 3) passing through either the first or second strip that extend in parallel with a third axis (e.g., the Z axis of FIG. 3). Further, the first and second strips may be referred to as being formed on a first tier (e.g., the $n^{th}$ tier of FIG. 3). In some embodiments, the method 400 continues to operation 422 in which operations 404 to 420 are repeated. In some embodiments, subsequently to forming the strips on the first tier, one iteration of performing operations 404 to 420 may form at least one strip on a tier above the first tier (e.g., the $(n+1)^{th}$ tier of FIG. 3).

Operations 402 to 420 of the method 400 may be associated with top views of a semiconductor device 500 at various fabrication stages as shown in FIGS. 5A, 5B, 5C, 5D, 5E, 5F, 5G, 5H, 5I, and 5J, respectively, and corresponding cross-sectional views as shown in FIGS. 6A, 6B, 6C, 6D, 6E, 6F, 6G, 6H, 6I, and 6J. In some embodiments, the semiconductor device 500 may be an RRAM device substantially similar to the RRAM device 300 of FIG. 3. The RRAM device 500 may be included in a microprocessor, memory cell, and/or other integrated circuit (IC). Also, FIGS. 5A through 5J and 6A through 6J are simplified for a better understanding of the concepts of the present disclosure. For example, although the figures illustrate the RRAM device 500, it is understood the IC, in which the RRAM device 500 is formed, may include a number of other devices comprising resistors, capacitors, inductors, fuses, etc., which are not shown in FIGS. 5A through 5J and 6A through 6J, for purposes of clarity of illustration.

Figure 5A:
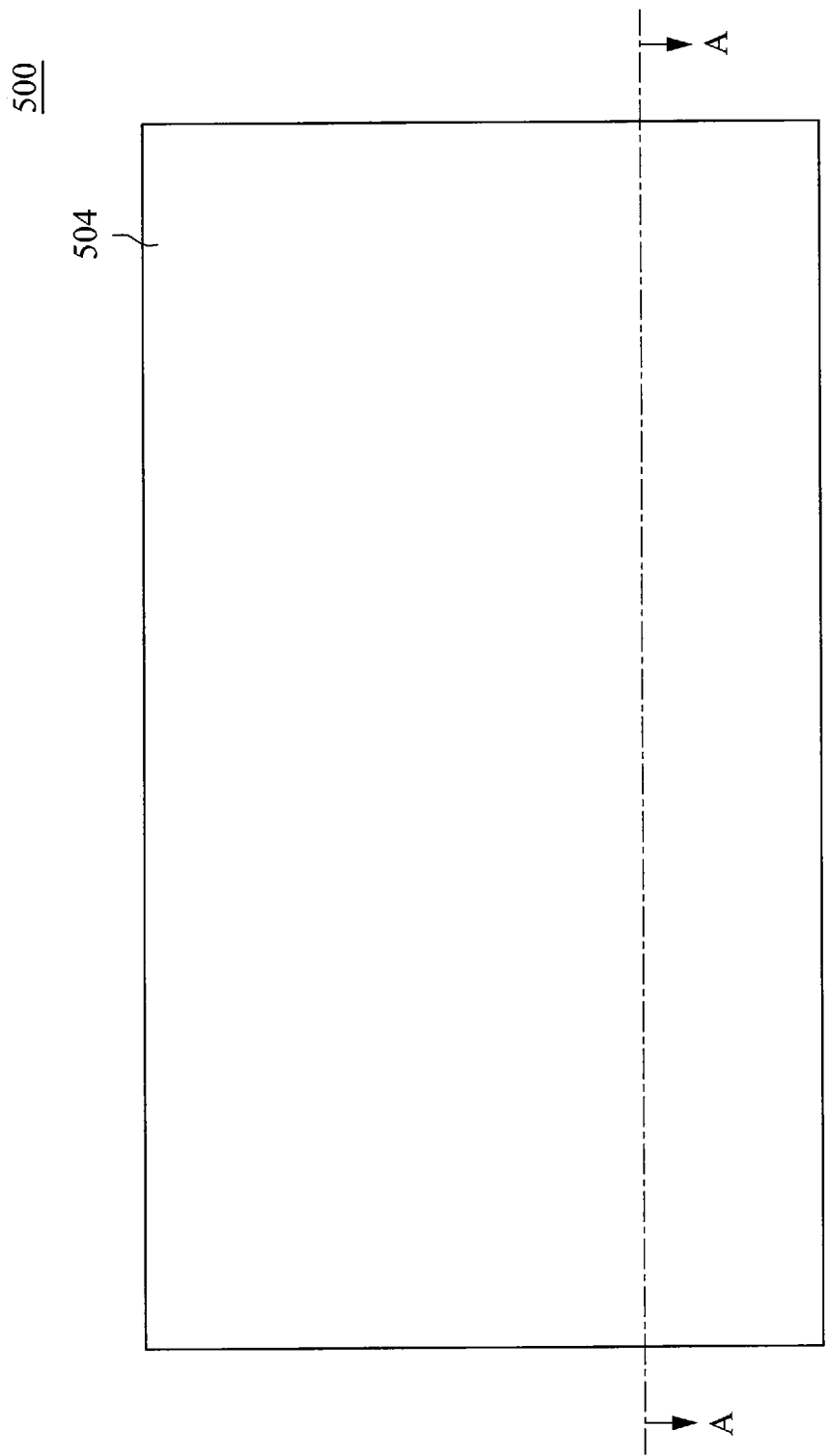
FIGS. 5A, 5B, 5C, 5D, 5E, 5F, 5G, 5H, 5I, and 5J illustrate respective top views of an exemplary semiconductor device during various fabrication stages, made by the method of FIGS. 4A-4B, in accordance with some embodiments.
Figure 6A:
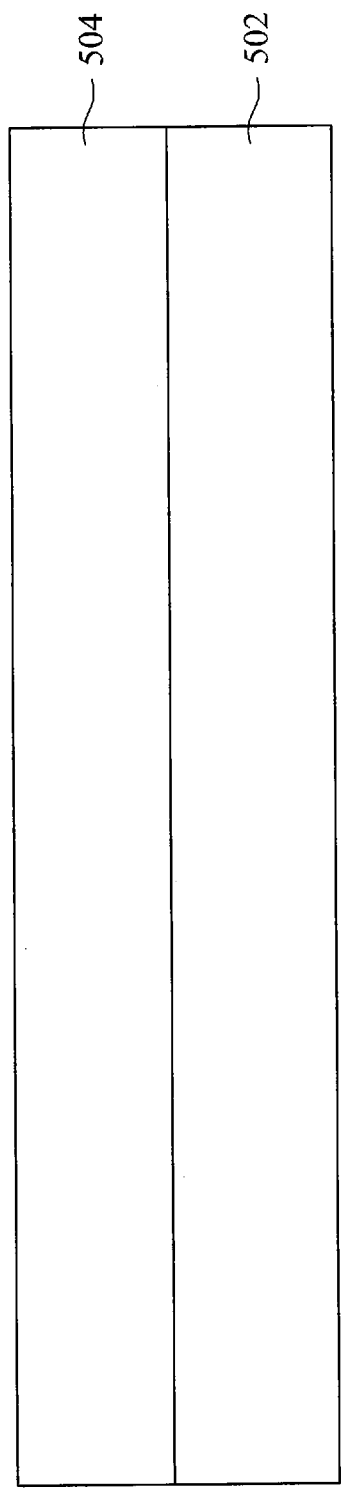
FIGS. 6A, 6B, 6C, 6D, 6E, 6F, 6G, 6H, 6I, 6J, 6K and 6L respectively illustrate corresponding cross-sectional views of FIGS. 5A, 5B, 5C, 5D, 5E, 5F, 5G, 5H, 5I, and 5J taken along line A-A, in accordance with some embodiments.

Corresponding to operation 402 of FIG. 4A, FIG. 5A is a top view of the RRAM device 500 including a substrate 502 overlaid by a dielectric layer 504, which is provided at one of the various stages of fabrication, according to some embodiments, and FIG. 6A is a corresponding cross-sectional view of FIG. 5A taken along line A-A. In some embodiments, the substrate 502 includes a semiconductor material substrate, for example, silicon. Alternatively, the substrate 502 may include other elementary semiconductor material such as, for example, germanium. The substrate 502 may also include a compound semiconductor such as silicon carbide, gallium arsenic, indium arsenide, and indium phosphide. The substrate 502 may include an alloy semiconductor such as silicon germanium, silicon germanium carbide, gallium arsenic phosphide, and gallium indium phosphide. In one embodiment, the substrate 502 includes an epitaxial layer. For example, the substrate may have an epitaxial layer overlying a bulk semiconductor. Furthermore, the substrate 502 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some other embodiments, the substrate 502 is a dielectric material substrate formed over various device features (e.g., a source, drain, or gate electrode of a transistor). Such a dielectric material substrate 502 may include at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In such an embodiment where the substrate 202 includes a dielectric material, the substrate 502 may include one or more conductive features. Typically, the substrate 502 may be referred to as an "initial inter-metal dielectric (IMD) layer" or an "initial tier."

In some embodiments, the dielectric layer 504 may be a thin film comprising silicon oxide formed, for example, using a thermal oxidation process. In some embodiments, the dielectric layer 504 may be overlaid by a hard mask layer (not shown) formed of silicon nitride, for example, using low-pressure chemical vapor deposition (LPCVD) or plasma enhanced chemical vapor deposition (PECVD). The hard mask layer is used as a hard mask during subsequent photolithography processes.

Figure 5B:
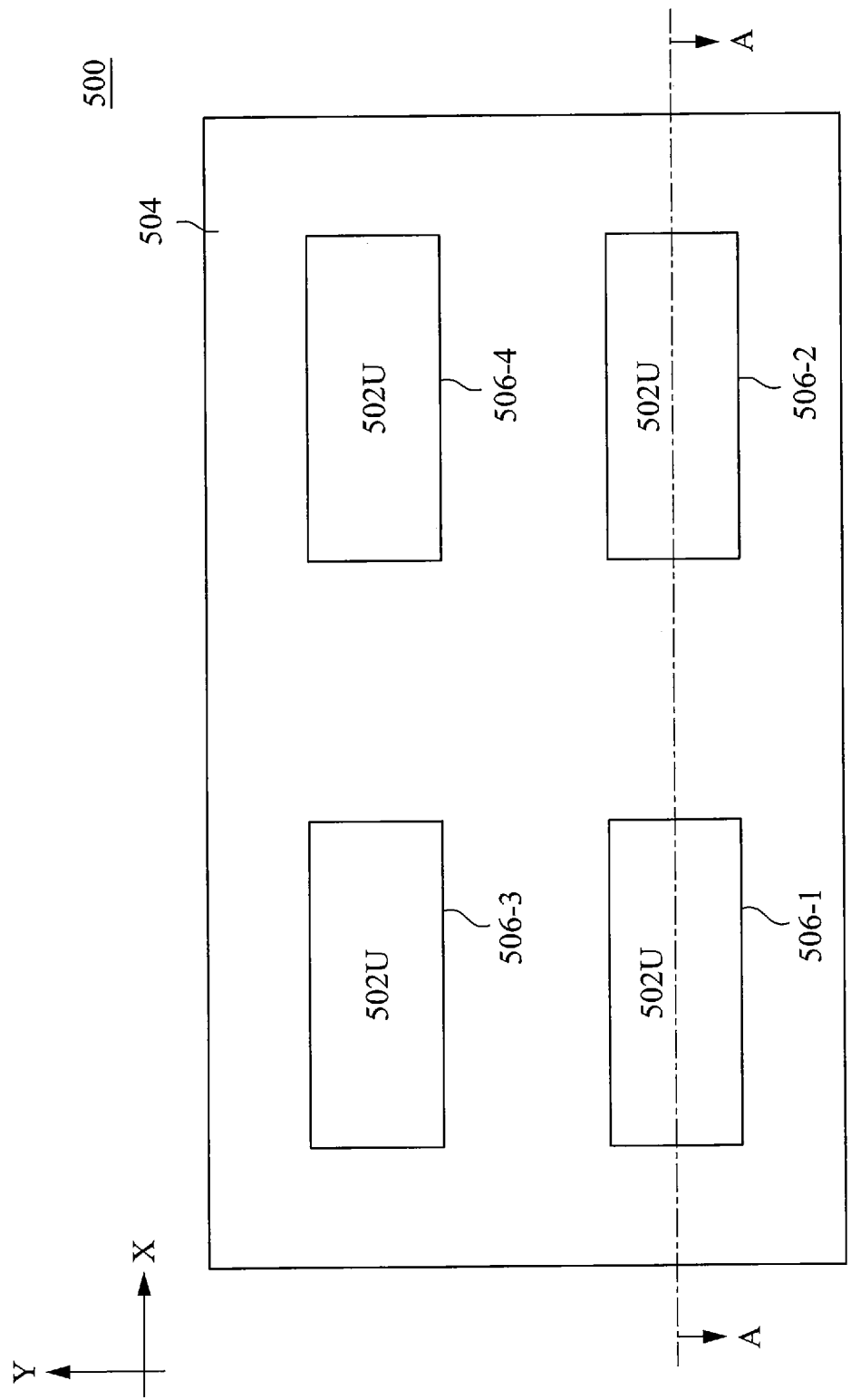
Figure 6B:
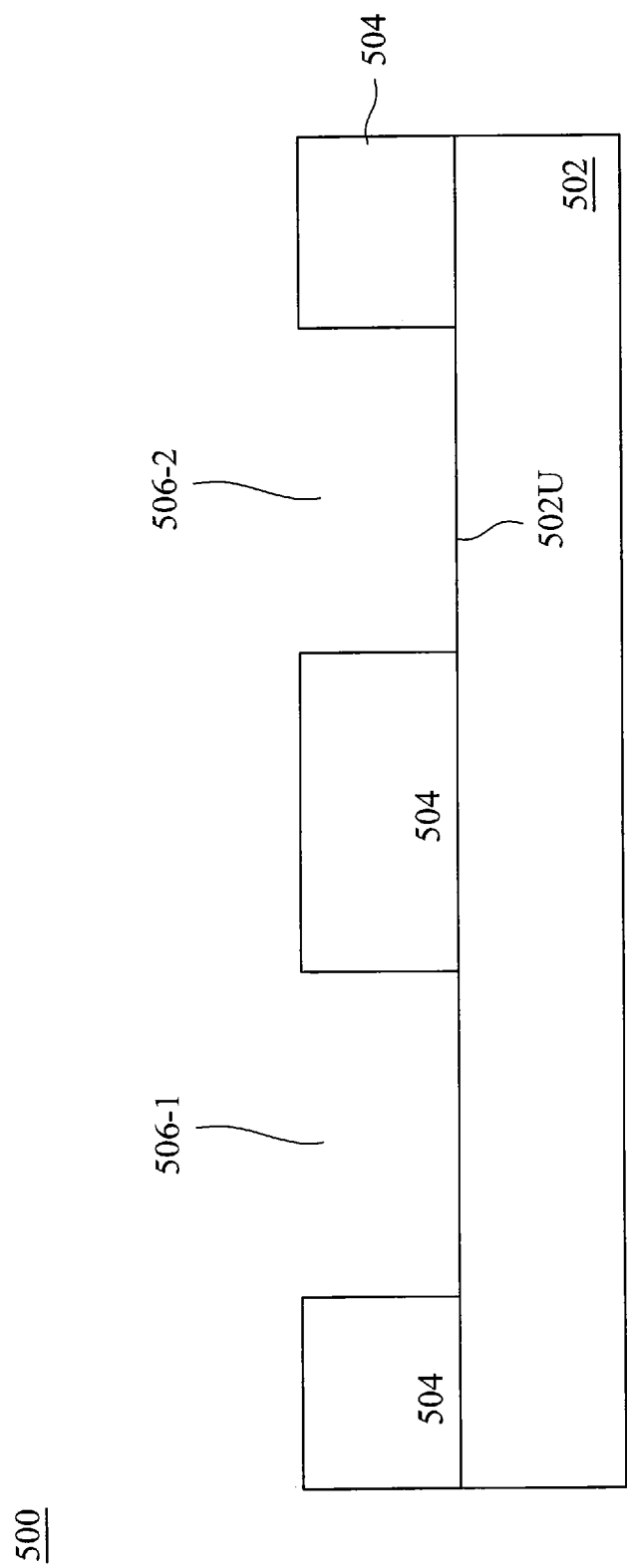

Corresponding to operation 404 of FIG. 4A, FIG. 5B is a top view of the RRAM device 500 including a plurality of first recessed regions 506-1, 506-2, 506-3, and 506-4, which are formed at one of the various stages of fabrication, according to some embodiments, and FIG. 6B is a corresponding cross-sectional view of FIG. 5B taken along line A-A. As shown in the cross-sectional view of FIG. 6B, the first recessed regions 506-1, 506-2, 506-3, and 506-4 each extends through the dielectric layer 504 to expose a respective portion of an upper boundary 502U of the substrate 502. Further, as shown in the top view of FIG. 5B, the first recessed regions 506-1, 506-2, 506-3, and 506-4 are laterally spaced apart from each other by a distance thereby causing a remaining portion of the dielectric layer 504 to form as a plurality of dummy patterns (similar as the dummy patterns 204-1 to 204-3 of FIGS. 2B-2F). According to some embodiments, such a plurality of first recessed regions 506-1, 506-2, 506-3, and 506-4 may be used to form RRAM resistors and WL's of the disclosed RRAM device 500, which will be discussed in detail below.

Although in the illustrated embodiment of FIG. 5B (and the following top-view figures), only four first recessed regions are shown, it is understood that any desired number of first recessed regions can be formed over the substrate 502 while remaining within the scope of the present disclosure. In some embodiments, when viewed from the top, the first recessed regions 506-1, 506-2, 506-3, and 506-4 may be formed as a two-dimensional array, wherein the first recessed regions 506-1 and 506-2 are arranged along a first row in parallel with the X axis (hereinafter "$1^{st}$ row"); the first recessed regions 506-3 and 506-4 are arranged along a second row in parallel with the X axis (hereinafter "$2^{nd}$ row"); the first recessed regions 506-1 and 506-3 are arranged along a first column in parallel with the Y axis (hereinafter "$1^{st}$ column"); and the first recessed regions 506-2 and 506-4 are arranged along a second column in parallel with the Y axis (hereinafter "$2^{nd}$ column").

Figure 5C:
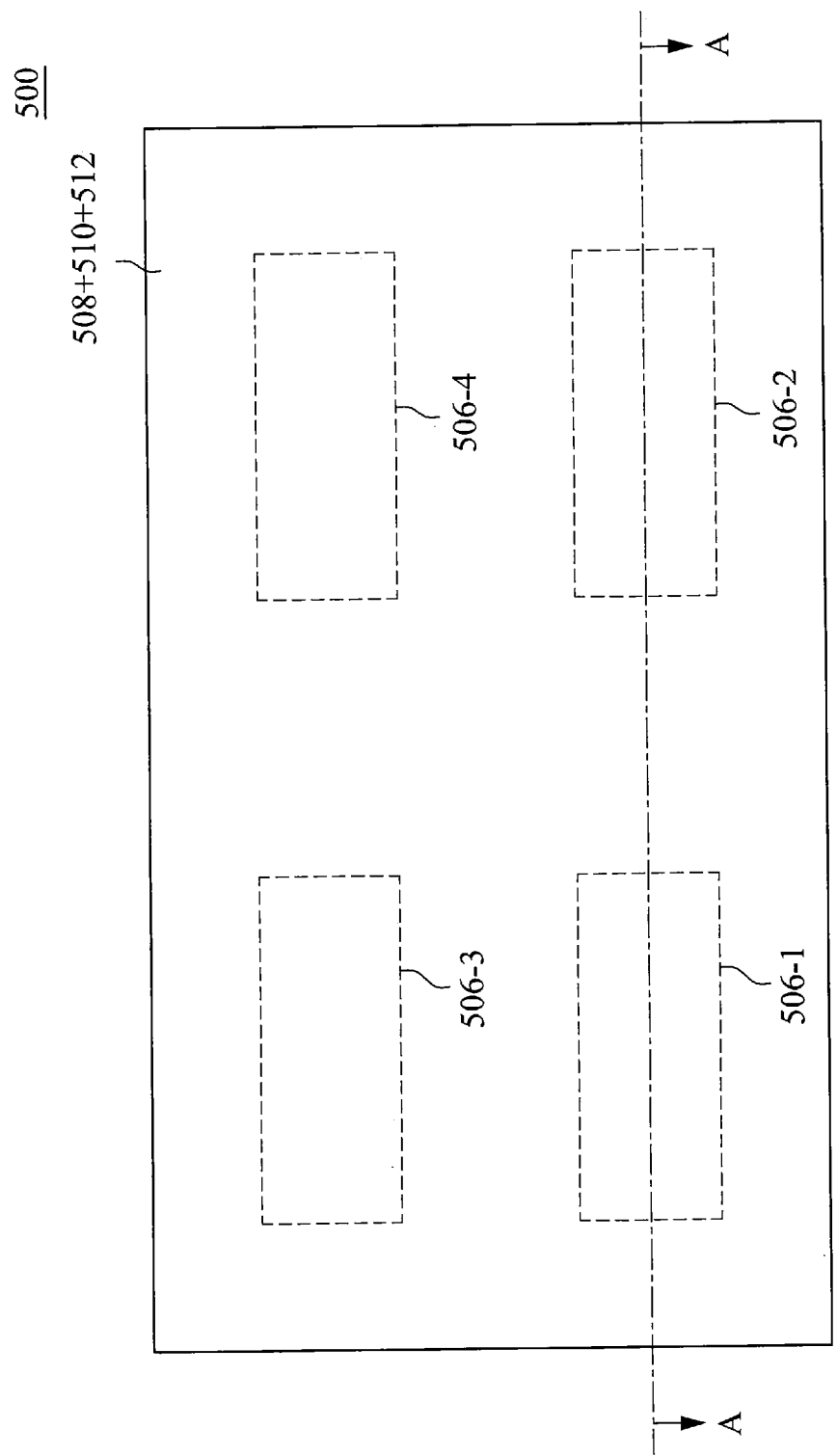
Figure 6C:
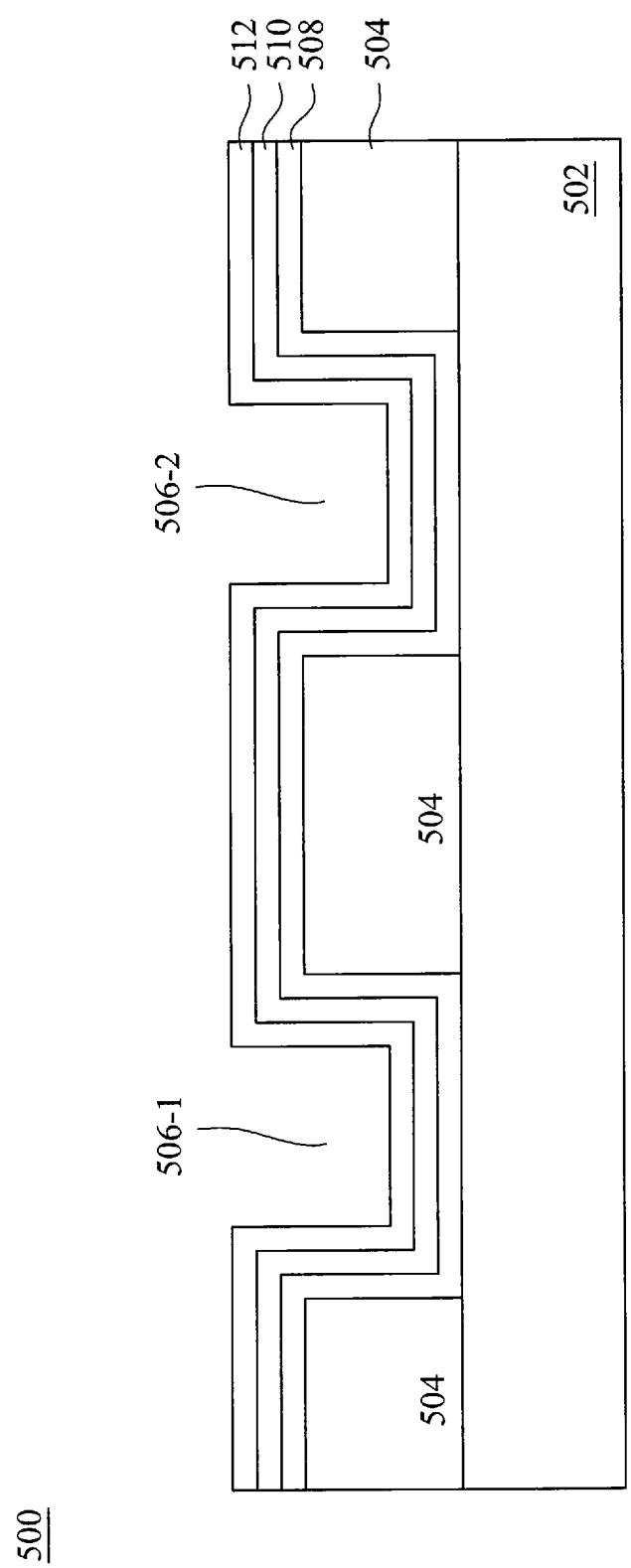

Corresponding to operation 406 of FIG. 4A, FIG. 5C is a top view of the RRAM device 500 in which a first capping material 508, a variable resistive material 510, and a second capping material 512 respectively overlay the first recessed regions 506-1 to 506-4 (shown in dotted lines) at one of the various stages of fabrication, according to some embodiments, and FIG. 6C is a corresponding cross-sectional view of FIG. 5C taken along line A-A. As shown in the cross-sectional view of FIG. 6C, the first capping material 508 overlays the first recessed regions 506-1 and 506-2 (and 506-3 and 506-4, which are not shown in FIG. 6C), the variable resistive material 510 further overlays the first capping material 508, and the second capping material 512 further overlays the variable resistive material 510. Since each of the first capping material 508, variable resistive material 510, and second capping material 512 is formed as a substantially thin and conformal layer (e.g., about 20~100 angstroms in thickness), after the formation of the first capping material 508, variable resistive material 510, and second capping material 512 over the first recessed regions 506-1 to 506-4, respective U-shaped profiles of the first recessed regions 506-1 to 506-4 may be still present by the second capping material 512.

In some embodiments, the first capping material 508 may include a material selected from a group consisting of: gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or silicide of these, such as TaN, TiN, TiAlN, TiW, or a combination thereof. Although the first capping material 508 is shown as a single layer in the illustrated embodiment of FIG. 6C (and the following figures), it is noted that the first capping material 508 may include plural layers formed as a stack, wherein each of the plural layers is formed of one of the above-described materials, e.g., TaN, TiN, etc. In some embodiments, the first capping material 508 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the substrate 502 and the first recessed regions 506-1 to 506-4.

In some embodiments, the variable resistive material 510 has a resistance conversion characteristic (e.g. variable resistance). In other words, the variable resistive material 510 includes material characterized to show reversible resistance variance in accordance with a polarity and/or an amplitude of an applied electrical pulse. The variable resistive material 510 includes a dielectric layer. The variable resistive material 510 may be changed into a conductor or an insulator based on polarity and/or magnitude of electrical signal.

In one embodiment, the variable resistive material 510 may include a transition metal oxide. The transition metal oxide maybe denoted as $M_xO_y$ where M is a transition metal, O is oxygen, x is the transition metal composition, and y is the oxygen composition. In an embodiment, the variable resistive material 510 includes $ZrO_2$. Examples of other materials suitable for the variable resistive material 510 include: NiO, $TiO_2$, HfO, ZrO, ZnO, $WO_3$, CoO, $Nb_2O_5$, $Fe_2O_3$, CuO, $CrO_2$, $SrZrO_3$ (Nb-doped), and/or other materials known in the art. In another embodiment, the variable resistive material 510 may include a colossal magnetoresistance (CMR)-based material such as, for example, $Pr_{0.7}Ca_{0.3}$, $MnO_3$, etc.

In yet another embodiment, the variable resistive material 510 may include a polymer material such as, for example, polyvinylidene fluoride and poly[(vinylidenefluoride-co-trifluoroethylene] (P (VDF/TrFE)). In yet another embodiment, the variable resistive material 510 may include a conductive-bridging random access memory (CBRAM) material such as, for example, Ag in GeSe. According to some embodiments, the variable resistive material 510 may include multiple layers having characteristics of a resistance conversion material. A set voltage and/or a reset voltage of the variable resistive material 510 may be determined by the variable resistive material 510's compositions (including the values of "x" and "y"), thickness, and/or other factors known in the art.

In some embodiments, the variable resistive material 510 may be formed by an atomic layer deposition (ALD) technique with a precursor containing a metal and oxygen over the first capping material 508. In some embodiments, other chemical vapor deposition (CVD) techniques may be used. In some embodiments, the variable resistive material 510 may be formed by a physical vapor deposition (PVD) technique, such as a sputtering process with a metallic target and with a gas supply of oxygen and optionally nitrogen to the PVD chamber. In some embodiments, the variable resistive material 510 may be formed by an electron-beam deposition technique.

In some embodiments, the second capping material 512 may include a substantially similar material of the first capping material 508. Thus, the second capping material 512 may include a material selected from a group consisting of: gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta), indium-tin oxide (ITO), or any alloy, oxide, nitride, fluoride, carbide, boride or silicide of these, such as TaN, TiN, TiAlN, TiW, or a combination thereof. Although the second capping material 512 is shown as a single layer in the illustrated embodiment of FIG. 6C (and the following figures), it is noted that the second capping material 512 may include plural layers formed as a stack, wherein each of the plural layers is formed of one of the above-described materials, e.g., TaN, TiN, etc. In some embodiments, the second capping material 512 is formed by using chemical vapor deposition (CVD), plasma enhanced (PE) CVD, high-density plasma (HDP) CVD, inductively-coupled-plasma (ICP) CVD, physical vapor deposition (PVD), spin-on coating, and/or other suitable techniques to deposit the at least one of the above-described material over the variable resistive material 510.

Figure 5D:
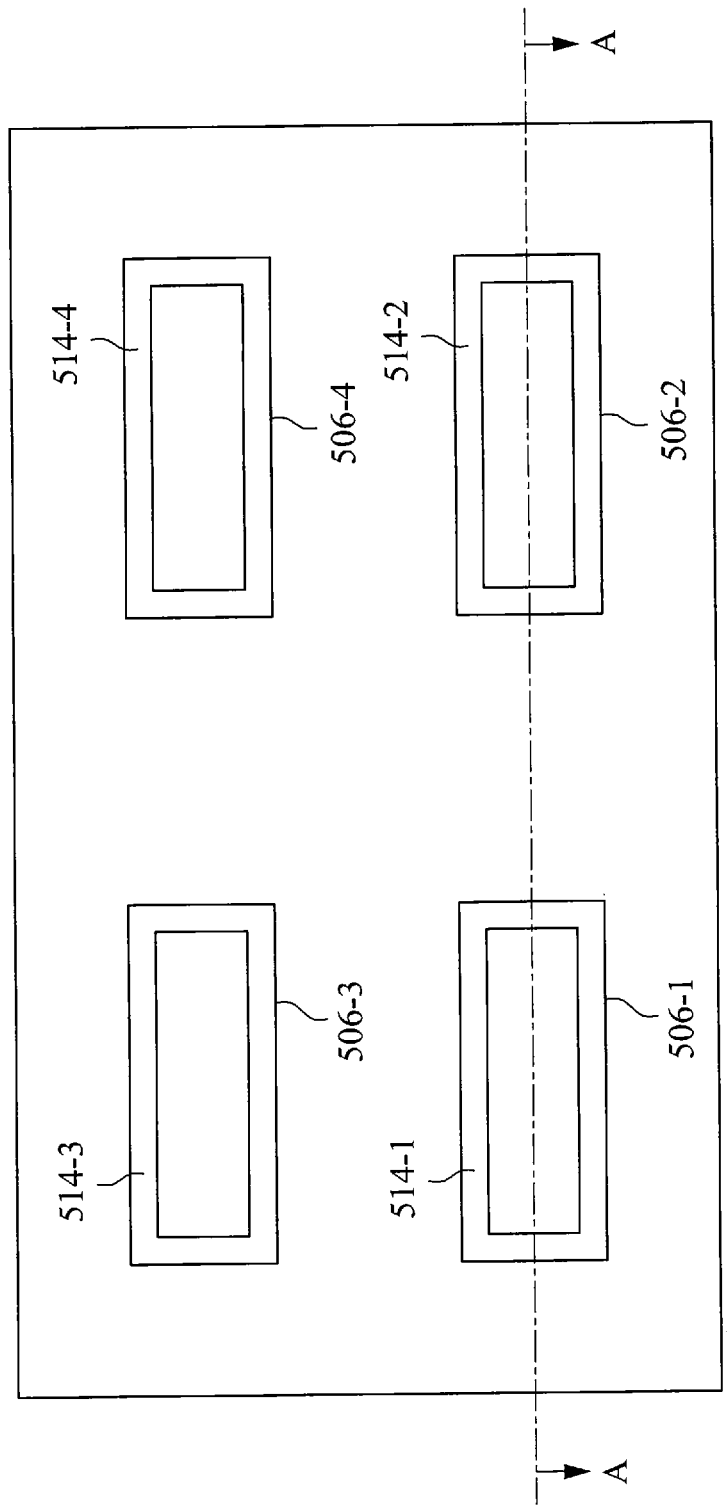
Figure 6D:
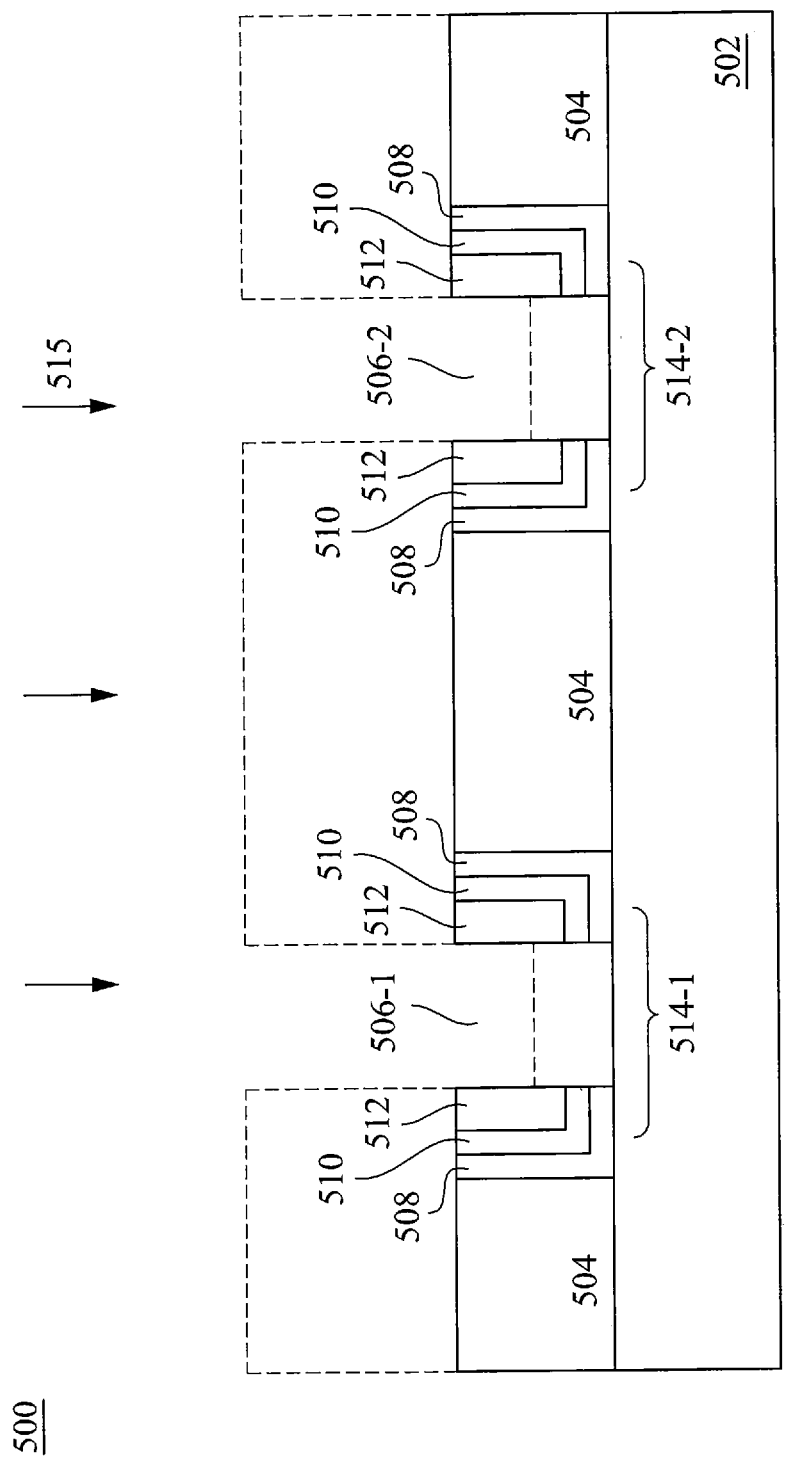

Corresponding to operation 408 of FIG. 4A, FIG. 5D is a top view of the RRAM device 500 including a plurality of stacked resistor films 514-1, 514-2, 514-3, and 514-4, which are formed at one of the various stages of fabrication, according to some embodiments, and FIG. 6D is a corresponding cross-sectional view of FIG. 5D taken along line A-A. In some embodiments, referring to the cross-sectional view of FIG. 6D, the stacked resistor films 514-1 to 514-4 are formed by performing at least one anisotropic etching process 515 (e.g., a reactive ion etching (RIE) process) on the first capping material 508, variable resistive material 510, and second capping material 512. Accordingly, respective portions of the first capping material 508, variable resistive material 510, and second capping material 512 that were disposed above an upper boundary of the dielectric layer 504, and partial portions of the first capping material 508, variable resistive material 510, and second capping material 512 that were disposed above the upper boundary 502U of the substrate 502 are removed. For purposes of clarity, such removed portions of the first capping material 508, variable resistive material 510, and second capping material 512 are outlined in dotted lines in FIG. 6D. As such, each of the stacked resistor films 514-1 to 514-4 that extends along four sidewalls of a respective first recessed region (e.g., 506-1, 506-2, 506-3, or 506-4) is formed by respective remaining portions of the first capping material 508, variable resistive material 510, and second capping material 512, in accordance with some embodiments.

More specifically, as shown in the top view of FIG. 5D where the respective first capping material 508, variable resistive material 510, and second capping material 512 of each of the stacked resistor films 514-1 to 514-4 are not shown, the stacked resistor film 514-1 extends along four sidewalls of the first recessed region 506-1; the stacked resistor film 514-2 extends along four sidewalls of the first recessed region 506-2; the stacked resistor film 514-3 extends along four sidewalls of the first recessed region 506-3; and the stacked resistor film 514-4 extends along four sidewalls of the first recessed region 506-4. Further, after the formation of the stacked resistor films 514-1 to 514-6, part of the first recessed regions 506-1 to 506-4 (i.e., part of the upper boundary 502U) may be re-exposed, in accordance with some embodiments. Such re-exposed portions of the first recessed regions 506-1 to 506-4 may be used to form a plurality of WL's, which will be discussed below.

More specifically, as shown in the cross-sectional view of FIG. 6D where the respective remaining portions of the first capping material 508, variable resistive material 510, and second capping material 512 that form each of the stacked resistor films 514-1 to 514-2 are shown, similar as the remaining first capping material 208 and remaining variable resistive material 210 shown in FIG. 2D, the respective remaining portions of the first capping material 508 and variable resistive material 510 of the stacked resistor films 514-1 and 514-2 also present the above-described L-shaped profiles, which is not discussed again.

Figure 6E:
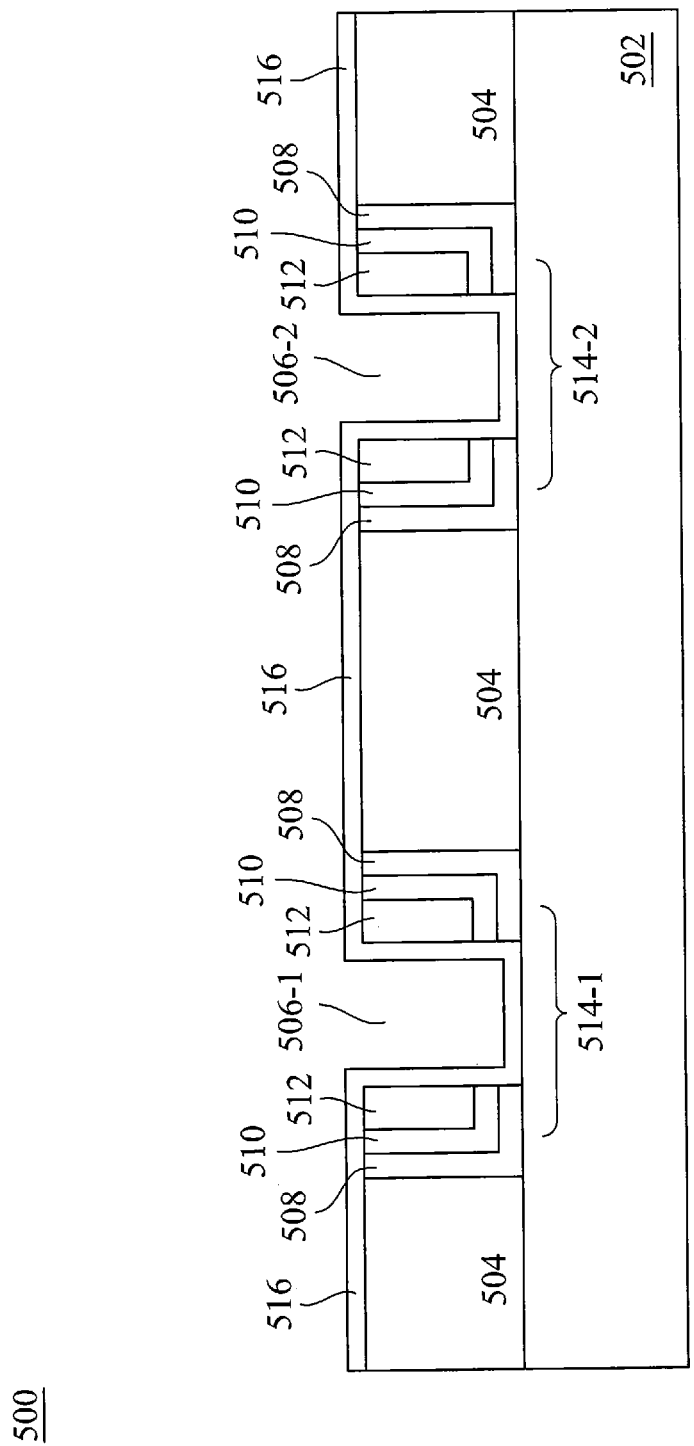
Figure 6F:
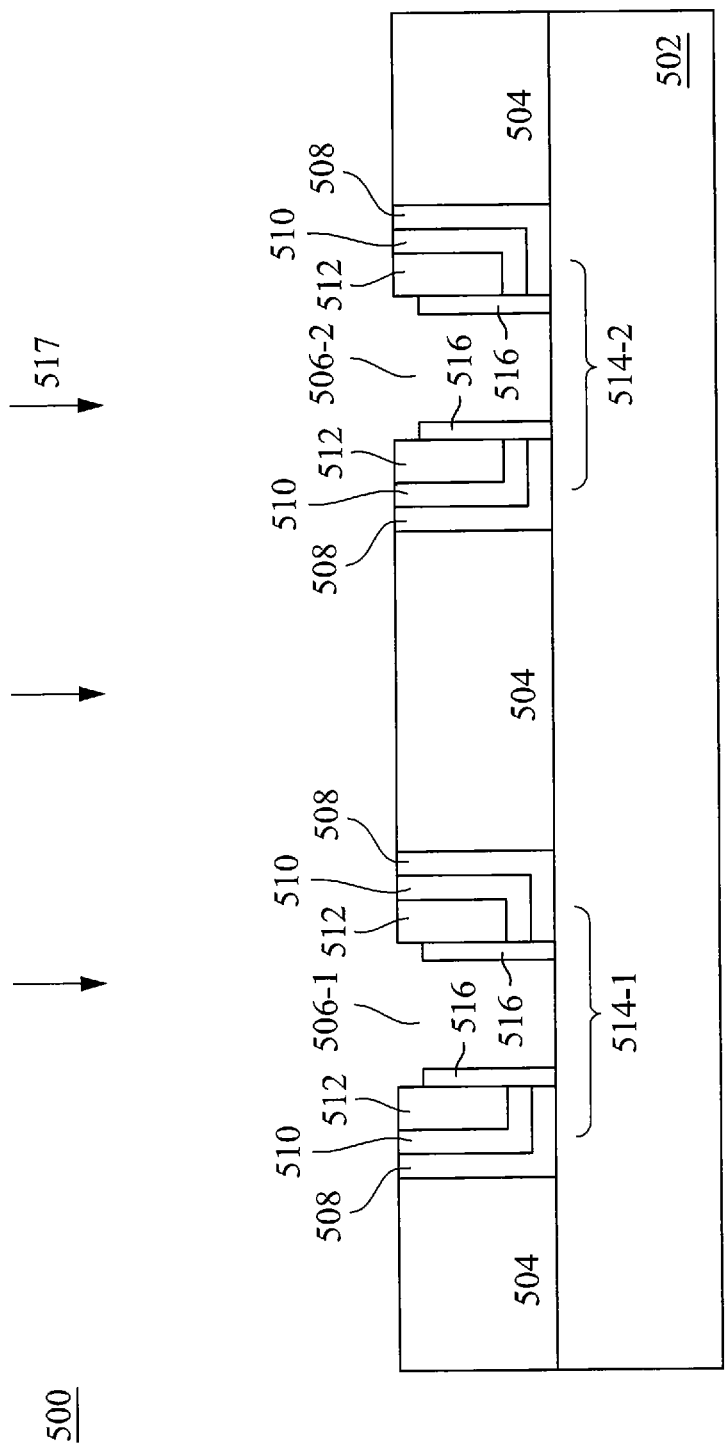

FIG. 6E shows an insulation layer 516 formed over the substrate 502, the dielectric layer 504, and the stacked resistor films 514-1 to 514-2. In some embodiments, the insulation layer 516 may be a thin film including an oxide material. The insulation layer 516 may be formed by using CVD, PVD, E-gun, and/or other suitable techniques to deposit the oxide material. FIG. 6F shows a plurality of insulating segments 516 formed by performing at least one anisotropic etching process 517 (e.g., a reactive ion etching (RIE) process) on the insulation layer 516, to expose: bottom portions of the recessed regions 506-1, 506-2, upper surfaces of the dielectric layer 504, and top portions of the inner electrodes 512 including the second capping material. As such, each of the insulating segments 516 that extends along a sidewall of a respective stacked resistor films (514-1, 514-2) is formed by respective remaining portions of the insulation layer 516, and can insulate the inner electrode 512 from the outer electrode 508.

Figure 5E:
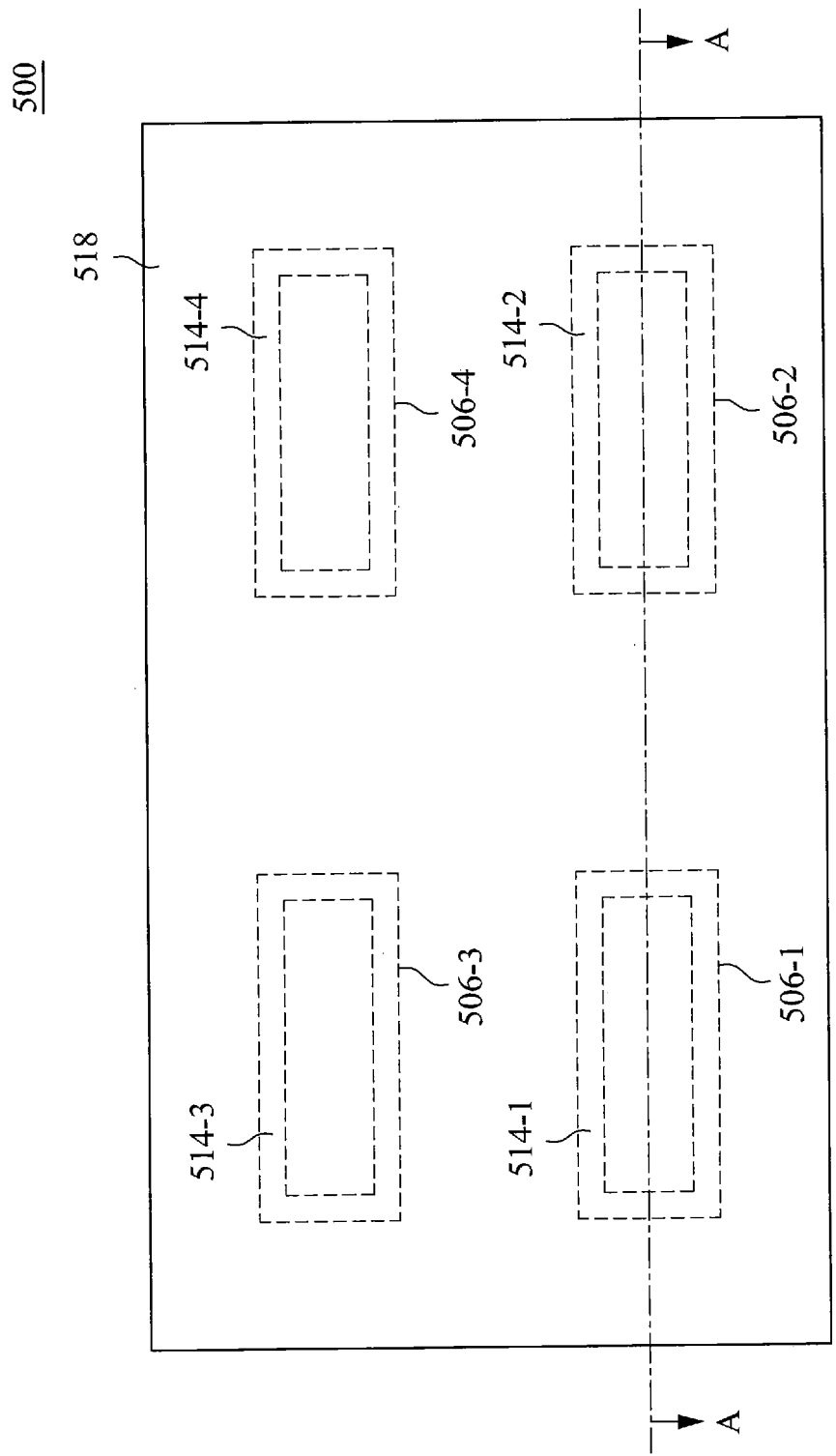
Figure 6G:
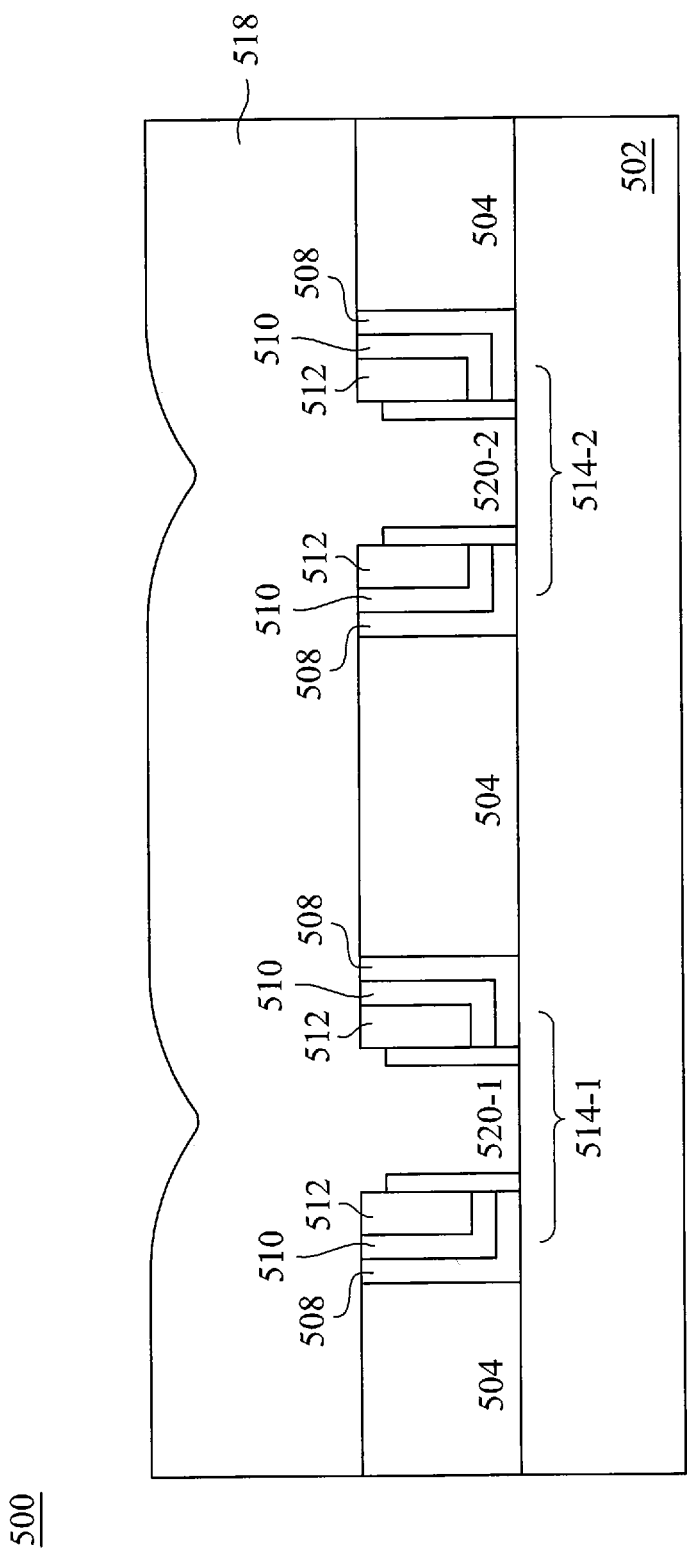

Corresponding to operation 410 of FIG. 4A, FIG. 5E is a top view of the RRAM device 500 in which a WL metal material 518 is formed over the first recessed regions 506-1 to 506-4 and the stacked resistor films 514-1 to 514-4 (shown in dotted lines) at one of the various stages of fabrication, according to some embodiments, and FIG. 6G is a corresponding cross-sectional view of FIG. 5E taken along line A-A. As shown in the cross-sectional view of FIG. 6G, the WL metal material 518 is formed over the substrate 502, the dielectric layer 504, the insulating segments 516 and the stacked resistor films 514-1 to 514-2, with a thickness relatively greater than a height of the dielectric layer 504, such that the re-exposed portions of the first recessed regions 506-1 and 506-2 (also 506-3 and 506-4, which are not shown) can be fully filled. In some embodiments, the WL metal material 518 includes a conductive material such as, for example, copper (Cu), aluminum (Al), tungsten (W), etc. The WL metal material 518 may be formed by using CVD, PVD, E-gun, and/or other suitable techniques to deposit the above-described conductive material over the dielectric layer 504.

Figure 5F:
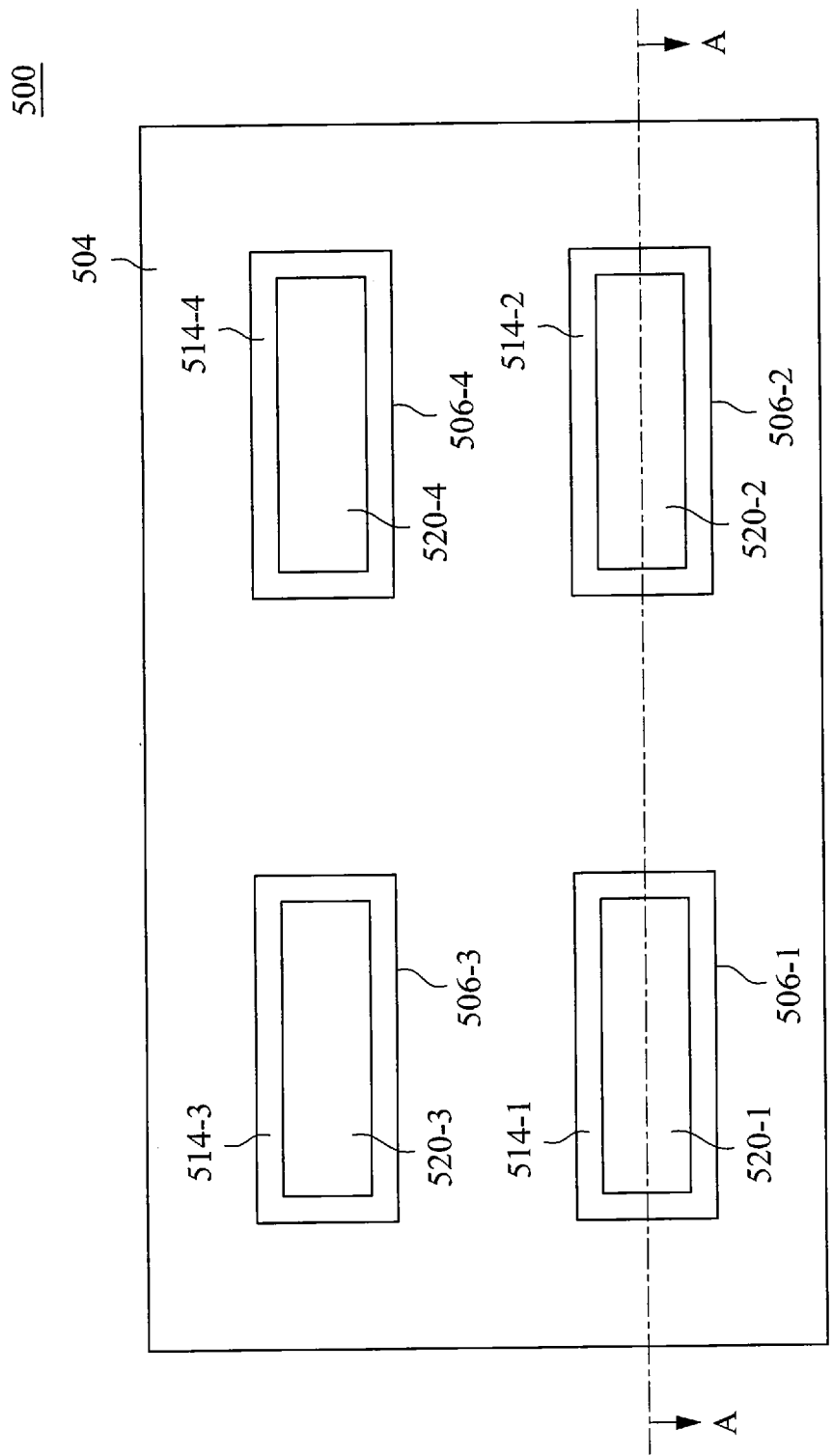
Figure 6H:
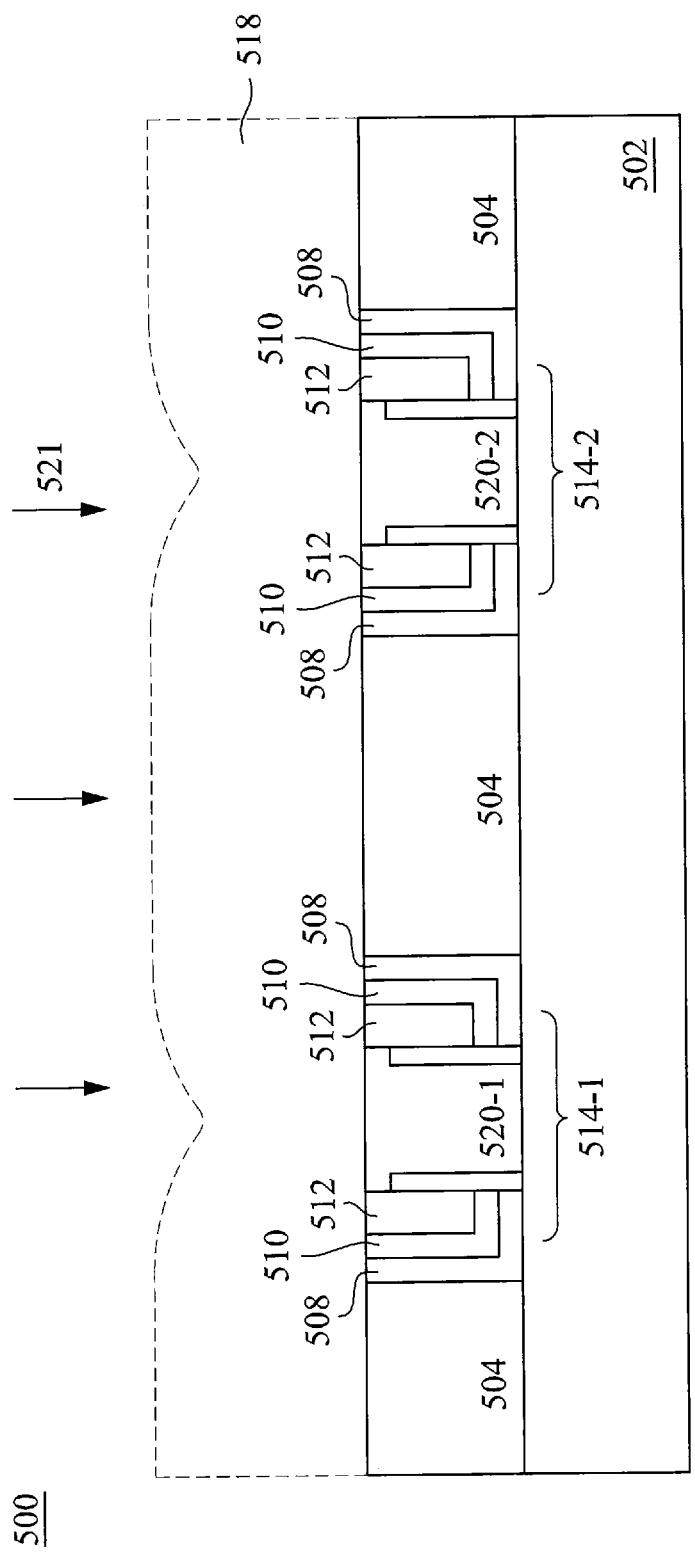

Corresponding to operation 412 of FIG. 4A, FIG. 5F is a top view of the RRAM device 500 in which a plurality of WL's 520-1, 520-2, 520-3, and 520-4 are formed at one of the various stages of fabrication, according to some embodiments, and FIG. 6H is a corresponding cross-sectional view of FIG. 5F taken along line A-A. In some embodiments, referring to FIG. 6H, the plurality of WL's 520-1, 520-2, 520-3, and 520-4 are formed by performing a polishing process 521 (e.g., a chemical-mechanical polishing (CMP) process) on the WL metal material 518 until a coplanar boundary, shared by the dielectric layer 504, the stacked resistor films 514-1 and 514-2 (and the non-shown 514-3 and 514-4), and the WL's 520-1 and 520-2 (and the non-shown 520-3 and 520-4), is formed.

In some embodiments, the remaining portions of WL metal material 518 may form the WL's, 220-1, 220-2, 220-3, and 220-4, each of which is disposed within a corresponding first recessed region and surrounded by a corresponding stacked resistor film. For example, as illustrated in the top view of FIG. 5F where the respective first capping material 508, variable resistive material 510, and second capping material 512 of each of the stacked resistor films 514-1 to 514-4 are not shown, the WL 220-1 is disposed within the first recessed region 506-1 and surrounded by the stacked resistor film 514-1; the WL 220-2 is disposed within the first recessed region 506-2 and surrounded by the stacked resistor film 514-2; the WL 220-3 is disposed within the first recessed region 506-3 and surrounded by the stacked resistor film 514-3; and the WL 220-4 is disposed within the first recessed region 506-4 and surrounded by the stacked resistor film 514-4.

Figure 5G:
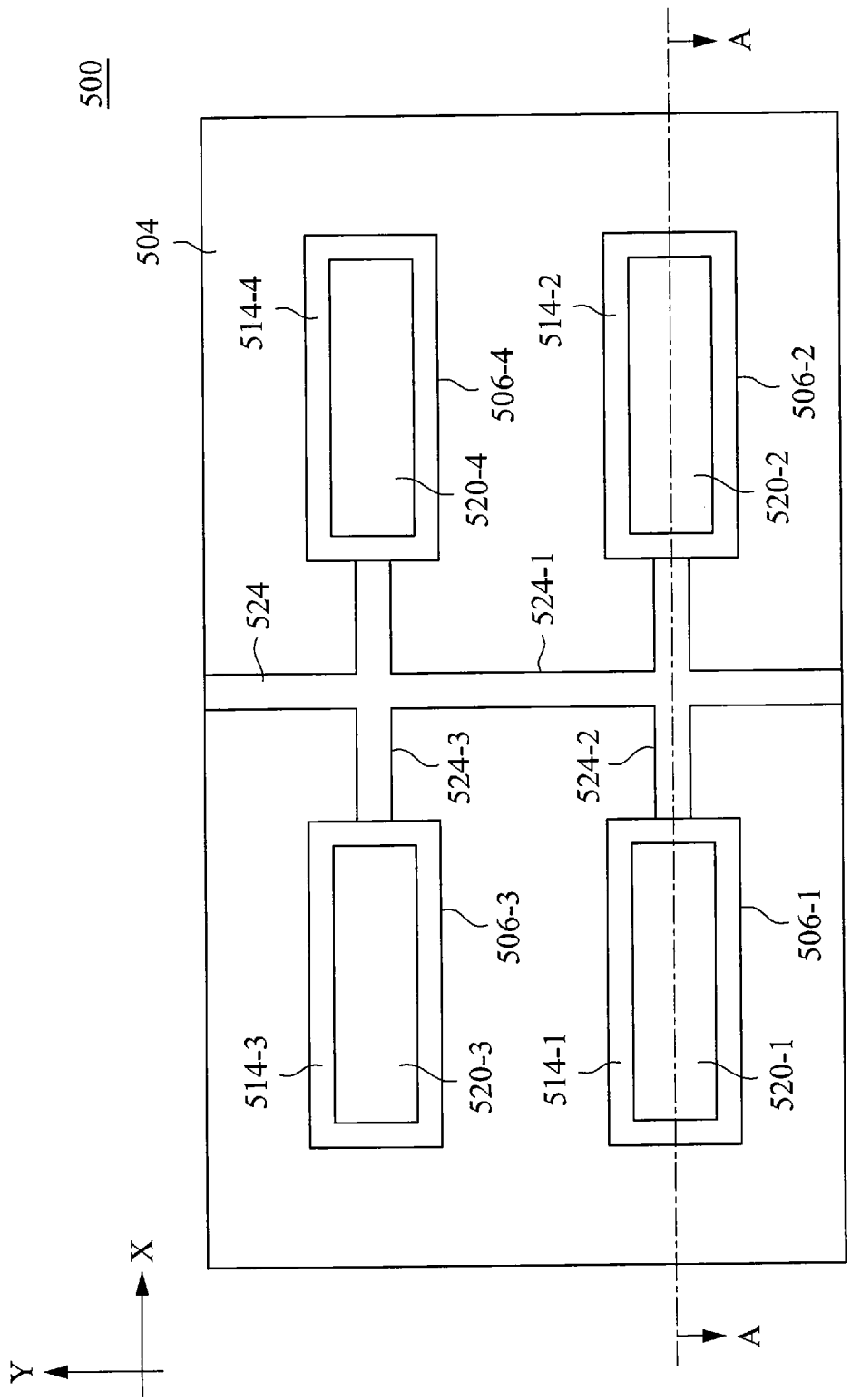
Figure 6I:
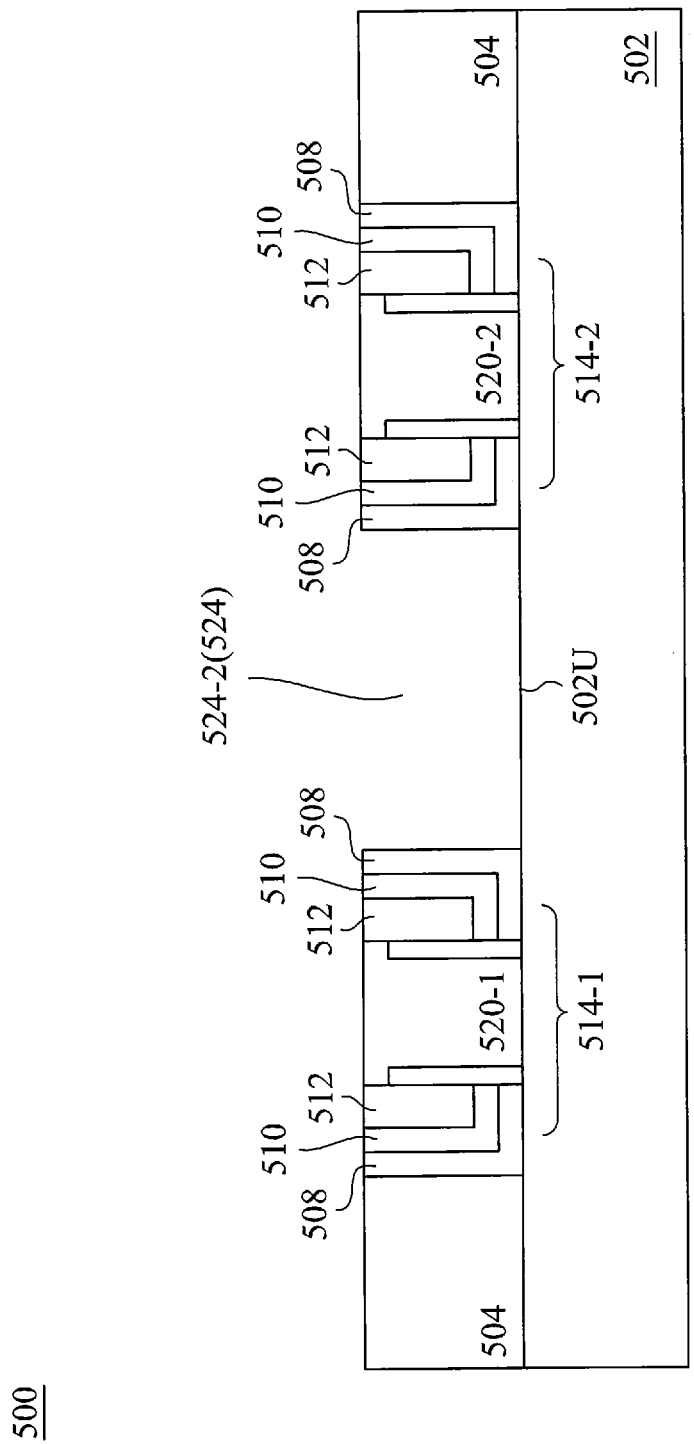

Corresponding to operation 414 of FIG. 4B, FIG. 5G is a cross-sectional view of the RRAM device 500 including a second recessed region 524, which is formed at one of the various stages of fabrication, according to some embodiments, and FIG. 6I is a corresponding cross-sectional view of FIG. 5G take along line A-A. As shown in the top view of FIG. 5G and the cross-sectional view of FIG. 6I, respectively, the second recessed region 524 is formed between two adjacent first recessed regions across plural rows (e.g., between the first recessed regions 506-1 and 506-2, between the first recessed regions 506-3 and 506-4, etc.), and extends through the dielectric layer 504.

Further, as shown in FIG. 5G, the second recessed region 524 includes one vertical portion 524-1 extending in parallel with the Y axis and plural horizontal portions 524-2 and 524-3 extending in parallel with the X axis, in accordance with some embodiments. The vertical portion 524-1 is disposed between two adjacent columns, for example, the $1^{st}$ column formed by the first recessed regions 506-1 and 506-3 and the $2^{nd}$ column formed by the first recessed regions 506-2 and 506-4. The horizontal portions 524-2 and 524-3 each traverses the vertical portions 524-1 and couples respective stacked resistor films formed in the first recessed regions that are aligned along particular column and row. For example, the horizontal portion 524-2, traversing the vertical portion 524-1, couples the stacked resistor films 514-1 and 514-2 that are disposed in the first recessed region 506-1 at the $1^{st}$ column and $1^{st}$ row and the first recessed region 506-2 at the $2^{nd}$ column and $1^{st}$ row, respectively; and the horizontal portion 524-3, traversing the vertical portion 524-1, couples the stacked resistor films 514-3 and 514-4 that are disposed in the first recessed region 506-3 at the $1^{st}$ column and $2^{nd}$ row and the first recessed region 506-4 at the $2^{nd}$ column and $2^{nd}$ row, respectively.

More specifically, after the formation of the second recessed region 524, in addition to exposing a portion of the upper boundary 502U of the substrate 502, at least portions of the respective sidewalls of the stacked resistor films 514-1 to 514-4 that are in communication with the horizontal portions 524-2 and 524-3 are exposed. For example, as illustrated in the cross-sectional view of FIG. 6I, a portion of the sidewall of the stacked resistor film 514-1 that is in communication with the horizontal portion 524-2 is exposed, and a portion of the sidewall of the stacked resistor film 514-2 that is in communication with the horizontal portion 524-2 is exposed. As such, when view cross-sectionally, the horizontal portions 524-2 and 524-3 each presents a U-shaped profile.

In some embodiments, the second recessed region 524 may be formed by performing at least some of the following steps: forming a patterned layer (e.g., a patterned photoresist layer) that include an opening align with an area where the second recessed region 524 is intended to be formed over the dielectric layer 504; performing at least one dry or wet etching process on the dielectric layer 504 while using the patterned layer as a mask; and removing the patterned layer.

Figure 5H:
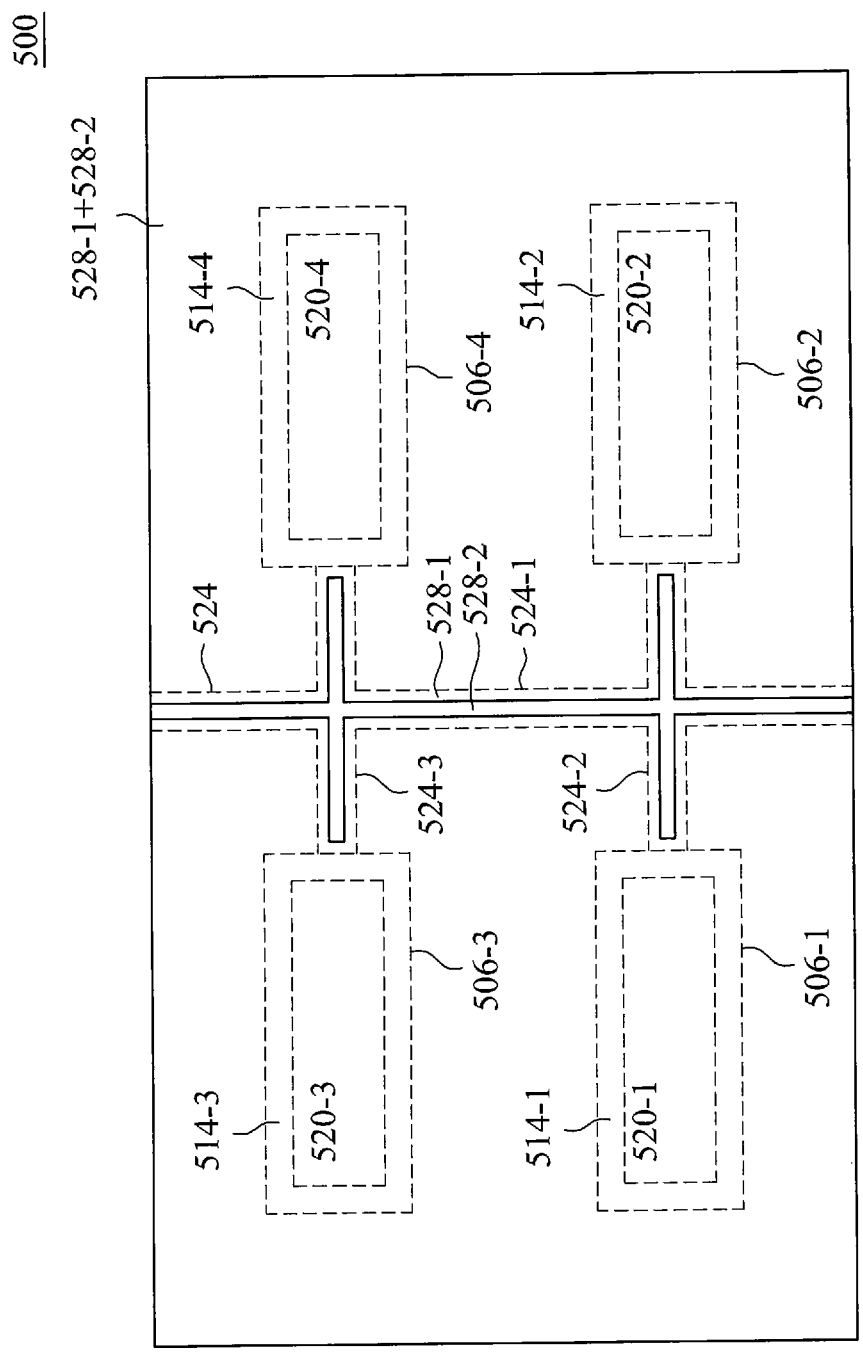
Figure 6J:
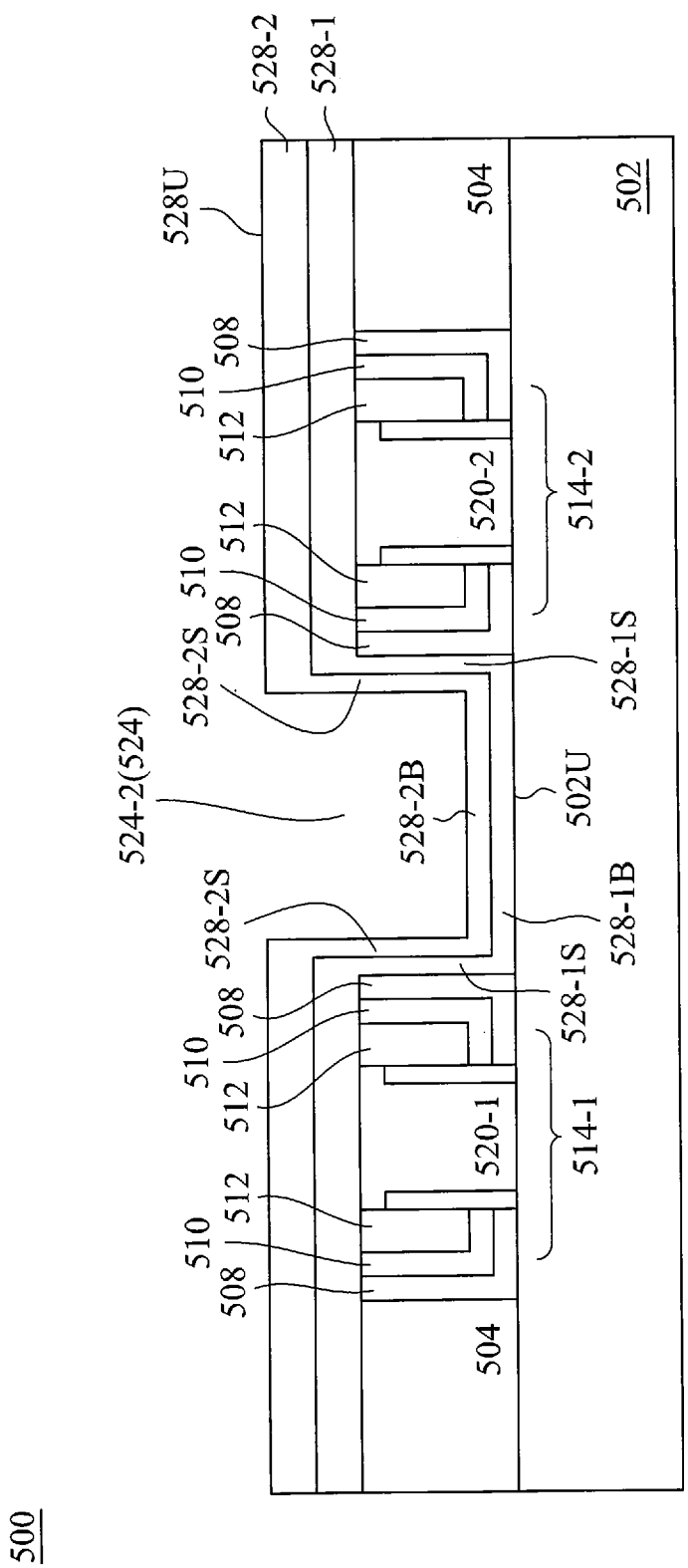

Corresponding to operation 416 of FIG. 4B, FIG. 5H is a top view of the RRAM device 500 in which a first selector material 528-1 and a second selector material 528-2 are formed over the stacked resistor films 514-1 to 514-4, the WL's 520-1 to 520-4, and the second recessed region 524 (shown in dotted lines) at one of the various stages of fabrication, according to some embodiments, and FIG. 6J is a corresponding cross-sectional view of FIG. 5H taken along line A-A. As shown in the cross-sectional view of FIG. 6J, the first and second selector materials 528-1 and 528-2 are each formed to follow the U-shaped profile of the horizontal portion 524-2 of the second recessed region 524, and since the first and second selector materials 528-1 and 528-2 are each formed as a substantially thin and conformal layer (about 20~100 angstroms in the thickness), the U-shaped profile may still remain along a portion of an upper boundary 528U of the second selector material 528-2 that is located between two adjacent first recessed regions 506-1 and 506-2 (i.e., the $1^{st}$ row). Although not shown in FIG. 6J, it is understood that a similar U-shaped profile may also be present by another portion of the upper boundary 528U of the second selector material 528-2 that is located between two adjacent first recessed regions 506-3 and 506-4 (i.e., the $2^{nd}$ row).

In some embodiments, each of the selector materials 528-1 and 528-2 includes at least one of: an intrinsic semiconductor material (e.g., i-Si (silicon)), a lightly or heavily p-type doped semiconductor material (e.g., p⁻-Si or p⁺-Si), a lightly or heavily n-type doped semiconductor material (e.g., n⁻-Si or n⁺-Si), an insulator material (e.g., $HfO_2$, $Al_2O_3$, $TiO_2$, $Ti_2O_5$, etc.), a metal material (e.g., Ni, Ti, TiN, etc.). In an example, the first selector material 528-1 may be formed as an n-type doped Si layer; and the second selector material 528-2 may be formed as a p-type Si layer, causing a p-n diode (e.g., a unipolar selector device) to couple to each of the stacked resistor films 514-1 to 514-6 in series, which will be discussed in further detail below.

In some other embodiments, one or more additional selector materials, each of which includes an intrinsic semiconductor material, a lightly or heavily p-type doped semiconductor material, a lightly or heavily n-type doped semiconductor material, an insulator material, or a metal material, may be formed over the first and second selector materials 528-1 and 528-2. In an example, a third selector material (not shown) may be formed over the first and second selector materials 528-1 and 528-2, wherein the first selector material 528-1 includes a metal material (e.g., Ni), the second selector material 528-2 includes an insulator material (e.g., $TiO_2$), and the non-shown third selector material includes a similar metal material as the first selector material 528-1. As such, these three selector materials may form a metal-insulator-metal (MIM) tunnel diode (e.g., a bipolar selector device). In another example, the first selector material 528-1 includes a heavily doped n-type, or p-type, Si, the second selector material 528-2 includes a lightly doped p-type, or n-type, Si, and the non-shown third selector material includes a heavily doped n-type, or p-type, Si (similar as the first selector material 528-1). As such, these three selector materials may form a punch-through diode (e.g., a bipolar selector device).

More specifically, in some embodiments, between two adjacent stacked resistor films (e.g., 514-1 and 514-2), each of the first and second selector materials 528-1 and 528-2 follows the U-shaped profile of the horizontal portion 524-2 of the second recessed region 524. Accordingly, between two adjacent stacked resistor films, the first and second selector materials 528-1 and 528-2 each includes a bottom portion extending along the upper boundary 502U of the substrate 502, and two sidewall portions extending from respective ends of the bottom portion and along the exposed sidewalls of the two adjacent stacked resistor films.

For example, the first selector material 528-1, between the stacked resistor films 514-1 and 514-2, includes a bottom portion 528-1B that extends along the upper boundary 502U, and two sidewall portions 528-1S that extend along the exposed sidewalls of the stacker resistor films 514-1 and 514-2, respectively, and the second selector material 528-2, between the stacked resistor films 514-1 and 514-2, also includes a bottom portion 528-2B that extends along the upper boundary 502U, and two sidewall portions 528-2S that extend along the exposed sidewalls of the stacker resistor films 514-1 and 514-2, respectively.

Figure 5I:
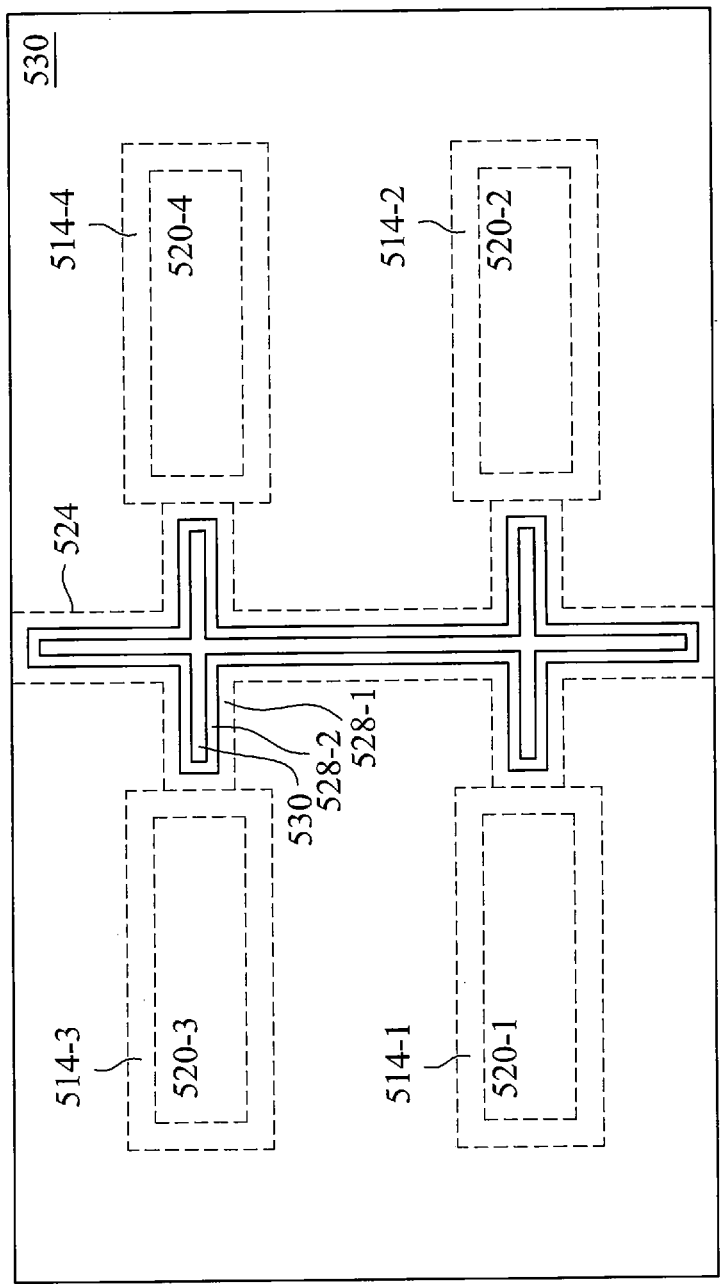
Figure 6K:
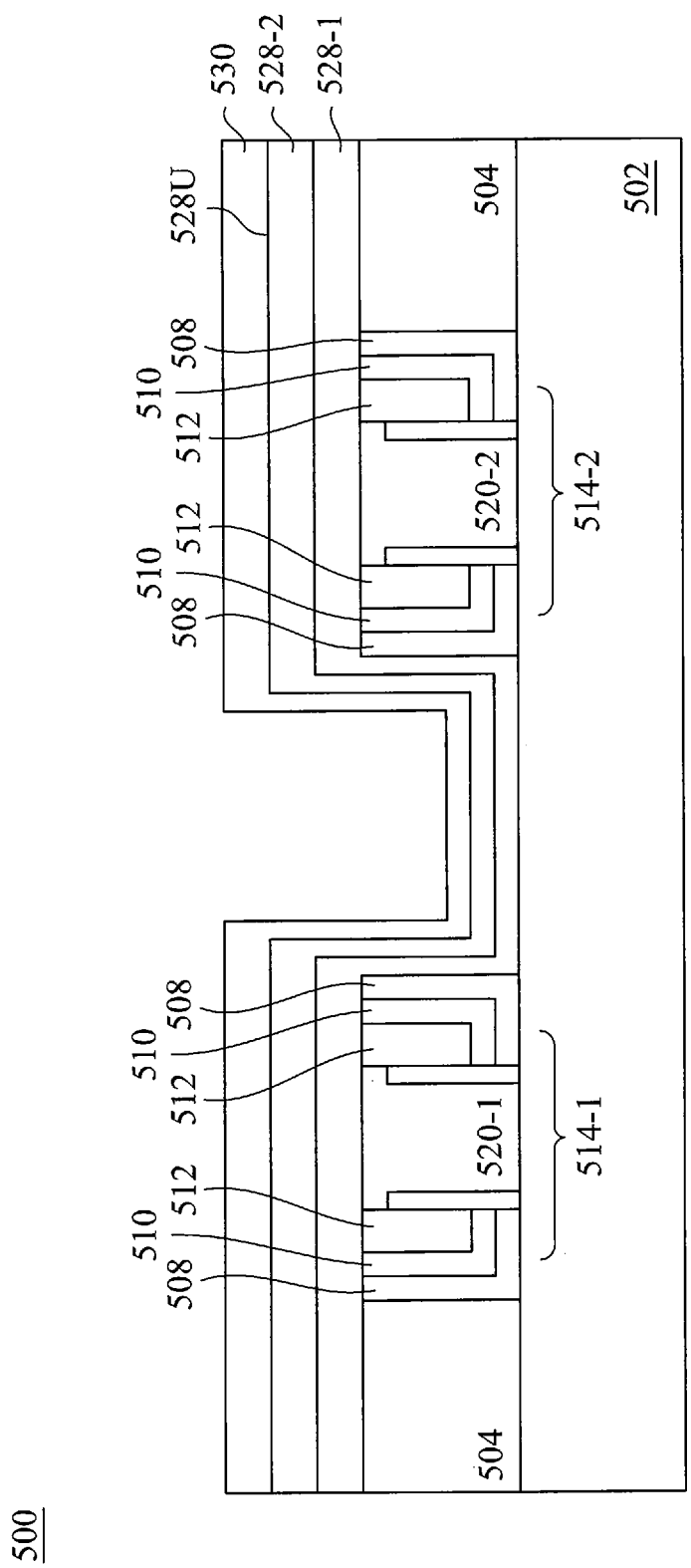

Corresponding to operation 418 of FIG. 4B, FIG. 5I is a top view of the RRAM device 500 in which a bit line (BL) metal material 530 is formed over the stacked resistor films 514-1 to 514-4, the WL's 520-1 to 520-4, and the second recessed region 524 (shown in dotted lines) at one of the various stages of fabrication, according to some embodiments, and FIG. 6K is a corresponding cross-sectional view of FIG. 5I taken along line A-A. As better seen in the cross-sectional view of FIG. 6K, the BL metal material 530 is formed to overlay the second selector material 528-2. In some embodiments, the BL metal material 530 is formed to at least fill the U-shaped profile(s) along the upper boundary 528U. In some embodiments, the BL metal material 530 includes a conductive material such as, for example, copper (Cu), aluminum (Al), tungsten (W), etc. The BL metal material 530 may be formed by using CVD, PVD, E-gun, and/or other suitable techniques to deposit the above-described conductive material over the second selector material 528-2.

Figure 5J:
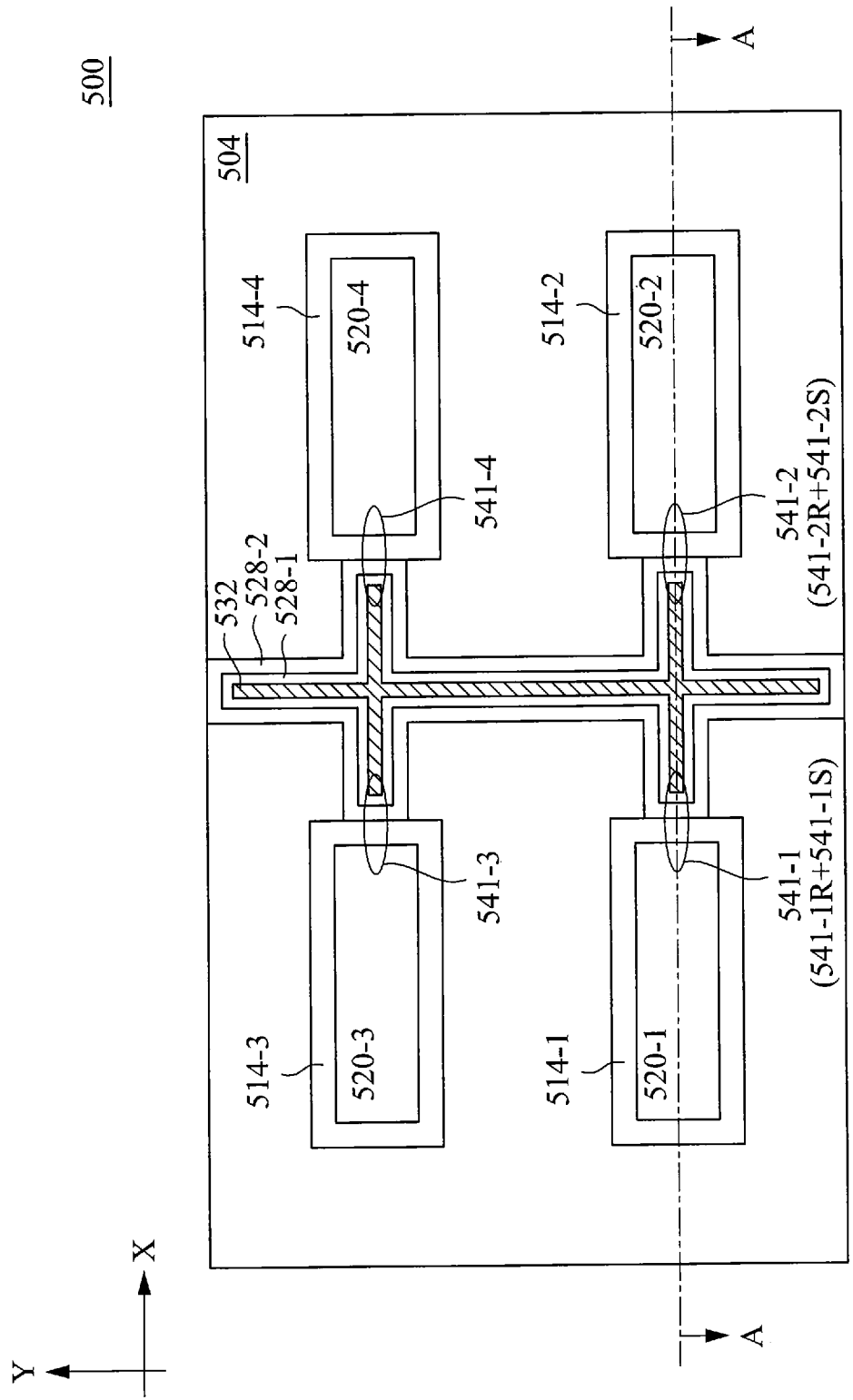
Figure 6L:
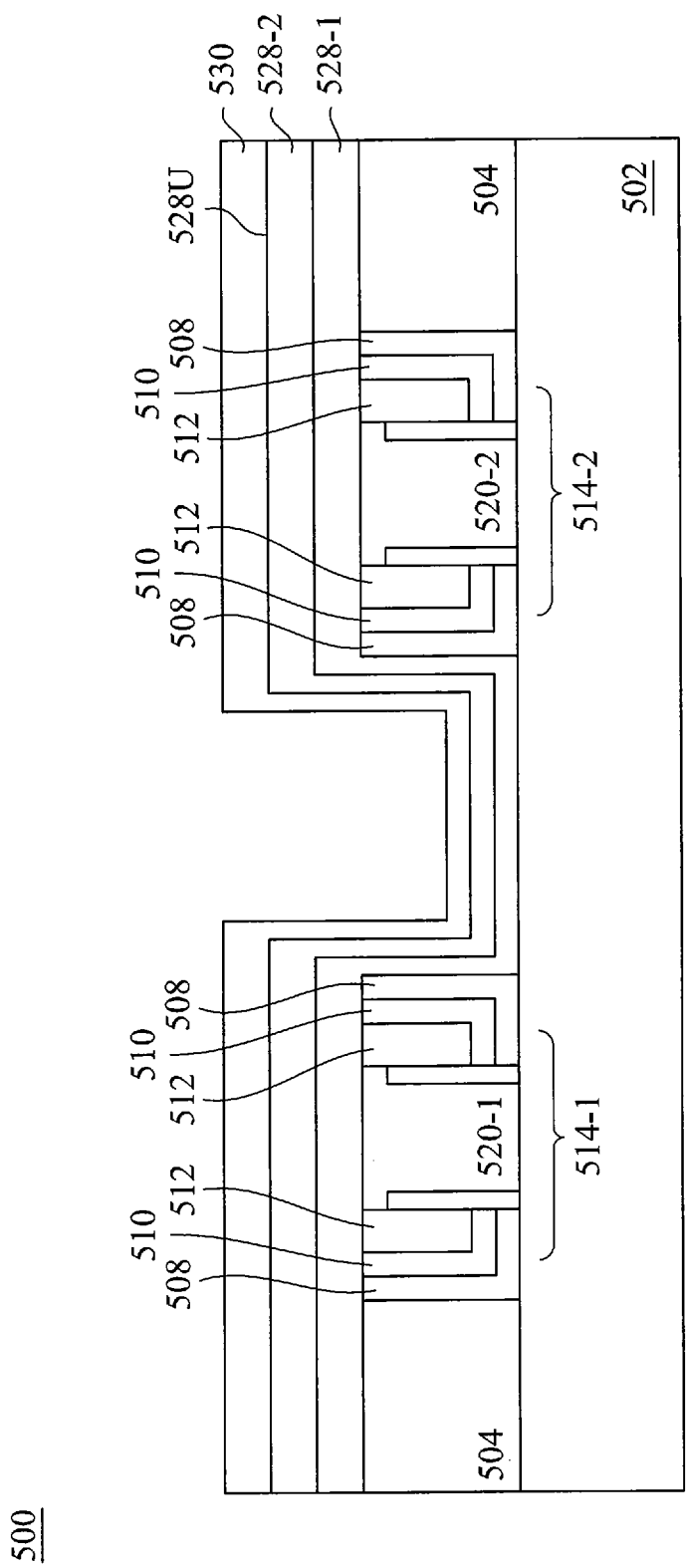

Corresponding to operation 420 of FIG. 4B, FIG. 5J is a top view of the RRAM device 500 including a BL 532 (filled with diagonal stripes), which is formed at one of the various stages of fabrication, according to some embodiments, and FIG. 6L is a corresponding cross-sectional view of FIG. 5J taken across line A-a. As shown in the cross-sectional view of FIG. 6L, in some embodiments, the BL 532 is formed by performing a polishing process 533 (e.g., a chemical-mechanical polishing (CMP) process) at least on the BL metal material 530 and upper portions of the first and second selector materials 528-1 and 528-2 that were disposed above upper boundaries of the WL's 520-1 and 520-2 until a coplanar boundary 535, shared by the stacked resistor films 514-1 and 514-2, the WL's 520-1 and 520-2, the remaining first and second selector materials 528-1 and 528-2, and the BL 532, is formed. In other words, the polishing process 533 is performed on the BL metal material 53,0 and the upper portions of the first and second selector materials 528-1 and 528-2 that were disposed above the upper boundaries of the WL's 520-1 and 520-2 until the respective upper boundaries of the WL's 520-1 and 520-2 are re-exposed while keeping the U-shaped profile on the second selector material 528-2 filled with the BL metal material 530.

As such, between the stacked resistor films 514-1 and 514-2, the BL 532 is partially surrounded by remaining portions of the first and second selector materials 528-1 and 528-2, i.e., respective remaining portions of the sidewall portions 528-2S and the bottom portion 528-2B and respective remaining portions of the sidewall portions 528-1S and the bottom portion 528-1B. Although not shown, it is understood that between the stacked resistor films 514-3 and 514-4, the BL 532 is also partially surrounded by remaining portions of the first and second selector materials 528-1 and 528-2.

In some embodiments, after the formation of the BL 532, a plurality of RRAM bit cells 541-1 and 541-2 can be formed along the $1^{st}$ row and a plurality of RRAM bit cells 541-3 and 541-4 can be formed along the $2^{nd}$ row (shown in FIG. 5J), wherein each RRAM bit cell is formed by an RRAM resistor and a serially coupled selector device. Further, each RRAM bit cell is coupled to a BL in parallel with the $1^{st}$ and $2^{nd}$ columns, and a WL extending along a vertical direction (e.g., a direction in parallel with the Z axis in FIG. 6L), at two respective ends.

Using the RRAM bit cells 541-1 and 541-2 shown in FIG. 6L as representative examples, the RRAM bit cell 541-1 includes an RRAM resistor, formed by a portion of the stacked resistor film 514-1 disposed at the right-hand side of the WL 520-1 (hereinafter "RRAM resistor 541-1R"), and a selector device, formed by the remaining sidewall portions 528-1S and 528-2S at the left-hand side of the BL 532 (hereinafter "selector device 541-1S"). And the RRAM bit cell 541-1 is coupled to the BL 532 and WL 520-1 at respective ends. Similarly, the RRAM bit cell 541-2 includes an RRAM resistor, formed by a portion of the stacked resistor film 514-2 at the left-hand side of the WL 520-2 (hereinafter "RRAM resistor 541-2R"), and a selector device, formed by the remaining sidewall portions 528-1S and 528-2S at the right-hand side of the BL 532 (hereinafter "selector device 541-2S"). And the RRAM bit cell 541-2 is coupled to the BL 532 and WL 520-2 at respective ends.

Similar to any two adjacent RRAM bits of the RRAM device 200 that present a mirror symmetric characteristic over a respective BL (as discussed with respect to FIG. 2L), any two adjacent RRAM bit cells of the RRAM device 500 also present a mirror symmetric over a respective BL. For example, the RRAM bit cell 541-1's selector device 541-1S and the RRAM bit cell 541-2's selector device 541-2S are mirror symmetric over the BL 532, and the RRAM bit cell 541-1's resistor 541-1R and the RRAM bit cell 541-2's resistor 541-2R are also mirror symmetric over the BL 532.

In some embodiments, after the formation of the BL 532, the RRAM bit cells 541-1 and 541-2, along the $1^{st}$ row, may be formed as a first strip in parallel with the X axis, the RRAM bit cells 541-3 and 541-4, along the $2^{nd}$ row, may be formed as a second strip also in parallel with the X axis, with a major portion of the BL 532 (extending in parallel with the Y axis) passing through the first and second strips, and with the WL's 520-1 to 520-4 (extending in parallel with the Z axis) passing through either the first or second strip. As mentioned above, operations 402 to 420 (i.e., operation 422 of FIG. 4) to make such first and second strips and corresponding BL's and WL's can be repeated for desired times so as to produce a three-dimensional RRAM array, for example, the RRAM device 300 of FIG. 3.

By forming a three-dimensional RRAM array using the disclosed method 100 or 400, the integration density of RRAM bit cells of the three-dimensional RRAM array can be substantially increased partially because of the above-described mirror symmetric characteristic presented by any two adjacent RRAM bit cells. In addition to the increased integration density, the three-dimensional RRAM array made by the method 100 or 400 provides various other advantages over the existing RRAM devices. For example, in existing RRAM devices, an issue typically referred to as "interference noise" occurs when multiple RRAM bit cells of the RRAM device are concurrently accessed (e.g., read). However, in the three-dimensional RRAM array made by the method 100 or 400, since two adjacent RRAM bit cells' respective selector devices are formed to be mirror symmetric over a respective BL, such an issue can be advantageously avoided.

To illustrate how multiple RRAM bit cells of a three-dimensional RRAM array made by the method 100 or 400 can be concurrently accessed, a flow chart of an exemplary method 700 is provided. In various embodiments, operations of the method 700 are performed by the respective components of the above-described devices, for example, the RRAM device 200 of FIGS. 2A-2M, the RRAM device 300 of FIG. 3, the RRAM device 500 of FIG. 5A-6L, etc. For purposes of discussion, the following embodiment of the method 700 will be described in conjunction with a schematic diagram of a three-dimensional RRAM array 800 (FIG. 8) equivalently representing one of the above-described RRAM devices (e.g., 200, 300, or 500). The illustrated embodiment of the method 700 is merely an example. Therefore, it should be understood that any of a variety of operations may be omitted, re-sequenced, and/or added while remaining within the scope of the present disclosure.

Figure 8:
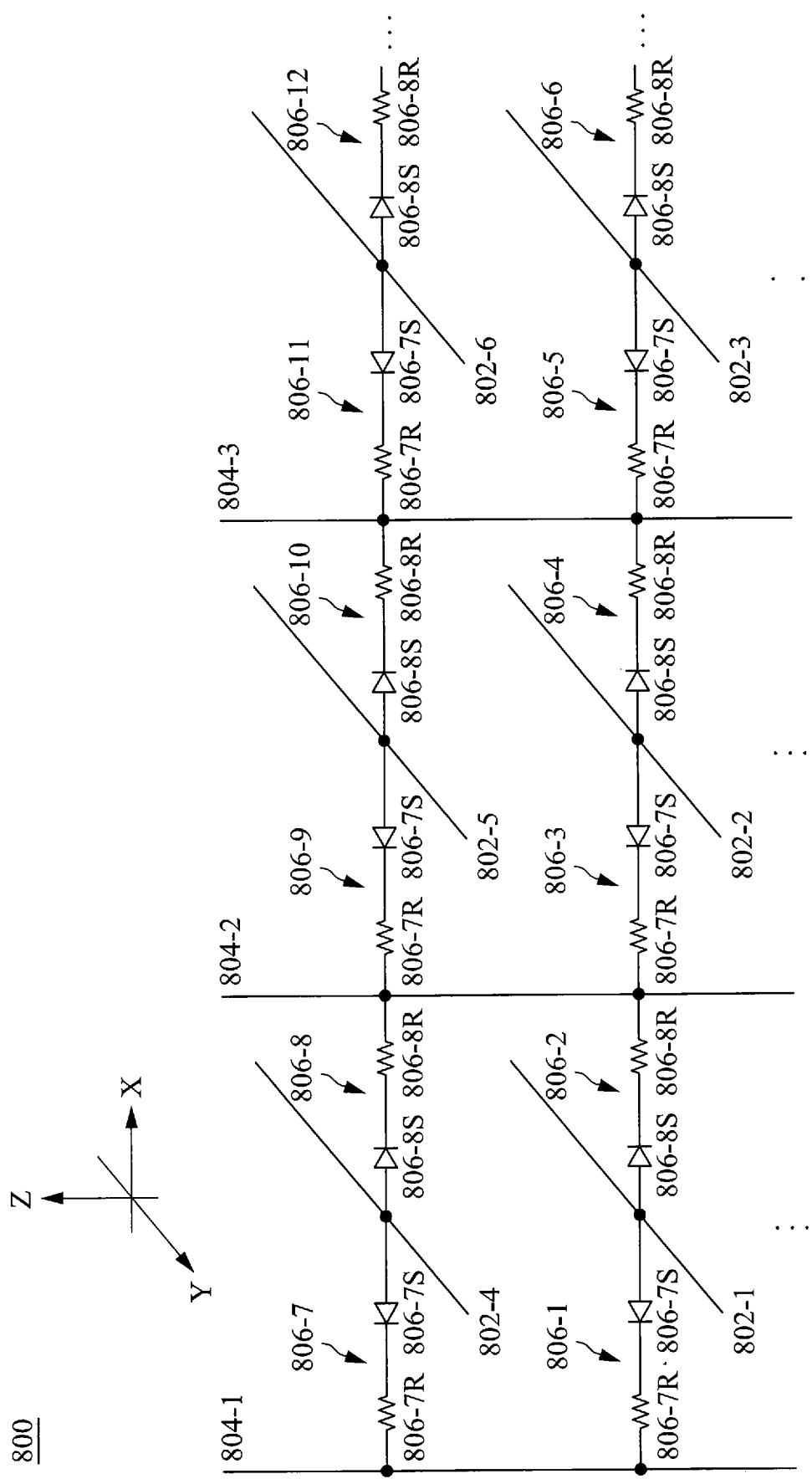
FIG. 8 illustrates a schematic diagram of a semiconductor device, made by the method of FIGS. 1A-1B or 4A-4B, in accordance with some embodiments.

Referring first to the schematic diagram of FIG. 8, the three-dimensional RRAM array 800 includes a plurality of BL's 802-1, 802-2, 802-3, 802-4, 802-5, and 802-6, a plurality of WL's 804-1, 804-2, and 804-3, and a plurality of RRAM bit cells 806-1, 806-1, 806-3, 806-4, 806-5, 806-6, 806-7, 806-8, 806-9, 806-10, 806-11, and 806-12 coupled between respective BL's and WL's. Although the illustrated embodiment of FIG. 8 includes 6 BL's, 3 WL's, and 12 RRAM bit cells, it is understood that any desired number of each of the BL, WL, and RRAM bit cell can be included in the three-dimensional RRAM array 800 while remaining within the scope of the present disclosure.

As described above, in the RRAM device made by the disclosed method 100/400 (e.g., the RRAM devices 200, 300, 500, etc.), a first plurality of RRAM bit cells are laterally formed as a first strip at a first tier with a first plurality of BL's laterally traversing therethrough and with a first plurality of WL's vertically traversing therethrough, a second plurality of RRAM bit cells are laterally formed as a second strip, laterally spaced apart from the first strip, at the first tier with the first plurality of BL's laterally traversing therethrough and with a second plurality of WL's vertically traversing therethrough, a third plurality of RRAM bit cells are laterally formed as a third strip at a second tier with a second plurality of BL's laterally traversing therethrough and with the first plurality of WL's vertically traversing therethrough, a fourth plurality of RRAM bit cells are laterally formed as a fourth strip, laterally spaced apart from the third strip, at the second tier with the second plurality of BL's laterally traversing therethrough and with the second plurality of WL's vertically traversing therethrough, and so on.

In some embodiments, the three-dimensional RRAM array 800 illustrates a portion of such an RRAM device. For example, the RRAM bit cells 806-1 to 806-6 form the above-mentioned lateral first strip at the first tier and the RRAM bit cells 806-7 to 806-12 form the above-mentioned lateral second strip at the second tier, wherein the BL's 802-1 to 802-3 and 802-4 to 802-6 respectively form the first and second pluralities of BL's and the WL's 804-1 to 804-3 form the first plurality of WL's. Further, each RRAM bit cell includes a respective resistor and selector device coupled in series.

For example, the RRAM bit cell 806-1 includes resistor 806-1R and selector device 806-1S; the RRAM bit cell 806-1 includes resistor 806-1R and selector device 806-1S; the RRAM bit cell 806-2 includes resistor 806-2R and selector device 806-2S; the RRAM bit cell 806-3 includes resistor 806-3R and selector device 806-3S; the RRAM bit cell 806-4 includes resistor 806-4R and selector device 806-4S; the RRAM bit cell 806-5 includes resistor 806-5R and selector device 806-5S; the RRAM bit cell 806-6 includes resistor 806-6R and selector device 806-6S; the RRAM bit cell 806-7 includes resistor 806-7R and selector device 806-7S; the RRAM bit cell 806-8 includes resistor 806-8R and selector device 806-8S; the RRAM bit cell 806-9 includes resistor 806-9R and selector device 806-9S; the RRAM bit cell 806-10 includes resistor 806-10R and selector device 806-10S; the RRAM bit cell 806-11 includes resistor 806-11R and selector device 806-11S; and the RRAM bit cell 806-12 includes resistor 806-12R and selector device 806-12S.

More specifically, given the above-described mirror schematic characteristic presented by any two adjacent RRAM bit cells over a respective BL, respective polarities of the selector devices of such two symmetric adjacent RRAM bit cells can also be symmetric over the respective BL, according to some embodiments. In the example where the first selector material (e.g., 224-1, 528-1, etc.) is an n-type doped Si layer and the second selector material (e.g., 224-2, 528-2, etc.) is a p-type doped Si layer, respective anodes (i.e., the node connected to the p-type doped Si layer) of the selector devices of such two adjacent symmetric adjacent RRAM bit cells are coupled to the respective BL over which the adjacent symmetric adjacent RRAM bit cells are mirrored and respective cathodes (i.e., the node connected to the n-type doped Si layer) of the selector devices of such two adjacent symmetric adjacent RRAM bit cells are coupled to respective WL's through respective resistors, which can be better appreciated in the illustrated embodiment of the schematic diagram of FIG. 8.

Using the RRAM bit cells 806-1 and 806-2 that are symmetric with each other over the BL 802-1 as representative examples, the respective anodes of the selector device 806-1S of the RRAM bit cell 806-1 and the selector device 806-2S of the RRAM bit cell 806-1 are coupled to the BL 802-1 while the respective cathodes of the selector device 806-1S of the RRAM bit cell 806-1 and the selector device 806-2S of the RRAM bit cell 806-1 are respectively coupled to the WL's 804-1 and 804-2 through the resistors 806-1R and 806-2R. Such symmetric polarities of the selector devices of any two symmetric adjacent RRAM bit cells can provide advantages such as, for example, eliminating the issue of interference noise while accessing multiple RRAM bit cells of the disclosed three-dimensional RRAM array 800, which will be discussed below.

Figure 7:
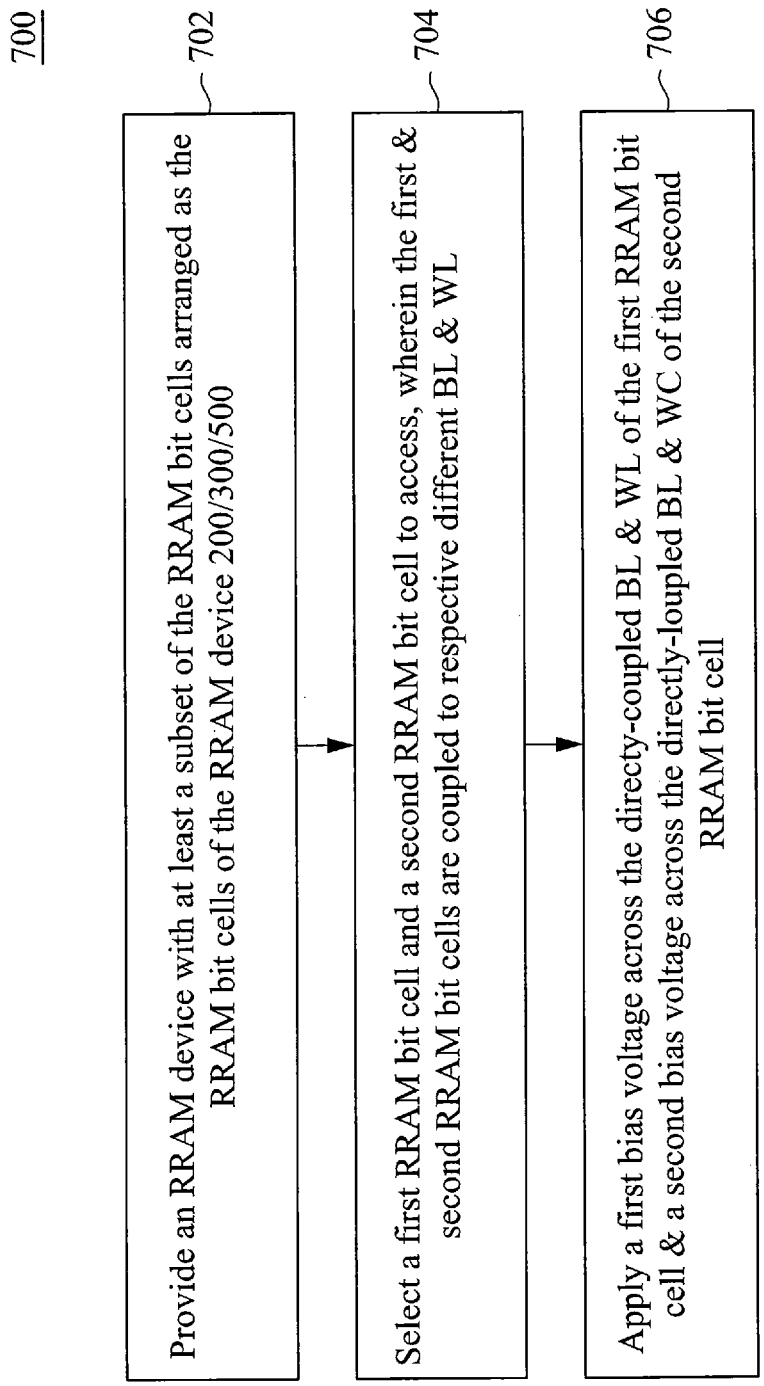
FIG. 7 illustrates a flow chart of an exemplary method to operate a semiconductor device, made by the method of FIGS. 1A-1B or 4A-4B, in accordance with some embodiments.

Referring then to FIG. 7, in some embodiments, the method 700 starts with operation 702 in which an RRAM device with at least a subset of the RRAM bit cells arranged as the RRAM bit cells of the RRAM device 200/300/500 is provided. As mentioned above, the three-dimensional RRAM array 800 can equivalently represent a portion of the RRAM device 200, 300, or 500, in the following discussion of the method 700, only the components of the three-dimensional RRAM array 800 will be used.

The method 700 continues to operation 704 in which a first RRAM bit cell and a second RRAM bit cell are selected to accessed, wherein the first and second RRAM bit cells are directly coupled to respective different BL's and WL's. In an example where the RRAM bit cell 806-1 is selected as the first RRAM bit cell to be accessed (e.g., read), since the RRAM bit cell 806-1 is directly coupled to the BL 802-1 an WL 804-1, any other RRAM bit cell not directly coupled to the BL 802-1 or WL 804-1 can be selected as the second RRAM bit cell to be accessed such as, for example, the RRAM bit cell 806-3, which is directly coupled to the BL 802-2 and WL 804-2.

The method 700 continues to operation 706 in which a first bias voltage is applied across the directly-coupled BL and WL of the first RRAM bit cell and a second bias voltage is applied across the directly-coupled BL and WL of the second RRAM bit cell. Continuing with the above example, to access the RRAM bit cell 806-1, a first positive voltage may be applied on the BL 802-1 and the WL 804-1 may be connected to a ground voltage; and similarly, to access the RRAM bit cell 806-3, a second positive voltage may be applied on the BL 802-2 and the WL 804-2 may be connected to the ground voltage.

As such, in the example where the first and second RRAM bit cells 806-1 and 806-3 are accessed to be read, respective logic states present by the RRAM bit cells 806-1 and 806-3 can be concurrently read out without causing any interference noise to each other because of the symmetric polarities of the selector devices. More specifically, when the WL 804-1 is connected to the ground voltage (i.e., a logic low) and the BL's 802-1 and 802-2 are connected to respective positive voltages (i.e., a logic high), a first current conducting from the BL 802-1, through the selector device 806-1S and the resistor 806-1R, and to the WL 804-1 can reflect the logic state presented the RRAM bit cell 806-1 (i.e., a resistance state of the resistor 806-1R), and concurrently a second current conducting from the BL 802-2, through the selector device 806-3S and the resistor 806-3R, and to the WL 804-2 can reflect the logic state presented by the RRAM bit cell 806-3 (i.e., a resistance state of the resistor 806-3R). In some embodiments, since the selector devices 806-1S and 806-3S are forward biased, the first and second currents are allowed to conduct therethrough, respectively. On the other hand, in some embodiments, an interference current, which might have conducted from the RRAM bit cells 806-3 to 806-3, can be "blocked" by a high resistance of the selector device 806-2S since the selector device 806-2S is reverse biased. Accordingly, the interference noise issue can be advantageously eliminated.

In an embodiment, a memory device includes: a first conductor extending in parallel with a first axis; a first selector material comprising a first portion that extends along a first sidewall of the first conductor; a second selector material comprising a first portion that extends along the first sidewall of the first conductor; a first variable resistive material comprising a portion that extends along the first sidewall of the first conductor; and a second conductor extending in parallel with a second axis substantially perpendicular to the first axis, wherein the first portion of the first selector material, the first portion of the second selector material, and the portion of the first variable resistive material are arranged along a first direction in parallel with a third axis substantially perpendicular to the first axis and second axis.

In another embodiment, a memory device includes: a first selector material formed on a substrate presenting a first U-shaped profile; a second selector material formed on the first selector material presenting a second U-shaped profile; a first conductor extending in parallel with a first horizontal axis, wherein the first conductor's sidewalls and lower boundary are partially embedded in the second U-shaped profile; a first variable resistive material comprising a portion disposed along a first sidewall portion of the first selector material; a second variable resistive material comprising a portion disposed along a second sidewall portion of the first selector material; a second conductor, disposed along the portion of the first variable resistive material, that extends in parallel with a vertical axis; and a third conductor, disposed along the portion of the second variable resistive material, that also extends in parallel with the vertical axis.

In yet another embodiment, a memory device includes: a first conductor extending in parallel with a first axis; a first selector material partially surrounds the first conductor; a second selector material partially surrounds the first selector material; a first variable resistive material comprising a portion that extends along respective first sidewall portions of the first and second selector materials; a second variable resistive material comprising a portion that extends along respective second sidewall portions of the first and second selector materials; a second conductor extending in parallel with a second axis substantially perpendicular to the first axis; and a third conductor also extending in parallel with the second axis, wherein the first and second sidewall portions of the first selector material, the first and second portions of the second selector material, and the portions of the first and second variable resistive materials are respectively mirror symmetric over the first conductor.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a first conductor extending substantially along a first axis;
a first selector material presenting a first U-shaped profile and comprising a first portion that extends along a first sidewall of the first conductor;
a second selector material presenting a second U-shaped profile and comprising a first portion that extends along the first sidewall of the first conductor;
a first variable resistive material comprising a portion that extends along the first sidewall of the first conductor; and
a second conductor extending in parallel with a second axis substantially perpendicular to the first axis,
wherein the first portion of the first selector material, the first portion of the second selector material, and the portion of the first variable resistive material are stacked along a first direction in parallel with a third axis substantially perpendicular to the first axis and second axis.

2. The memory device of claim 1, wherein at least the first portion of the first selector material and the first portion of the second selector material form a selector device of a first resistive random access memory (RRAM) bit cell, and at least the portion of the first variable resistive material forms a resistor of the first RRAM bit cell that is coupled to the selector device of the first RRAM bit cell in series.

3. The memory device of claim 2, wherein the first conductor forms a bit line (BL) of the first RRAM bit cell and the second conductor forms a word line (WL) of the first RRAM bit cell.

4. The memory device of claim 1, wherein the first selector material further comprises a second portion that extends along a second sidewall of the first conductor, and the second selector material further comprises a second portion that extends along the second sidewall of the first conductor.

5. The memory device of claim 4, further comprising:
a second variable resistive material comprising a portion that extends along the second sidewall of the first conductor; and
a third conductor extending in parallel with the second axis,
wherein the second portion of the first selector material, the second portion of the second selector material, and the portion of the second variable resistive material are arranged along a second direction in parallel with the third axis.

6. The memory device of claim 5, wherein at least the second portion of the first selector material and the second portion of the second selector material form a selector device of a second resistive random access memory (RRAM) bit cell, and at least the portion of the second variable resistive material forms a resistor of the second RRAM bit cell that is coupled to the selector device of the second RRAM bit cell in series.

7. The memory device of claim 6, wherein the first conductor forms a bit line (BL) of the second RRAM bit cell and the third conductor forms a word line (WL) of the second RRAM bit cell.

8. The memory device of claim 5, wherein the first and second portions of the first selector material, the first and second portions of the second selector material, and the portions of the first and second variable resistive materials are respectively mirror symmetric over the first conductor.

9. The memory device of claim 1, wherein the first conductor is partially embedded in the first selector material.

10. A memory device, comprising:
a first selector material formed on a substrate presenting a first U-shaped profile;
a second selector material formed on the first selector material presenting a second U-shaped profile;
a first conductor extending in parallel with a first horizontal axis, wherein the first conductor's sidewalls and lower boundary are partially embedded in the second U-shaped profile;
a first variable resistive material comprising a portion disposed along a first sidewall portion of the first selector material;

a second variable resistive material comprising a portion disposed along a second sidewall portion of the first selector material;

a second conductor, disposed along the portion of the first variable resistive material, that extends in parallel with a vertical axis; and a third conductor, disposed along the portion of the second variable resistive material, that also extends in parallel with the vertical axis.

11. The memory device of claim 10, wherein a first sidewall portion of the second selector material, the first sidewall portion of the first selector material, the portion of the first variable resistive material are arranged along a first direction in parallel with a second horizontal axis substantially perpendicular to the first horizontal axis, and a second sidewall portion of the second selector material, the second sidewall portion of the first selector material, the portion of the second variable resistive material are arranged along a second direction in parallel with the second horizontal axis.

12. The memory device of claim 11, wherein at least the first sidewall portion of the first selector material and the first sidewall portion of the second selector material form a selector device of a first resistive random access memory (RRAM) bit cell, and at least the portion of the first variable resistive material forms a resistor of the first RRAM bit cell.

13. The memory device of claim 12, wherein the first conductor forms a bit line (BL) of the first RRAM bit cell and the second conductor forms a word line (WL) of the first RRAM bit cell.

14. The memory device of claim 11, wherein at least the second sidewall portion of the first selector material and the second sidewall portion of the second selector material form a selector device of a second resistive random access memory (RRAM) bit cell, and at least the portion of the second variable resistive material forms a resistor of the second RRAM bit cell.

15. The memory device of claim 14, wherein the first conductor forms a bit line (BL) of the second RRAM bit cell and the third conductor forms a word line (WL) of the second RRAM bit cell.

16. The memory device of claim 10, wherein the first and second variable resistive materials each presents a variable resistance value.

17. A memory device, comprising:

a first conductor extending in parallel with a first axis;

a first selector material presenting a first U-shaped profile that partially surrounds the first conductor;

a second selector material presenting a second U-shaped profile that partially surrounds the first selector material;

a first variable resistive material comprising a portion that extends along respective first sidewall portions of the first and second selector materials;

a second variable resistive material comprising a portion that extends along respective second sidewall portions of the first and second selector materials;

a second conductor extending in parallel with a second axis substantially perpendicular to the first axis; and a third conductor also extending in parallel with the second axis, wherein the first and second sidewall portions of the first selector material, the first and second portions of the second selector material, and the portions of the first and second variable resistive materials are respectively mirror symmetric over the first conductor.

18. The memory device of claim 17, wherein at least the first sidewall portion of the first selector material and the first sidewall portion of the second selector material form a selector device of a first resistive random access memory (RRAM) bit cell, and at least the portion of the first variable resistive material forms a resistor of the first RRAM bit cell.

19. The memory device of claim 18, wherein at least the second sidewall portion of the first selector material and the second sidewall portion of the second selector material form a selector device of a second RRAM bit cell, and at least the portion of the second variable resistive material forms a resistor of the second RRAM bit cell.

20. The memory device of claim 19, wherein the first conductor is configured to serve as a bit line (BL) for the first and second RRAM bit cells, and the second and third conductors are configured to serve as word lines (WL's) for the first and second RRAM bit cells, respectively.

* * * * *